(12) United States Patent
Liu et al.

(10) Patent No.: US 11,837,133 B2
(45) Date of Patent: Dec. 5, 2023

(54) GATE DRIVING CIRCUIT, METHOD OF DRIVING GATE DRIVING CIRCUIT, AND DISPLAY PANEL

(71) Applicant: BOE Technology Group Co., Ltd., Beijing (CN)

(72) Inventors: Weixing Liu, Beijing (CN); Wei Qin, Beijing (CN); Kuanjun Peng, Beijing (CN); Tieshi Wang, Beijing (CN); Chunfang Zhang, Beijing (CN); Hui Zhang, Beijing (CN); Changfeng Li, Beijing (CN); Shunhang Zhang, Beijing (CN); Kai Hou, Beijing (CN); Hongrun Wang, Beijing (CN); Liwei Liu, Beijing (CN); Yunsik Im, Beijing (CN); Wanpeng Teng, Beijing (CN); Xiaolong Li, Beijing (CN); Kai Guo, Beijing (CN); Zhiqiang Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 37 days.

(21) Appl. No.: 17/609,504

(22) PCT Filed: Jan. 28, 2021

(86) PCT No.: PCT/CN2021/074092
§ 371 (c)(1),
(2) Date: Nov. 8, 2021

(87) PCT Pub. No.: WO2022/160160
PCT Pub. Date: Aug. 4, 2022

(65) Prior Publication Data
US 2023/0129625 A1   Apr. 27, 2023

(51) Int. Cl.
*G09G 3/20* (2006.01)
*G11C 19/28* (2006.01)

(52) U.S. Cl.
CPC ............ *G09G 3/20* (2013.01); *G11C 19/287* (2013.01); *G09G 2300/0408* (2013.01);
(Continued)

(58) Field of Classification Search
CPC ............ G09G 3/20; G09G 2300/0408; G09G 2310/0267; G09G 2310/0286; G09G 2310/08; G11C 19/287
See application file for complete search history.

(56) References Cited

U.S. PATENT DOCUMENTS 10,210,789 B2   2/2019   Li et al.
10,891,886 B2   1/2021   Mi et al.
(Continued)

FOREIGN PATENT DOCUMENTS

CN   101777301 A   7/2010
CN   104978944 A   10/2015
(Continued)

*Primary Examiner* — Vinh T Lam
(74) *Attorney, Agent, or Firm* — WHDA, LLP

(57) ABSTRACT

The present disclosure provides a gate driving circuit, a method of driving a gate driving circuit, and a display panel. The gate driving circuit includes a plurality of driving units connected in cascade. Each driving unit includes: N shift register units; and a mode control circuit connected to the N shift register units, wherein the mode control circuit is configured to receive a control signal for the driving unit, and connect the N shift register units in one of a plurality of resolution modes under the control of the control signal.

14 Claims, 27 Drawing Sheets

(52) U.S. Cl.
   CPC .............. *G09G 2310/0267* (2013.01); *G09G 2310/0286* (2013.01); *G09G 2310/08* (2013.01)

(56) References Cited

U.S. PATENT DOCUMENTS

| | | | |
|---|---|---|---|
| 11,151,918 B2 | 10/2021 | Mi et al. | |
| 11,222,577 B2 * | 1/2022 | Feng | G11C 19/28 |
| 11,462,147 B2 * | 10/2022 | Gao | G09G 3/2092 |
| 11,482,168 B2 * | 10/2022 | Feng | G09G 3/3266 |
| 2016/0049208 A1 * | 2/2016 | Zheng | G11C 19/287 |
| | | | 377/64 |
| 2019/0066560 A1 * | 2/2019 | Mi | G11C 19/28 |
| 2019/0279574 A1 | 9/2019 | Kim et al. | |
| 2021/0233459 A1 * | 7/2021 | Duan | G09G 5/363 |

FOREIGN PATENT DOCUMENTS

| | | | | |
|---|---|---|---|---|
| CN | 106157873 A | | 11/2016 | |
| CN | 106548745 A | | 3/2017 | |
| CN | 106710508 A | | 5/2017 | |
| CN | 109036246 A | | 12/2018 | |
| CN | 109885273 A | | 6/2019 | |
| CN | 111091775 A | * | 5/2020 | .............. G09G 3/20 |
| CN | 112449714 A | * | 3/2021 | ............. G09G 3/035 |
| CN | 112771601 A | * | 5/2021 | ........... G09G 3/3266 |
| CN | 113971940 A | * | 1/2022 | ........... G09G 3/3674 |
| CN | 113971940 B | * | 3/2023 | ........... G09G 3/3674 |
| WO | 2018/149116 A1 | | 8/2018 | |

\* cited by examiner

GATE DRIVING CIRCUIT, METHOD OF DRIVING GATE DRIVING CIRCUIT, AND DISPLAY PANEL

CROSS REFERENCE TO RELATED APPLICATION(S)

This application is a Section 371 National Stage Application of International Application No. PCT/CN2021/074092, filed on Jan. 28, 2021.

TECHNICAL FIELD

The present disclosure relates to a field of a display technology, and in particular to a gate driving circuit, a method of driving a gate driving circuit, and a display panel.

BACKGROUND

In the display technology, a gate driving circuit is generally used to drive a plurality of sub-pixels for display. For example, the gate driving circuit may generate a gate driving signal, and the gate driving signal is provided to a plurality of sub-pixels, so that the sub-pixels are turned on. A data signal is applied to the sub-pixels turned on, so as to drive the sub-pixels to emit light. The gate driving circuit generally includes a plurality of shift registers connected in cascade, so as to generate a plurality of sequentially shifted output signals as the gate driving signal. However, conventional technology may not flexibly control a display resolution in different areas on a display panel.

SUMMARY

According to a first aspect of the present disclosure, there is provided a gate driving circuit including a plurality of driving units connected in cascade, wherein each driving unit of the plurality of driving units includes:

N shift register units; and a mode control circuit connected to the N shift register units, wherein the mode control circuit is configured to receive a control signal for the driving unit, and connect the N shift register units in one of a plurality of resolution modes under the control of the control signal.

For example, the plurality of resolution modes include a first resolution mode, a second resolution mode and a third resolution mode, and the mode control circuit is configured to:

in the first resolution mode, connect the N shift register units in cascade;

in the second resolution mode, divide the N shift register units into M groups, connect the M groups in cascade, and connect shift register units in each group of the M groups in parallel; and in the third resolution mode, connect the N shift register units in parallel.

For example, N=4, M=2, the N shift register units include a first shift register unit, a second shift register unit, a third shift register unit and a fourth shift register unit, each shift register unit has a cascade input terminal and a first cascade output terminal, and the mode control circuit is configured to:

in the first resolution mode, connect the first cascade output terminal of an nth shift register unit to the cascade input terminal of an (n+1)th shift register unit, and disconnect the cascade input terminal of the nth shift register unit from the cascade input terminal of the (n+1)th shift register unit, where 1≤n≤N−1;

in the second resolution mode, disconnect the first cascade output terminal of the first shift register unit from the cascade input terminal of the second shift register unit, connect the first cascade output terminal of the second shift register unit to the cascade input terminal of the third shift register unit, disconnect the first cascade output terminal of the third shift register unit from the cascade input terminal of the fourth shift register unit, connect the cascade input terminal of the first shift register unit to the cascade input terminal of the second shift register unit, and connect the cascade input terminal of the third shift register unit to the cascade input terminal of the fourth shift register unit; and in the third resolution mode, disconnect the first cascade output terminal of the nth shift register unit from the cascade input terminal of the (n+1)th shift register unit, and connect the cascade input terminal of the nth shift register unit to the cascade input terminal of the (n+1)th shift register unit.

For example, each of the first shift register unit, the second shift register unit, the third shift register unit and the fourth shift register unit further has a reset terminal and a second cascade output terminal, and the mode control circuit is further configured to:

in the first resolution mode, connect the reset terminal of the nth shift register unit to the second cascade output terminal of the (n+1)th shift register unit, and disconnect the reset terminal of the nth shift register unit from the reset terminal of the (n+1)th shift register unit;

in the second resolution mode, disconnect the reset terminal of the first shift register unit from the second cascade output terminal of the second shift register unit, connect the reset terminal of the second shift register unit to the second cascade output terminal of the third shift register unit, disconnect the reset terminal of the third shift register unit from the second cascade output terminal of the fourth shift register unit, connect the reset terminal of the first shift register unit to the reset terminal of the second shift register unit, disconnect the reset terminal of the second shift register unit from the reset terminal of the third shift register unit, and connect the reset terminal of the third shift register unit to the reset terminal of the fourth shift register unit; and in the third resolution mode, disconnect the reset terminal of the nth shift register unit from the second cascade output terminal of the (n+1)th shift register unit, and connect the reset terminal of the nth shift register unit to the reset terminal of the (n+1)th shift register unit.

For example, the control signal includes a first control signal, a second control signal, a third control signal and a fourth control signal, and the mode control circuit includes:

a first transistor having a gate electrode connected to receive the first control signal, a first electrode connected to the first cascade output terminal of the first shift register unit, and a second electrode connected to the cascade input terminal of the second shift register unit;

a second transistor having a gate electrode connected to receive the second control signal, a first electrode connected to the cascade input terminal of the first shift register unit, and a second electrode connected to the cascade input terminal of the second shift register unit;

a third transistor having a gate electrode connected to receive the third control signal, a first electrode connected to the first cascade output terminal of the second shift register unit, and a second electrode connected to the cascade input terminal of the third shift register unit;

a fourth transistor having a gate electrode connected to receive the fourth control signal, a first electrode connected to the cascade input terminal of the first shift register unit, and a second electrode connected to the cascade input terminal of the third shift register unit;

a fifth transistor having a gate electrode connected to receive the first control signal, a first electrode connected to the first cascade output terminal of the third shift register unit, and a second electrode connected to the cascade input terminal of the fourth shift register unit; and a sixth transistor having a gate electrode connected to receive the second control signal, a first electrode connected to the cascade input terminal of the third shift register unit, and a second electrode connected to the cascade input terminal of the fourth transistor.

For example, the control signal further includes a fifth control signal, and the mode control circuit further includes:

a seventh transistor having a gate electrode connected to receive the first control signal, a first electrode connected to the reset terminal of the first shift register unit, and a second electrode connected to the second cascade output terminal of the second shift register unit;

an eighth transistor having a gate electrode connected to receive the fifth control signal, a first electrode connected to the reset terminal of the first shift register unit, and a second electrode connected to the reset terminal of the second shift register unit;

a ninth transistor having a gate electrode connected to receive the third control signal, a first electrode connected to the reset terminal of the second shift register unit, and a second electrode connected to the second cascade output terminal of the third shift register unit;

a tenth transistor having a gate electrode connected to receive the fourth control signal, a first electrode connected to the reset terminal of the second shift register unit, and a second electrode connected to the reset terminal of the third shift register unit;

an eleventh transistor having a gate electrode connected to receive the first control signal, a first electrode connected to the reset terminal of the third shift register unit, and a second electrode connected to the second cascade output terminal of the fourth shift register unit; and a twelfth transistor having a gate electrode connected to receive the second control signal, a first electrode connected to the reset terminal of the third shift register unit, and a second electrode connected to the reset terminal of the fourth shift register unit.

For example, the first cascade output terminal of an Nth shift register unit in an ith stage driving unit is connected to the cascade input terminal of the first shift register unit in an (i+1)th stage driving unit.

For example, the reset terminal of the Nth shift register unit in the ith stage driving unit is connected to the second cascade output terminal of the first shift register unit in the (i+1)th stage driving unit.

For example, the plurality of driving units are divided into a plurality of groups, and each group of driving units are connected to a group of control signal lines so as to receive the control signal for the group of driving units.

For example, each shift register unit includes:

a first shift register having an input terminal serving as the cascade input terminal of the shift register unit, and an output terminal serving as the second cascade output terminal of the shift register unit;

a second shift register having an input terminal connected to the output terminal of the first shift register; and a third shift register having an input terminal connected to an output terminal of the second shift register, and an output terminal serving as the first cascade output terminal of the shift register unit.

For example, each of the first shift register, the second shift register and the third shift register includes:

an input sub-circuit connected to an input terminal and a pull-up node of the shift register, wherein the input-sub-circuit is configured to provide a signal of the input terminal to the pull-up node;

an output sub-circuit connected to the pull-up node, a clock signal terminal of the shift register, and an output terminal of the shift register, wherein the output sub-circuit is configured to provide a signal of the clock signal terminal to the output terminal under the control of a potential of the pull-up node; and a control sub-circuit connected to the pull-up node, the output terminal, and a pull-down node of the shift register, wherein the control sub-circuit is configured to control a potential of the pull-down node based on the potential of the pull-up node, and pull down a potential of the output terminal under the control of the potential of the pull-down node.

For example, each of the first shift register, the second shift register and the third shift register further includes:

a reset sub-circuit connected to the pull-up node and a reset terminal of the shift register, wherein the reset sub-circuit is configured to reset the pull-up node according to a reset signal of the reset terminal, and the third shift register in the shift register unit has a reset terminal serving as the reset terminal of the shift register unit.

According to a second aspect of the present disclosure, there is provided a method of driving the gate driving circuit according to the first aspect of the present disclosure, including:

receiving, by a mode control circuit of each driving unit in a plurality of driving units, a control signal for the driving unit, and connecting the N shift register units in one of a plurality of resolution modes under the control of the control signal; and generating output signals by the N shift register units connected in each driving unit.

For example, the plurality of resolution modes include a first resolution mode, a second resolution mode and a third resolution mode, and wherein, in the first resolution mode, the mode control circuit is configured to connect the N shift register units in cascade, so that the N shift register units generate sequentially shifted output signals;

in the second resolution mode, the mode control circuit is configured to divide the N shift register units into M groups, connect the M groups in cascade, and connect shift register units in each group of the M groups in parallel, so that the shift register units in each group generate output signals in parallel, and a group of output signals generated by an (m+1)th group of shift register units are shifted with respect to a group of output signals generated by an mth group of shift register units, where m is an integer, and 1≤m≤M−1; and in the third resolution mode, the mode control circuit is configured to connect the N shift register units in parallel, so that the N shift register units generate output signals in parallel.

For example, N=4, M=2, and the N shift register units include a first shift register unit, a second shift register unit, a third shift register unit and a fourth shift register unit, and wherein, in the first resolution mode, the mode control circuit is configured to connect a first cascade output terminal of an nth shift register unit to a cascade input terminal of an (n+1)th shift register unit, and disconnect a cascade input terminal of the nth shift register unit from the cascade input terminal of the (n+1)th shift register unit, where 1≤n≤N−1;

in the second resolution mode, the mode control circuit is configured to disconnect a first cascade output terminal of the first shift register unit from a cascade input terminal of the second shift register unit, connect the cascade input terminal of the second shift register unit to a cascade input terminal of the first shift register unit, connect a first cascade output terminal of the second shift register unit to a cascade input terminal of the third shift register unit, disconnect the cascade input terminal of the third shift register unit from the cascade input terminal of the second shift register unit, disconnect a first cascade output terminal of the third shift register unit from a cascade input terminal of the fourth shift register unit, and connect the cascade input terminal of the third shift register unit to the cascade input terminal of the fourth shift register unit; and in the third resolution mode, the mode control circuit is configured to disconnect the first cascade output terminal of the nth shift register unit from the cascade input terminal of the (n+1)th shift register unit, and connect the cascade input terminal of the nth shift register unit to the cascade input terminal of the (n+1)th shift register unit.

For example, the method further includes:

in the first resolution mode, connecting, by the mode control circuit, a reset terminal of the nth shift register unit to a second cascade output terminal of the (n+1)th shift register unit, and disconnecting the reset terminal of the nth shift register unit from a reset terminal of the (n+1)th shift register unit;

in the second resolution mode, disconnecting, by the mode control circuit, the reset terminal of the first shift register unit from the second cascade output terminal of the second shift register unit, connecting the reset terminal of the second shift register unit to the second cascade output terminal of the third shift register unit, disconnecting the reset terminal of the third shift register unit from the second cascade output terminal of the fourth shift register unit, connecting the reset terminal of the first shift register unit to the reset terminal of the second shift register unit, and connecting the reset terminal of the third shift register unit to the reset terminal of the fourth shift register unit; and in the third resolution mode, disconnecting, by the mode control circuit, the reset terminal of the nth shift register unit from the second cascade output terminal of the (n+1)th shift register unit, and connecting the reset terminal of the nth shift register unit to the reset terminal of the (n+1)th shift register unit.

For example, the mode control circuit includes a first transistor, a second transistor, a third transistor, a fourth transistor, a fifth transistor and a sixth transistor, and wherein, in the first resolution mode, a first control signal and a third control signal are at a first level, and a second control signal and a fourth control signal are at a second level, so that the first transistor, the third transistor and the fifth transistor are turned on, and the second transistor, the fourth transistor and the sixth transistor are turned off;

in the second resolution mode, the second control signal and the third control signal are at the first level, and the first control signal and the fourth control signal are at the second level, so that the second transistor, the third transistor and the sixth transistor are turned on, and the first transistor, the fourth transistor and the fifth transistor are turned off; and in the third resolution mode, the second control signal and the fourth control signal are at the first level, and the first control signal and the third control signal are at the second level, so that the second transistor, the fourth transistor and the sixth transistor are turned on, and the first transistor, the third transistor and the fifth transistor are turned off.

For example, the mode control circuit further includes a seventh transistor, an eighth transistor, a ninth transistor, a tenth transistor, an eleventh transistor and a twelfth transistor, and wherein, in the first resolution mode, a fifth control signal is at the second level, so that the seventh transistor, the ninth transistor and the eleventh transistor are turned on, and the eighth transistor, the tenth transistor and the twelfth transistor are turned off;

in the second resolution mode, the fifth control signal is at the first level, so that the eighth transistor, the ninth transistor and the twelfth transistor are turned on, and the seventh transistor, the tenth transistor and the eleventh transistor are turned off; and in the third resolution mode, the fifth control signal is at the second level, so that the tenth transistor and the twelfth transistor are turned on, and the seventh transistor, the eighth transistor, the ninth transistor and the eleventh transistor are turned off.

According to a third aspect of the present disclosure, there is provided a gate driving circuit, including:

a plurality of driving units, wherein each driving unit of the plurality of driving units includes a plurality of shift registers connected in cascade;

a plurality of start signal lines connected to the plurality of driving units in a one-to-one correspondence, wherein each start signal line of the plurality of start signal lines is connected to a first stage shift register in a corresponding driving unit;

K clock signal lines connected to the plurality of shift registers in each driving unit, where K is an integer greater than 1; and a mode control circuit connected to the K clock signal lines, wherein the mode control circuit is configured to receive K initial clock signals and a control signal, generate K clock signals based on the K initial clock signals in one of a first resolution mode, a second resolution mode and a third resolution mode under the control of the control signal, and provide the K clock signals generated to the K clock signal lines, respectively.

For example, the mode control circuit is configured to:
in the first resolution mode, generate sequentially shifted K first clock signals based on the K initial clock signals;
in the second resolution mode, generate K second clock signals based on the K initial clock signals, wherein the K second clock signals are divided into 2M groups, a plurality of second clock signals in each group of the 2M groups are synchronized, and an (m+1)th group of second clock signals are shifted with respect to an mth group of second clock signal; and
in the third resolution mode, generate K third clock signals based on the K initial clock signals, wherein the K third clock signals are divided into M groups, a plurality of third clock signals in each group of the M groups are synchronized, and an (m'+1)th group of third clock signals are shifted with respect to an m'th group of third clock signals, where M is an integer greater than 1, m is an integer, m' is an integer, 1≤m≤2M−1, and 1≤m'≤M−1.

For example, K=8, M=2, the control signal includes a first control signal, a second control signal, a third control signal and a fourth control signal, and the mode control circuit includes:
a first clock input terminal to an eighth clock input terminal respectively connected to receive eight initial clock signals;
a first clock output terminal to an eighth clock output terminal connected to eight clock signal lines in a one-to-one correspondence;
a first mode control sub-circuit configured to, under the control of the first control signal, connect the second clock input terminal to the second clock output terminal, connect the fourth clock input terminal to the fourth clock output terminal, connect the seventh clock input terminal to the seventh clock output terminal, and connect the eighth clock input terminal to the eighth clock output terminal;
a second mode control sub-circuit configured to, under the control of the second control signal, connect the third clock input terminal to the third clock output terminal, and connect the sixth clock input terminal to the sixth clock output terminal;
a third mode control sub-circuit configured to, under the control of the third control signal, connect the first clock output terminal to the second clock output terminal, connect the third clock output terminal to the fourth clock output terminal, connect the fifth clock output terminal to the sixth clock output terminal, and connect the seventh clock output terminal to the eighth clock output terminal; and
a fourth mode control sub-circuit configured to, under the control of the fourth control signal, connect the second clock output terminal to the third clock output terminal, and connect the sixth clock output terminal to the seventh clock output terminal.

For example, the first mode control sub-circuit includes:
a first transistor having a gate electrode connected to receive the first control signal, a first electrode connected to the second clock input terminal, and a second electrode connected to the second clock output terminal;
a second transistor having a gate electrode connected to receive the first control signal, a first electrode connected to the fourth clock input terminal, and a second electrode connected to the fourth clock output terminal;
a third transistor having a gate electrode connected to receive the first control signal, a first electrode connected to the seventh clock input terminal, and a second electrode connected to the seventh clock output terminal; and
a fourth transistor having a gate electrode connected to receive the first control signal, a first electrode connected to the eighth clock input terminal, and a second electrode connected to the eighth clock output terminal.

For example, the second mode control sub-circuit includes:
a fifth transistor having a gate electrode connected to receive the second control signal, a first electrode connected to the third clock input terminal, and a second electrode connected to the third clock output terminal; and
a sixth transistor having a gate electrode connected to receive the second control signal, a first electrode connected to the sixth clock input terminal, and a second electrode connected to the sixth clock output terminal.

For example, the third mode control sub-circuit includes:
a seventh transistor having a gate electrode connected to receive the third control signal, a first electrode connected to the first clock output terminal, and a second electrode connected to the second clock output terminal;
an eighth transistor having a gate electrode connected to receive the third control signal, a first electrode connected to the third clock output terminal, and a second electrode connected to the fourth clock output terminal;
a ninth transistor having a gate electrode connected to receive the third control signal, a first electrode connected to the fifth clock output terminal, and a second electrode connected to the sixth clock output terminal; and
a tenth transistor having a gate electrode connected to receive the third control signal, a first electrode connected to the seventh clock output terminal, and a second electrode connected to the eighth clock output terminal.

For example, the fourth mode control sub-circuit includes:
an eleventh transistor having a gate electrode connected to receive the fourth control signal, a first electrode connected to the second clock output terminal, and a second electrode connected to the third clock output terminal; and
a twelfth transistor having a gate electrode connected to receive the fourth control signal, a first electrode connected to the sixth clock output terminal, and a second electrode connected to the seventh clock output terminal.

For example, in each driving unit, an output terminal of an nth stage shift register is connected to an input terminal of an (n+1)th stage shift register, and an output terminal of the (n+1)th stage shift register is connected to a reset terminal of the nth stage shift register, where n is an integer greater than or equal to 1; and
the plurality of shift registers in each driving unit are divided into at least one group, each group of the at least one group includes K shift registers connected in cascade, and the K shift registers have clock signal terminals connected to the K clock signal lines in a one-to-one correspondence.

According to a fourth aspect of the present disclosure, there is provided a method of driving the gate driving circuit according to the third aspect of the present disclosure, including:

generating, by a mode control circuit, K clock signals based on the K initial clock signals in one of a plurality of resolution modes under the control of a control signal, and providing the K clock signals generated to the K clock signal lines, respectively; and applying a start signal to at least one start signal line of a plurality of start signal lines so as to start a driving unit connected to the at least one start signal line, wherein a plurality of shift registers in the driving unit started generate output signals based on clock signals on the K clocks signal lines.

For example, the plurality of resolution modes include a first resolution mode, a second resolution mode and a third resolution mode, wherein, in the first resolution mode, a mode control circuit is configured to generate sequentially shifted K first clock signals based on the K initial clock signals, and provide the sequentially shifted K first clock signals to the K clock signal lines, respectively;

in the second resolution mode, the mode control circuit is configured to generate K second clock signals based on the K initial clock signals, and provide the K second clock signals to the K clock signal lines, respectively, wherein the K second clock signals are divided into 2M groups, a plurality of second clock signals in each group of the 2M groups are synchronized, and an (m+1)th group of second clock signals are shifted with respect to an mth group of second clock signal; and in the third resolution mode, the mode control circuit is configured to generate K third clock signals based on the K initial clock signals, and provide the K third clock signals to the K clock signal lines, respectively, wherein the K third clock signals are divided into M groups, a plurality of third clock signals in each group of the M groups are synchronized, and an (m'+1)th group of third clock signals are shifted with respect to an m'th group of third clock signals, where M is an integer greater than 1, m is an integer, m' is an integer, $1 \le m \le 2M-1$, and $1 \le m' \le M-1$.

For example, K=8, M=2, and wherein, in the first resolution mode, a first mode control sub-circuit is configured to connect a second clock input terminal to a second clock output terminal, connect a fourth clock input terminal to a fourth clock output terminal, connect a seventh clock input terminal to a seventh clock output terminal, and connect an eighth clock input terminal to an eighth clock output terminal; and a second mode control sub-circuit is configured to connect a third clock input terminal to a third clock output terminal, and connect a sixth clock input terminal to a sixth clock output terminal;

in the second resolution mode, the second mode control sub-circuit is configured to connect the third clock input terminal to the third clock output terminal, and connect the sixth clock input terminal to the sixth clock output terminal; and a third mode control sub-circuit is configured to connect the first clock output terminal to the second clock output terminal, connect the third clock output terminal to the fourth clock output terminal, connect the fifth clock output terminal to the sixth clock output terminal, and connect the seventh clock output terminal to the eighth clock output terminal; and in the third resolution mode, the third mode control sub-circuit is configured to connect the first clock output terminal to the second clock output terminal, connect the third clock output terminal to the fourth clock output terminal, connect the fifth clock output terminal to the sixth clock output terminal, and connect the seventh clock output terminal to the eighth clock output terminal; and a fourth mode control sub-circuit is configured to connect the second clock output terminal to the third clock output terminal, and connect the sixth clock output terminal to the seventh clock output terminal.

For example, in the first resolution mode, a first control signal and a second control signal are at a first level, and a third control signal and a fourth control signal are at a second level, so that the first transistor, the second transistor, the third transistor, the fourth transistor, the fifth transistor and the sixth transistor are turned on, and the seventh transistor, the eighth transistor, the ninth transistor, the tenth transistor, the eleventh transistor and the twelfth transistor are turned off;

in the second resolution mode, the first control signal and the fourth control signal are at the second level, and the second control signal and the third control signal are at the first level, so that the first transistor, the second transistor, the third transistor, the fourth transistor, the eleventh transistor and the twelfth transistor are turned off, and the fifth transistor, the sixth transistor, the seventh transistor, the eighth transistor, the ninth transistor and the tenth transistor are turned on; and in the third resolution mode, the first control signal and the second control signal are at the second level, and the third control signal and the fourth control signal are at the first level, so that the first transistor, the second transistor, the third transistor, the fourth transistor, the fifth transistor and the sixth transistor are turned off, and the seventh transistor, the eighth transistor, the ninth transistor, the tenth transistor, the eleventh transistor and the twelfth transistor are turned on.

For example, the K initial clock signals are periodic signals with a duty ratio of 50%, a (k+1)th initial clock signal is shifted by a unit scanning time with respect to a k initial clock signal, and an active level duration of each initial clock signal is four times the unit scanning time.

For example, the K initial clock signals are periodic signals with a duty ratio of 12.5%, wherein a (k+1)th initial clock signal is shifted by a unit scanning time with respect to a k initial clock signal, and an active level duration of each initial clock signal is equal to the unit scanning time.

According to a fifth aspect of the present disclosure, there is provided a gate driving circuit, including:

a plurality of driving units, wherein each driving unit of the plurality of driving units includes a plurality of shift register units connected in cascade, and in the plurality of shift register units, a cascade output terminal of an nth stage shift register unit is connected to a cascade input terminal of an (n+d)th stage shift register unit;

a plurality of start signal lines connected to the plurality of driving units in a one-to-one correspondence, wherein each start signal line of the plurality of start signal lines is connected to a cascade input terminal of a first d stage shift register unit in a corresponding driving unit, where n is an integer greater than or equal to 1, and d is an integer greater than or equal to 1; and K clock signal lines connected to clock signal terminals of the plurality of shift register units in each driving unit, where K=2d.

For example, each shift register unit includes a first shift register, a second shift register and a third shift register, and wherein, the first shift register has an input terminal serving as a cascade input terminal of the shift register unit, an output terminal connected to an input terminal of the second shift register, and a clock signal terminal serving as a clock signal terminal of the shift register unit;

the second shift register has an output terminal connected to an input terminal of the third shift register, and a clock signal terminal serving as the clock signal terminal of the shift register unit; and the third shift register has an output terminal serving as a cascade output terminal of the shift register unit, and a clock signal terminal serving as the clock signal terminal of the shift register unit.

For example, the plurality of shift register units in each driving unit are divided into at least one group, each group of the at least one group includes K shift register units connected in cascade, and in the K shift register units:

the clock signal terminal of the first shift register and the clock signal terminal of the third shift register of a kth shift register unit are connected to a kth clock signal line, where k is an integer, and $1 \leq k \leq K$; and the clock signal terminal of the second shift register of the kth shift register unit is connected to a (k+d)th clock signal line in response to $k \leq K/2$, and connected to a (k−d)th clock signal line in response to $K/2 \leq k \leq K$.

For example, each of the first shift register, the second shift register and the third shift register includes:

an input sub-circuit connected to an input terminal and a pull-up node of the shift register, wherein the input-sub-circuit is configured to provide a signal of the input terminal to the pull-up node;

an output sub-circuit connected to the pull-up node, and a clock signal terminal and an output terminal of the shift register, wherein the output sub-circuit is configured to provide a signal of the clock signal terminal to the output terminal under the control of a potential of the pull-up node; and a control sub-circuit connected to the pull-up node, the output terminal, and a pull-down node of the shift register, wherein the control sub-circuit is configured to control a potential of the pull-down node based on the potential of the pull-up node, and pull down a potential of the output terminal under the control of the potential of the pull-down node.

For example, K=8, d=4.

According to a sixth aspect of the present disclosure, there is provided a method of driving the gate driving circuit according to the fifth aspect of the present disclosure, including:

in one of a plurality of resolution modes, applying K clock signals respectively to K clock signal lines, and applying a start signal to at least one start signal line of the plurality of start signal lines, wherein the start signal applied starts a driving unit connected to the at least one start signal line, and a plurality of shift registers in the driving unit started generate output signals based on clock signals on the K clocks signal lines.

For example, in the first resolution mode, applying sequentially shifted K first clock signals respectively to the K clock signal lines, and applying a first start signal to at least one start signal line of the plurality of start signal lines;

in the second resolution mode, applying K second clock signals respectively to the K clock signal lines, and applying a second start signal to at least one start signal line of the plurality of start signal lines, wherein the K second clock signals are divided into 2M groups, a plurality of second clock signals in each group of the 2M groups are synchronized, and an (m+1)th group of second clock signals are shifted with respect to an mth group of second clock signal; and in the third resolution mode, applying K third clock signals respectively to the K clock signal lines, and applying a third start signal to at least one start signal line of the plurality of start signal lines, wherein the K third clock signals are divided into M groups, a plurality of third clock signals in each group of the M groups are synchronized, and an (m'+1)th group of third clock signals are shifted with respect to an m'th group of third clock signals, where M is an integer greater than 1, m is an integer, m' is an integer, $1 \leq m \leq 2M-1$, and $1 \leq m' \leq M-1$.

For example, the first clock signal, the second clock signal and the third clock signal are periodic signals with a duty ratio of 50%, and wherein, an active level duration in a signal period of the first clock signal is 4H, and a (k+1)th first clock signal is shifted by H with respect to a kth first clock signal, where H represents a unit scanning time;

an active level duration in a signal period of the second clock signal is 2H, and an (m+1)th second clock signal is shifted by H with respect to an mth second clock signal; and an active level duration in a signal period of the third clock signal is H, and an (m'+1)th third clock signal is shifted by H with respect to an m'th third clock signal.

For example, an active level duration of the first start signal is 4H, an active level duration of the second start signal is 2H, and an active level duration of the third start signal is H.

For example, the plurality of driving units include a first driving unit, a second driving unit and a third driving unit, and the plurality of start signal lines include a first start signal line, a second start signal line and a third start signal line respectively connected to the first driving unit, the second driving unit and the third driving unit, and wherein the method further includes:

in a first period, applying K clock signals to K clock signal lines and applying a first start signal to the second start signal line in the first resolution mode, so that the second driving unit generates an output signal according to the K clock signals applied, in response to the first start signal applied;

in a second period, applying K clock signals to the K clock signal lines and applying a second start signal or a third start signal to the first start signal line in the second resolution mode or the third resolution mode, so that the first driving unit generates an output signal according to the K clock signals applied, in response to the second start signal or the third start signal applied;

in a third period, applying K clock signals to the K clock signal lines and applying the first start signal to the second start signal line in the first resolution mode, so that the second driving unit generates an output signal according to the K clock signals applied, in response to the first start signal applied; and in a fourth period, applying K clock signals to the K clock signal lines and applying the third start signal to the third start signal line in the second resolution mode or the third resolution mode, so that the third driving unit generates an output signal according to the K clock signals applied, in response to the third start signal applied.

For example, K=8, M=2.

According to a seventh aspect of the present disclosure, there is provided a display panel including the gate driving circuit described above.

DETAILED DESCRIPTION OF EMBODIMENTS

Figure 1:
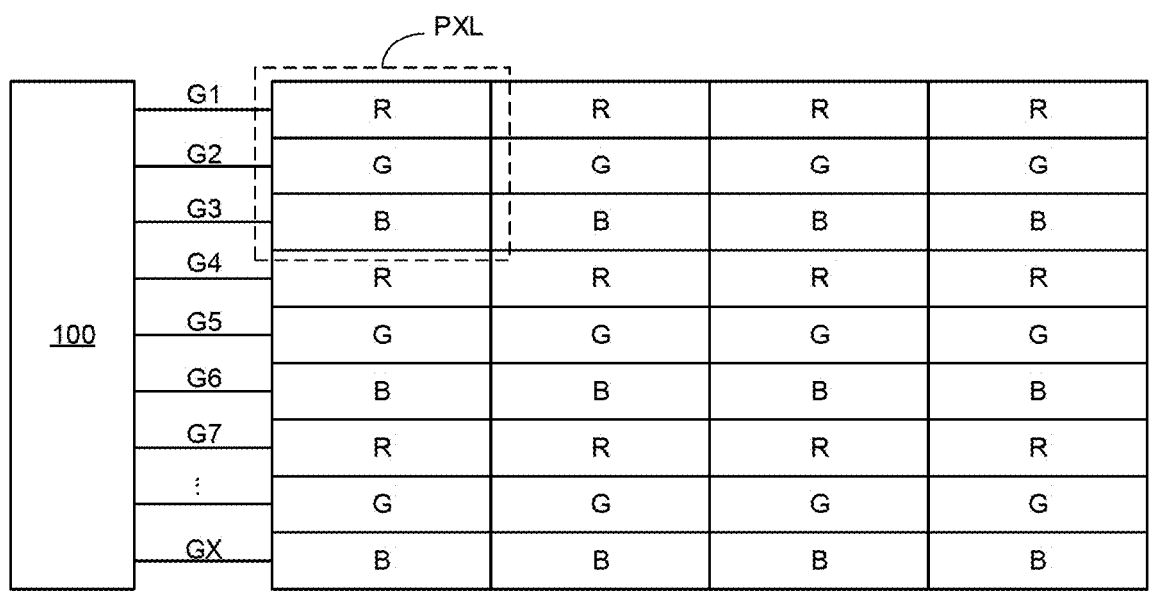
FIG. 1 shows a schematic diagram of a display panel according to some embodiments of the present disclosure.

In order to make objectives, technical solutions and advantages of the present disclosure clearer, the technical solutions of the present disclosure are clearly and completely described below with reference to the drawings of the embodiments of the present disclosure. Obviously, the embodiments described are only a part but not all of the embodiments of the present disclosure. Based on the embodiments of the present disclosure, all other embodiments obtained by persons of ordinary skill in the art without carrying out inventive effort fall within the protection scope of the present disclosure. It should be noted that throughout the drawings, the same elements are represented by the same or similar reference numerals. In the following description, some specific embodiments are only used for descriptive purposes, and should not be construed as limiting the present disclosure. They are merely examples of the embodiments of the present disclosure. When it may cause confusion in the understanding of the present disclosure, conventional structures or configurations will be omitted. It should be noted that the shape and size of each component in the figure do not reflect the actual size and ratio, but merely illustrate the content of the embodiment of the present disclosure.

Unless otherwise defined, the technical or scientific terms used in the embodiments of the present disclosure should have the usual meanings understood by those skilled in the art. The words "first," "second," and the like used in the embodiments of the present disclosure do not indicate any order, quantity or importance, but are only used to distinguish different composition parts.

In addition, in the description of the embodiments of the present disclosure, the term "connected" or "connected to" may mean that two components are directly connected, or that two components are connected via one or more other components. In addition, these two components may be connected or coupled by wired or wireless means.

In addition, in the description of the embodiments of the present disclosure, the terms "first level" and "second level" are only used to distinguish amplitude difference between the two levels. For example, in the following description, the "first level" being a high level and the "second level" being a low level are illustrated by way of example. Those skilled in the art may understand that the present disclosure is not limited thereto.

Transistors used in the embodiments of the present disclosure may all be thin film transistors or field effect transistors or other devices with the same characteristics. Preferably, the thin film transistor used in the embodiments of the present disclosure may be an oxide semiconductor transistor or a low temperature poly-silicon (LTPS) thin film transistor. Since source and drain electrodes of the thin film transistor used here are symmetrical, the source and drain electrodes may be interchanged. In the embodiments of the present disclosure, one of the source electrode and the drain electrode is called a first electrode, and the other is called a second electrode. In the following examples, an N-type thin film transistor is taken as an example for description. Those skilled in the art may understand that the embodiments of the present disclosure may obviously be applied to the case of P-type thin film transistors.

FIG. 1 shows a schematic diagram of a display panel according to some embodiments of the present disclosure. As shown in FIG. 1, the display panel includes pixel units PXL arranged in an array. Each pixel unit PXL may include a plurality of sub-pixels, which include a red sub-pixel R, a green sub-pixel G and a blue sub-pixel B in this embodiment. As shown in FIG. 1, each row of pixel units PXL includes three rows of sub-pixels, in which the red sub-pixels R are arranged in a first row, the green sub-pixels G are arranged in a second row, and the blue sub-pixels are arranged in a third row. The display panel may further include a gate driving circuit 100 that is connected to a plurality of rows of pixel units through a plurality of gate lines G1, G2, . . . GX, for example, connected to the red sub-pixel R of a first row of pixel unit PXL through the gate line G1, connected to the green sub-pixel G of the first row of pixel unit PXL through the gate line G2, connected to the blue sub-pixel B of the first row of pixel unit PXL through the gate line G3, and so on.

The gate driving circuit 100 of the embodiments of the present disclosure may include a plurality of shift registers. The shift register of the embodiments of the present disclosure will be exemplified below with reference to FIG. 2A and FIG. 2B.

Figure 2A:
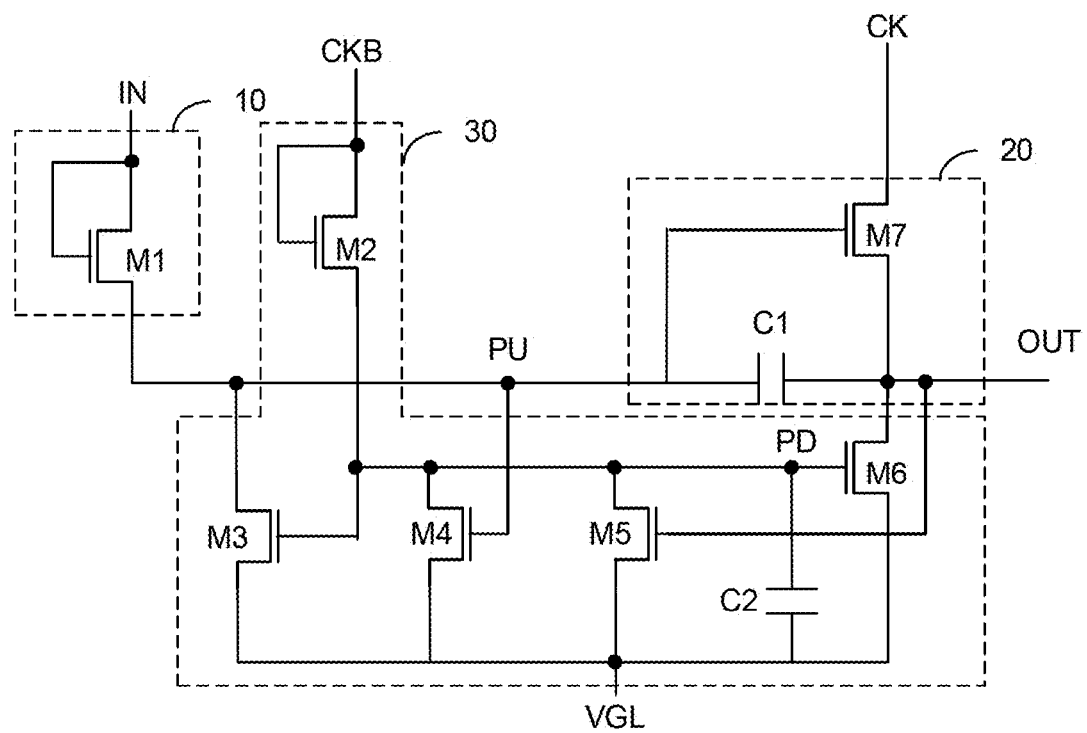
FIG. 2A shows a circuit diagram of a shift register according to an embodiment of the present disclosure.

FIG. 2A shows a circuit diagram of a shift register according to an embodiment of the present disclosure. As shown in FIG. 2A, the shift register may include an input sub-circuit 10, an output sub-circuit 20, and a control sub-circuit 30.

The input sub-circuit 10 is connected to an input terminal IN and a pull-up node PU of the shift register, and may provide a signal of the input terminal IN to the pull-up node PU. As shown in FIG. 2A, the input sub-circuit 10 may include a transistor M1 having a gate electrode and a first electrode connected to the input terminal IN, and a second electrode connected to the pull-up node PU.

The output sub-circuit 20 is connected to the pull-up node PU, a clock signal terminal CK of the shift register, and an output terminal OUT of the shift register. The output sub-circuit 20 may provide a signal of the clock signal terminal CK to the output terminal OUT under the control of a potential of the pull-up node PU. As shown in FIG. 2A, the output sub-circuit 20 may include a transistor M7 and a capacitor C1. The transistor M7 has a gate electrode connected to the pull-up node PU, a first electrode connected to the clock signal terminal CK, and a second electrode connected to the output terminal OUT. The capacitor C1 has one terminal connected to the pull-up node PU, and the other terminal connected to the output terminal OUT.

The control sub-circuit 30 is connected to the pull-up node PU, the output terminal OUT, and a pull-down node PD of the shift register. The control sub-circuit 30 may control a potential of the pull-down node PD based on the potential of the pull-up node, and pull down a potential of the output terminal OUT under the control of the potential of the pull-down node PD. In FIG. 2A, the control sub-circuit 30 may include transistors M2, M4 and M6, and a capacitor C2. The transistor M2 has a gate electrode and a first electrode connected to a control terminal CKB, and a second electrode connected to the pull-down node PD. The transistor M4 has a gate electrode connected to the pull-up node PU, a first electrode connected to a reference signal terminal VGL, and a second electrode connected to the pull-down node PD. The transistor M6 has a gate electrode connected to the pull-down node PD, a first electrode connected to the reference signal terminal VGL, and a second electrode connected to the output terminal OUT. The capacitor C2 has one terminal connected to the gate electrode of the transistor M6, and the other terminal connected to the first electrode of the transistor M6. In some embodiments, the control sub-circuit 30 may further include a transistor M3 having a gate electrode connected to the pull-down node PD, a first electrode connected to the reference signal terminal VGL, and a second electrode connected to the pull-up node PU. In some embodiments, the control sub-circuit 30 may further include a transistor M5 having a gate electrode connected to the output terminal OUT, a first electrode connected to the reference signal terminal VGL, and a second electrode connected to the pull-down node PD.

When an input signal of the input terminal IN is at a high level, the transistor M1 is turned on, so as to provide the high level of the input terminal IN to the pull-up node PU, and the transistor M7 is turned on. When the input signal of the input terminal IN is changed to a low level, the capacitor C1 keeps the pull-up node PU at a high level. During a period when the pull-up node PU is at the high level, a high level of a clock signal of the clock signal terminal CK arrives, and the turned-on transistor M7 provides the high level of the clock signal terminal CK to the output terminal OUT, so as to generate an output signal at a high level. The high level of the output terminal OUT may turn on the transistor M5 and pull down the pull-down node PD to a low level. After that, the clock signal of the clock signal terminal CK is at a low level, the control terminal CKB is at a high level, and the turned-on transistor M7 provides the low level of the clock signal terminal CK to the output terminal OUT, so as to generate an output signal at a low level, and then turn off the transistor M5. The high level of the control terminal CKB may turn on the transistor M2, so that the pull-down node PD is changed to a high level. The high level of the pull-down node PD may turn on the transistor M3, so as to pull down the pull-down node PD to a low level.

Figure 2B:
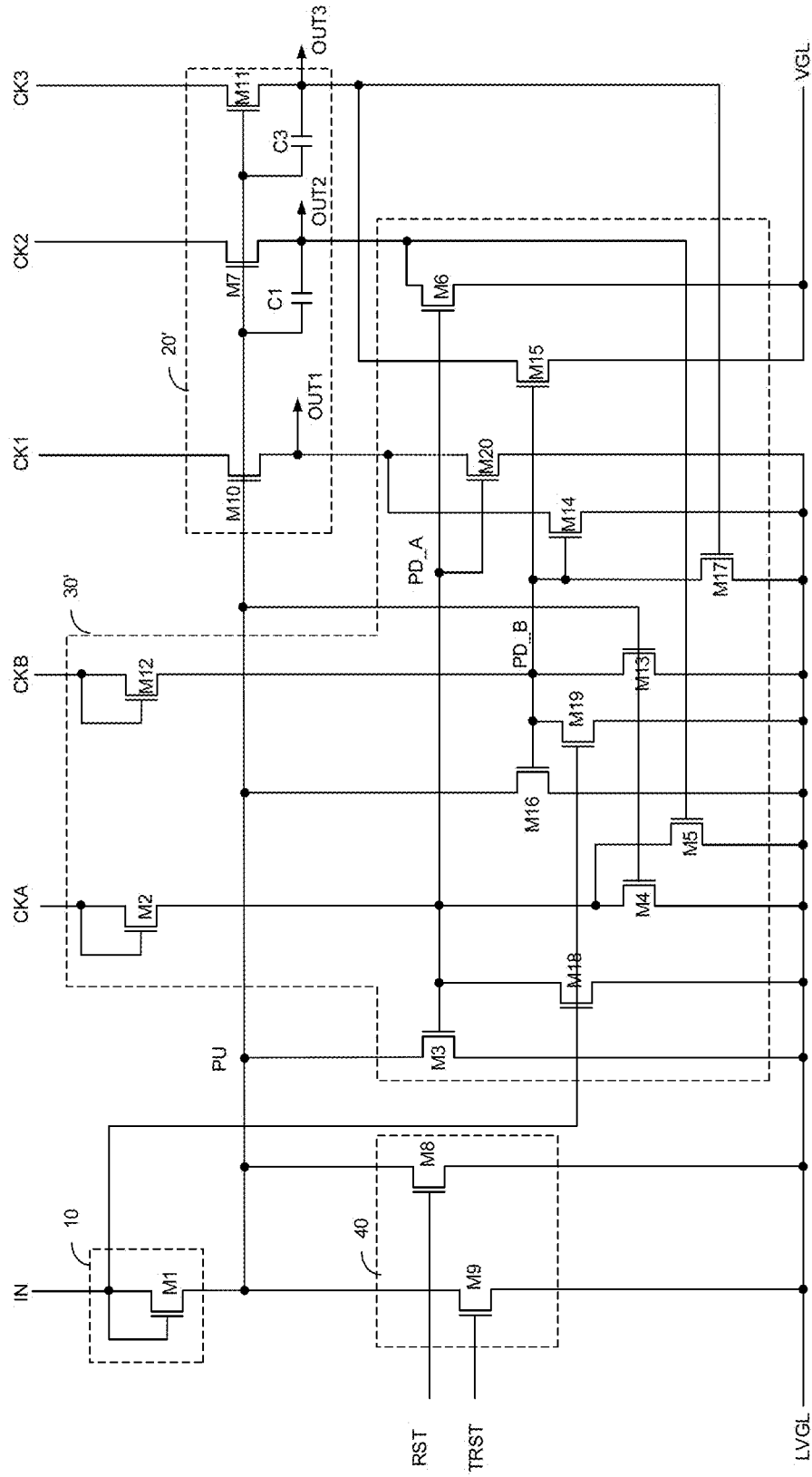
FIG. 2B shows a circuit diagram of a shift register according to another embodiment of the present disclosure.

FIG. 2B shows a circuit diagram of a shift register according to another embodiment of the present disclosure. The shift register of FIG. 2B is similar in structure to the shift register of FIG. 2A, and the difference lies at least in that the shift register of FIG. 2B further includes a reset sub-circuit 40. In order to simplify the description, the following will mainly describe the different parts in detail.

As shown in FIG. 2B, the shift register may include the input sub-circuit 10, an output sub-circuit 20', a control sub-circuit 30', and a reset sub-circuit 40.

The input sub-circuit 10 may have the same structure as the input sub-circuit 10 described above, which will not be repeated here.

The reset sub-circuit 40 is connected to the pull-up node PU and a reset terminal RST, and may reset the pull-up node PU according to a reset signal of the reset terminal RST. As shown in FIG. 2B, the reset sub-circuit 40 includes a transistor M8 having a gate electrode connected to the reset terminal RST and a first electrode connected to a first reference signal terminal LVGL. The reset sub-circuit 40 may further include a transistor M9 having a gate electrode connected to a master reset terminal TRST, a first electrode connected to the first reference signal terminal LVGL, and a second electrode connected to the pull-up node PU.

The output sub-circuit 20' may include a first output sub-circuit, a second output sub-circuit, and a third output sub-circuit. The first output sub-circuit may include a transistor M10 having a gate electrode connected to the pull-up node, a first electrode connected to a first clock signal terminal CK1, and a second electrode connected to a first output terminal OUT1. The second output sub-circuit may have the same structure as the output sub-circuit 20 described above, and may include a transistor M7 and a capacitor C1. The transistor M7 has a first electrode connected to a second clock signal terminal CK2, and a second electrode connected to a second output terminal OUT2. The third output sub-circuit may include a transistor M11 and a capacitor C3. The transistor M11 has a gate electrode connected to the pull-up node PU, a first electrode connected to a third clock signal terminal CK3, and a second electrode connected to a third output terminal OUT3. The capacitor C3 has one terminal connected to the gate electrode of the transistor M11, and the other terminal connected to the second electrode of the transistor M11. At least one of the second output terminal OUT2 and the third output terminal OUT3 may be connected to the sub-pixel so as to apply a gate driving signal to the sub-pixel. The first output terminal OUT1 may be connected to other shift register so as to achieve a cascade connection of shift registers.

The control sub-circuit 30' may include a first control sub-circuit and a second control sub-circuit. The first control sub-circuit may have the same structure as the control sub-circuit 30 described above, and may include transistors M2, M3, M4, M5 and M6. The transistor M2 has a gate electrode and a first electrode connected to a first control terminal CKA, and a second electrode connected to a first pull-down node PD_A. The transistor M3 has a gate electrode connected to the first pull-down node PD_A, a first electrode connected to the pull-up node PU, and a second electrode connected to the first reference signal terminal LVGL. The transistor M4 has a gate electrode connected to the pull-up node PU, a first electrode connected to the first reference signal terminal LVGL, and a second electrode connected to the first pull-down node PD_A. The transistor M5 has a gate electrode connected to the second output terminal OUT2, a first electrode connected to the first reference signal terminal LVGL, and a second electrode connected to the first pull-down node PD_A. The transistor M6 has a gate electrode connected to the first pull-down node PD_A, a first electrode connected to the reference signal terminal VGL, and a second electrode connected to the second output terminal OUT2. The second control sub-circuit may include transistors M12, M13, M14, M15, M16 and M17. The transistor M12 has a gate electrode and a first electrode connected to the second control terminal CKB, and a second electrode connected to a second pull-down node PD_B. The transistor M13 has a gate electrode connected to the pull-up node PU, a first electrode connected to the reference signal terminal VGL, and a second electrode connected to the second pull-down node PD_B. The transistor M14 has a gate electrode connected to the second pull-down node PD_B, a first electrode connected to the first reference signal terminal LVGL, and a second electrode connected to the first output terminal OUT1. The transistor M15 has a gate electrode connected to the second pull-down node PD_B, a first electrode connected to the first reference signal terminal LVGL, and a second electrode connected to the third output terminal OUT3. The transistor M16 has a gate electrode connected to the second pull-down node PD_B, a first electrode connected to the first reference signal terminal LVGL, and a second electrode connected to the pull-up node PU. The transistor M17 has a gate electrode connected to the third output terminal OUT3, a first electrode connected to the first reference signal terminal LVGL, and a second electrode connected to the second pull-down node PD_B. The control sub-circuit 30' may further include transistors M18 and M19. A gate electrode of the transistor M18 and a gate electrode of the transistor M19 are connected to the input terminal IN, a first electrode of the transistor M18 and a first electrode of the transistor M19 are connected to the first reference signal terminal LVGL, a second electrode of the transistor M18 is connected to the first pull-down node PD_A, and a second electrode of the transistor M19 is connected to the second pull-down node PD_B. The control sub-circuit 30' may further include a transistor M20 having a gate electrode connected to the first pull-down node PD_A, a first electrode connected to the first reference signal terminal LVGL, and a second electrode connected to the first output terminal OUT1.

Although the shift register is illustrated with a specific structure above, the embodiments of the present disclosure are not limited to this, and any suitable shift register may be adopted as required.

Figure 3:
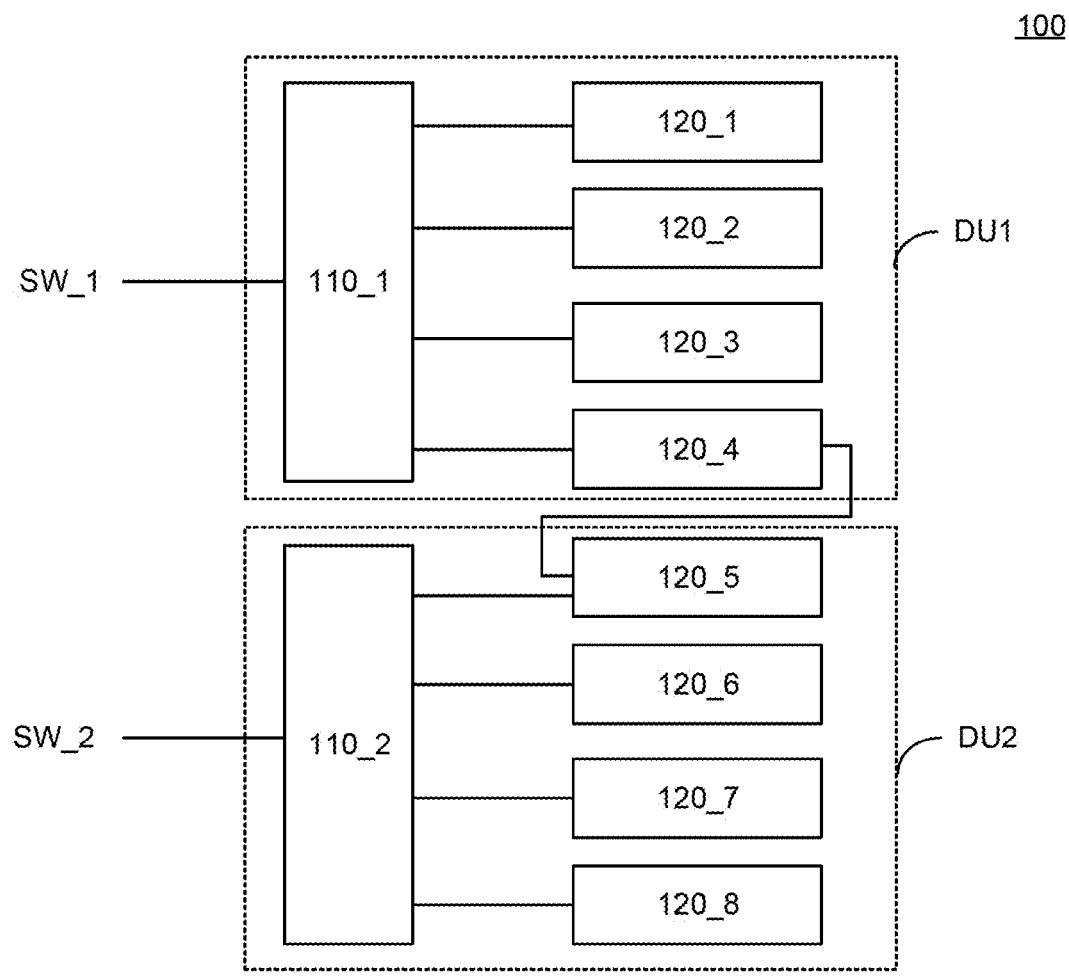
FIG. 3 shows a block diagram of a gate driving circuit according to an embodiment of the present disclosure.

FIG. 3 shows a block diagram of the gate driving circuit according to an embodiment of the present disclosure.

As shown in FIG. 3, a gate driving circuit 100 includes a plurality of driving units connected in cascade, such as driving units DU1 and DU2. Each driving unit may include N shift register units and a mode control circuit, where N is an integer greater than 1. For example, when N=4, the driving unit DU1 may include shift register units 120_1, 120_2, 120_3 and 120_4, and a mode control circuit 110_1, and the driving unit DU2 may include shift register units 120_5, 1206, 120_7 and 1208, and a mode control circuit 110_2. Each shift register unit may include a plurality of shift registers, which will be described in detail below.

In the driving unit DU1, the mode control circuit 110_1 is connected to the shift register units 120_1, 120_2, 120_3 and 120_4. The mode control circuit 110_1 may receive a control signal SW_1 for the driving unit DU1, and connect the shift register units 120_1, 120_2, 120_3 and 120_4 in one of a plurality of resolution modes under the control of the control signal SW_1.

In the driving unit DU2, the mode control circuit 110_2 is connected to the shift register units 120_5, 120_6, 120_7 and 120_8. The mode control circuit 110_2 may receive a control signal SW_2 for the driving unit DU2, and connect the shift register units 1205, 120_6, 120_7 and 120_8 in one of a plurality of resolution modes under the control of the control signal SW_2.

For example, the plurality of resolution modes may include a first resolution mode, a second resolution mode, and a third resolution mode. The driving unit DU1 is illustrated below by way of example in describing an operation in the three resolution modes.

In the first resolution mode, the mode control circuit 110_1 may connect the shift register units 1201, 120_2, 120_3 and 120_4 in cascade.

In the second resolution mode, the mode control circuit 110_1 may divide the shift register units 1201, 120_2, 120_3 and 120_4 into M groups, connect the M groups in cascade, and connect shift register units in each group of the M groups in parallel. For example, the shift register units 120_1 and 120_2 are divided into a first group, and the shift register units 120_3 and 120_4 are divided into a second group. The first group and the second group are connected in cascade, the shift register units 120_1 and 120_2 in the first group are connected in parallel, and the shift register units 120_3 and 120_4 in the second group are connected in parallel.

In the third resolution mode, the mode control circuit 110_1 may connect the shift register units 1201, 120_2, 120_3 and 120_4 in parallel.

An operation of the driving unit DU2 in the three resolution modes is similar to that of the driving unit DU1, and will not be repeated here.

Figure 4:
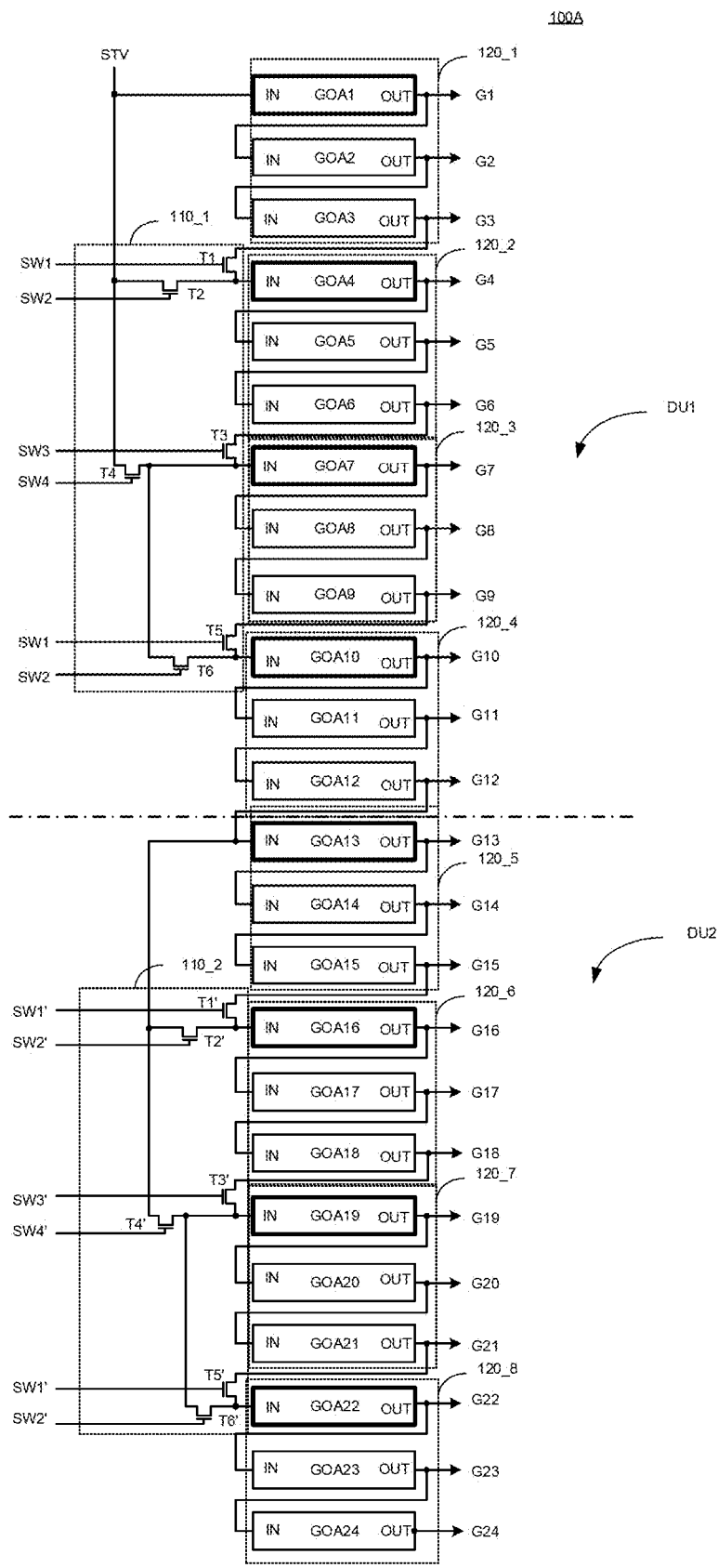
FIG. 4 shows an exemplary structural diagram of the gate driving circuit of FIG. 3.

FIG. 4 shows an exemplary structural diagram of the gate driving circuit of FIG. 3.

As shown in FIG. 4, a gate driving circuit 100A includes driving units DU1 and DU2. In each of the driving units DU1 and DU2, each shift register unit may include a first shift register, a second shift register and a third shift register. Each of the first shift register, the second shift register and the third shift register may have the shift register structure of any of the embodiments described above, for example, may be implemented as the shift register shown in FIG. 2A. In the driving unit DU1, the shift register unit 120_1 (a first shift register unit) may include shift registers GOA1, GOA2 and GOA3 as a first shift register, a second shift register and a third shift register, respectively. The register unit 120_2 (a second shift register unit) may include shift registers GOA4, GOA5 and GOA6 as a first shift register, a second shift register and a third shift register, respectively. The shift register unit 120_3 (a third shift register unit) may include shift registers GOA7, GOA8 and GOA9 as a first shift register, a second shift register and a third shift register, respectively. The shift register unit 120_4 (a fourth shift register unit) may include shift registers GOA10, GOA11 and GOA12 as a first shift register, a second shift register and a third shift register, respectively. Similarly, in the driving unit DU2, the shift register unit 120_5 (a first shift register unit) may include shift registers GOA13, GOA14 and GOA15, the shift register unit 120_6 (a second shift register unit) may include shift registers GOA16, GOA17 and GOA18, the shift register unit 120_7 (a third shift register unit) may include shift registers GOA19, GOA20 and GOA21, and the shift register unit 120_8 (a fourth shift register unit) may include shift registers GOA22, GOA23 and GOA24.

Each shift register unit has a cascade input terminal and a first cascade output terminal.

For example, in the shift register unit 120_1 of the driving unit DU1, the input terminal IN of the shift register GOA1 serves as the cascade input terminal of the shift register unit 120_1 to receive a start signal STV; the input terminal IN of the shift register GOA2 is connected to the output terminal OUT of the shift register GOA1; the input terminal IN of the shift register GOA3 is connected to the output terminal OUT of the shift register GOA2, and the output terminal OUT of the shift register GOA3 serves as the first cascade output terminal of the shift register unit 120_1. A connection mode of the shift registers in the shift register units 1202, 120_3 and 120_4 of the driving unit DU1 is similar to that in the shift register unit 120_1, and will not be repeated here.

Similarly, in the shift register unit 120_5 of the driving unit DU2, the input terminal IN of the shift register GOA13 serves as the cascade input terminal of the shift register unit 120_5 to receive a cascade output signal from the driving unit DU1; the input terminal IN of the shift register GOA14 is connected to the output terminal OUT of the shift register GOA13; the input terminal IN of the shift register GOA15 is connected to the output terminal OUT of the shift register GOA14, and the output terminal OUT of the shift register GOA15 serves as the first cascade output terminal of the shift register unit 120_5. A connection mode of the shift registers in the shift register units 120_6, 120_7 and 120_8 of the driving unit DU2 is similar to that in the shift register unit 120_5, and will not be repeated here.

As shown in FIG. 4, the first cascade output terminal of the shift register unit 120_4 in the driving unit DU1 (that is, the output terminal of the shift register GOA12) is connected to the cascade input terminal of the shift register unit 120_5 in the driving unit DU2 (that is, the input terminal of the shift register GOA13), so as to achieve a cascade connection of the driving units DU1 and DU2.

In each driving unit, the mode control circuit may include a first transistor, a second transistor, a third transistor, a fourth transistor, a fifth transistor and a sixth transistor, and the control signal for each driving unit may include a first control signal, a second control signal, a third control signal and a fourth control signal.

For example, in the driving unit DU1, the mode control circuit 110_1 may include a first transistor T1, a second transistor T2, a third transistor T3, a fourth transistor T4, a fifth transistor T5, and a sixth transistor T6; the control signal SW_1 for the driving unit DU1 may include a first control signal SW1, a second control signal SW2, a third control signal SW3, and a fourth control signal SW4.

The first transistor T1 has a gate electrode connected to receive the first control signal SW1, a first electrode connected to the first cascade output terminal of the first shift register unit 120_1 (that is, the output terminal OUT of the shift register GOA3), and a second electrode connected to the cascade input terminal of the second shift register unit 120_2 (that is, the input terminal IN of the shift register GOA4).

The second transistor T2 has a gate electrode connected to receive the second control signal SW2, a first electrode connected to the cascade output terminal of the first shift register unit 120_1 (that is, the input terminal IN of the shift register GOA1), and a second electrode connected to the cascade input terminal of the second shift register unit 120_2 (that is, the input terminal IN of the shift register GOA4).

The third transistor T3 has a gate electrode connected to receive the third control signal SW3, a first electrode connected to the first cascade output terminal of the second shift register unit 120_2 (that is, the output terminal OUT of the shift register GOA6), and a second electrode connected to the cascade input terminal of the third shift register unit 120_3 (that is, the input terminal IN of the shift register GOA7).

The fourth transistor T4 has a gate electrode connected to receive the fourth control signal SW4, a first electrode connected to the cascade input terminal of the first shift register unit 120_1 (that is, the input terminal IN of the shift register GOA1), and a second electrode connected to the cascade input terminal of the third shift register unit 120_3 (that is, the input terminal IN of the shift register GOA7).

The fifth transistor T5 has a gate electrode connected to receive the first control signal SW1, a first electrode connected to the first cascade output terminal of the third shift register unit 120_3 (that is, the output terminal OUT of the shift register GOA9), and a second electrode connected to the cascade input terminal of the fourth shift register unit 120_4 (that is, the input terminal IN of the shift register GOA10).

The sixth transistor T6 has a gate electrode connected to receive the second control signal SW2, a first electrode connected to the cascade input terminal of the third shift register unit 120_3 (that is, the input terminal IN of the shift register GOA7), and a second electrode connected to the cascade input terminal of the fourth shift register 120_4 (that is, the input terminal IN of the shift register GOA10).

Similarly, in the driving unit DU2, the mode control circuit 110_2 may include a first transistor T1', a second transistor T2', a third transistor T3', a fourth transistor T4', a fifth transistor T5', and a sixth transistor T6'; the control signal SW_2 for the driving unit DU2 may include a first control signal SW1', a second control signal SW2', a third control signal SW3', and a fourth control signal SW4'. A connection mode of the first transistor T1', the second transistor T2', the third transistor T3', the fourth transistor T4', the fifth transistor T5' and the sixth transistor T6' is similar to that of the first transistor T1, the second transistor T2, the third transistor T3, the fourth transistor T4, the fifth transistor T5 and the sixth transistor T6 in the mode control circuit 110_1, and will not be repeated here.

In some embodiments, the plurality of driving units in the gate driving circuit 100A may be divided into a plurality of groups, and each group of driving units are connected to a group of control signal lines to receive a control signal for the group of driving units, so that the plurality of groups may perform display driving in different resolution modes.

As shown in FIG. 4, the driving units DU1 and DU2 in the gate driving circuit 100A are divided into different groups. For example, the driving unit DU1 is divided into a first group for display driving in the first resolution mode, and the driving unit DU2 is divided into a second group for display driving in the first resolution mode, and a boundary between the first group and the second group is as shown by a dashed line in FIG. 4. In this case, the driving unit DU1 in the first group may be connected to first to fourth control signal lines so as to respectively receive the control signals SW1 to SW4 for the first group of driving units; the driving unit DU2 in the second group may be connected to fifth to eighth control signal lines so as to respectively receive the control signals SW1' to SW4' for the second group of driving units.

In some embodiments, if the driving units DU1 and DU2 are divided into the same group, the gate electrode of the first transistor T1 of the driving unit DU1 and the gate electrode of the first transistor T1' of the driving unit DU2 may both be connected to the first control signal line so as to receive the same first control signal. In this case, the first control signal SW1 for the driving unit DU1 and the first control signal for the driving unit DU2 are the same signal. Similarly, the gate electrode of the second transistor T2 of the driving unit DU1 and the gate electrode of the first transistor T2' of the driving unit DU2 may be connected to the second control signal line so as to receive the same second control signal, the gate electrode of the third transistor T3 of the driving unit DU1 and the gate electrode of the third transistor T3' of the driving unit DU2 may be connected to the third control signal line so as to receive the same third control signal, and the gate electrode of the fourth transistor T4 of the driving unit DU1 and the gate electrode of the fourth transistor T4' of the driving unit DU2 may be connected to the fourth control signal line so as to receive the same fourth control signal.

An operation of the gate driving circuit 100A of FIG. 4 in different resolution modes will be described below with reference to Table 1. For the sake of conciseness, a driving unit DU1 will be illustrated by way of example.

TABLE 1

|  | First resolution mode | Second resolution mode | Third resolution mode |
| --- | --- | --- | --- |
| SW1 | 1 | 0 | 0 |
| SW2 | 0 | 1 | 1 |
| SW3 | 1 | 1 | 0 |
| SW4 | 0 | 0 | 1 |

In Table 1, 0 represents a low level, and 1 represents a high level. However, the embodiments of the present disclosure are not limited thereto. In some embodiments, 0 may represent a high level, and 1 may represent a low level.

In the first resolution mode, as shown in Table 1, the first control signal SW1 and the third control signal SW3 are at a high level, and the second control signal SW2 and the fourth control signal SW4 are at a low level, so that in the mode control circuit 110_1 of FIG. 4, the transistors T1, T3 and T5 are turned on, and the transistors T2, T4 and T6 are turned off. Then, an equivalent circuit structure shown in FIG. 5A may be obtained.

Figure 5A:
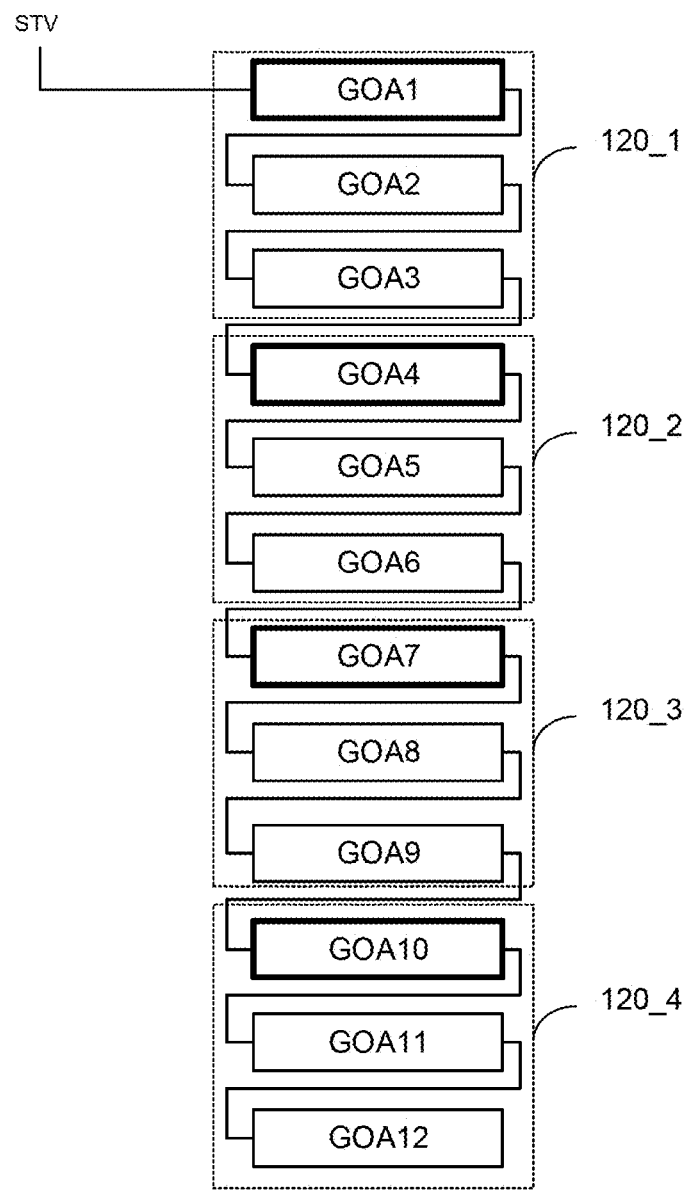
FIG. 5A shows a schematic equivalent diagram of the gate driving circuit of FIG. 4 in a first resolution mode.

As shown in FIG. 5A, the transistor T1 is turned on so that the first cascade output terminal of the first shift register unit 120_1 is connected to the cascade input terminal of the second shift register unit 120_2, and the transistor T2 is turned off so that the cascade input terminal of the first shift register unit 120_1 is disconnected from the cascade input terminal of the second shift register unit 1202. Similarly, the transistor T3 is turned on so that the first cascade output terminal of the second shift register unit 1202 is connected to the cascade input terminal of the third shift register unit 1203, and the transistors T2 and T4 are turned off so that the cascade input terminal of the second shift register unit 120_2 is disconnected from the cascade input terminal of the third shift register unit 120_3. The transistor T5 is turned on so that the first cascade output terminal of the third shift register unit 120_3 is connected to the cascade input terminal of the fourth shift register unit 120_4, and the transistor T6 is turned off so that the cascade input terminal of the third shift register unit 120_3 is disconnected from the cascade input terminal of the fourth shift register unit 120_4. In this way, the cascade connection of the shift register units 120_1 to 120_4 is achieved.

Figure 5B:
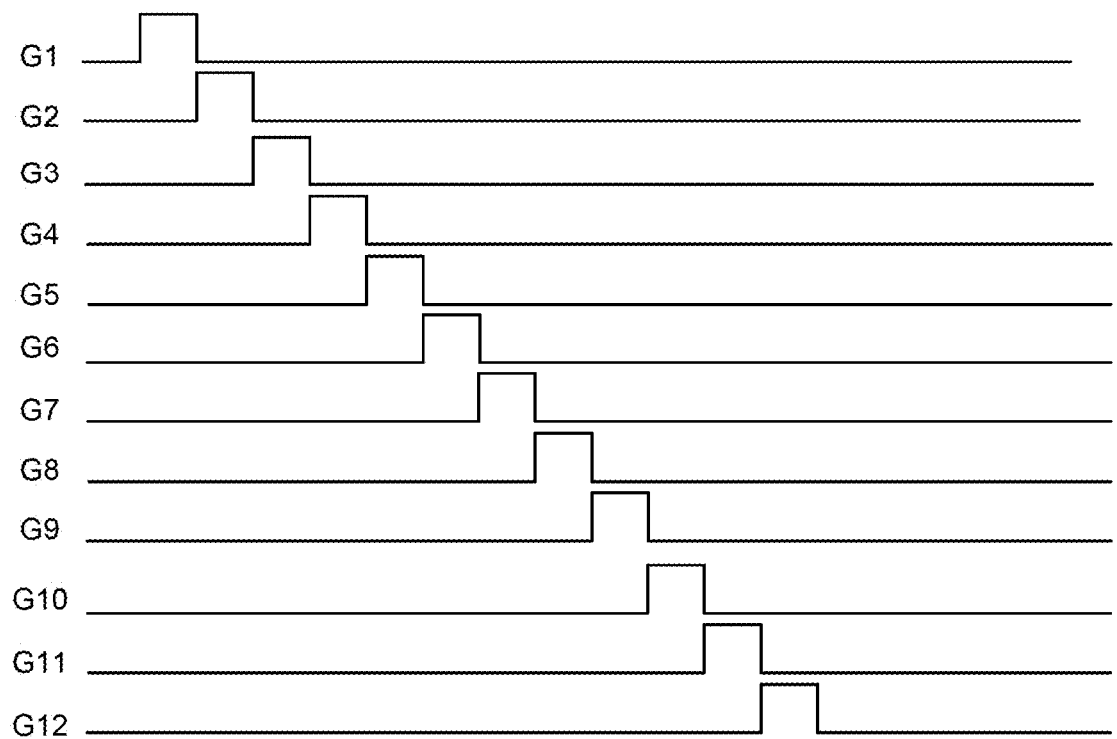
FIG. 5B shows a signal timing diagram of the gate driving circuit of FIG. 4 in the first resolution mode.

As shown in FIG. 5B, under the equivalent circuit structure shown in FIG. 5A, the shift register GOA1 may generate an output signal G1 in response to an input of the start signal STV, and the output signal G1 is provided as an input signal to the shift register GOA2, so that the shift register GOA2 generates an output signal G2 that is shifted with respect to the output signal G1, and so on, so that sequentially shifted output signals G1 to G12 may be obtained. With reference to FIG. 1, by generating the output signal shown in FIG. 5B, the gate driving circuit may perform a line-by-line sequential scanning on the sub-pixels in a display area, so as to perform the display driving at a highest first resolution.

In the second resolution mode, as shown in Table 1, the first control signal SW1 and the fourth control signal SW4 are at a low level, and the second control signal SW2 and the third control signal SW3 are at a high level, so that in the mode control circuit 110_1 of FIG. 4, the transistors T1, T4 and T5 are turned off, and the transistors T2, T3 and T6 are turned on. Then, an equivalent circuit structure shown in FIG. 6A may be obtained.

Figure 6A:
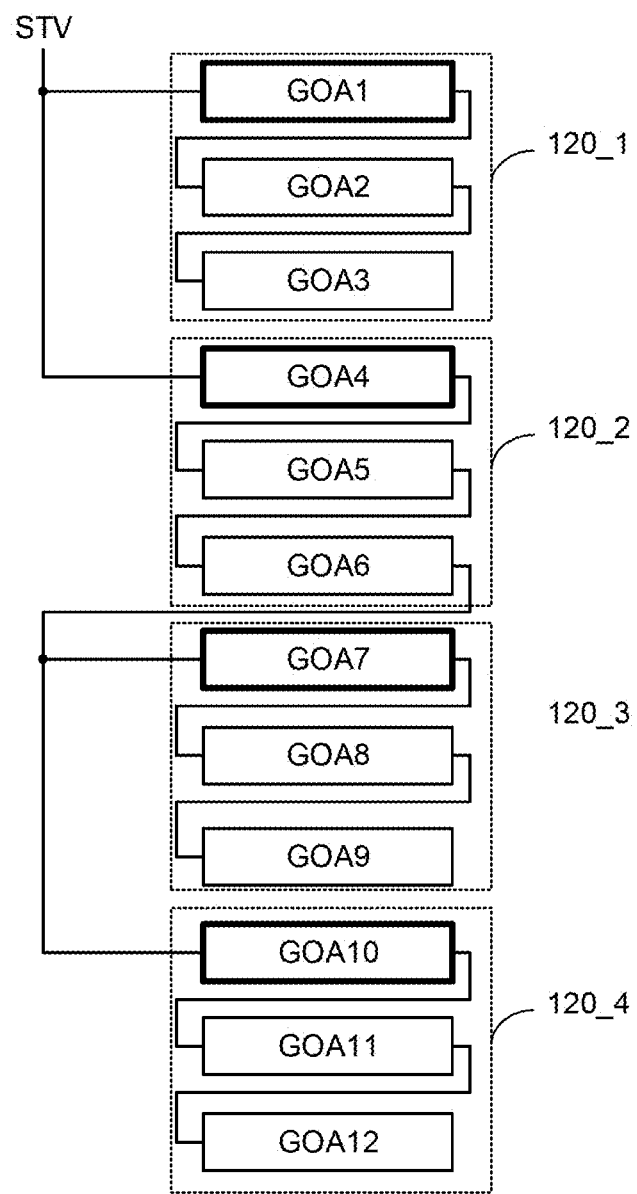
FIG. 6A shows a schematic equivalent diagram of the gate driving circuit of FIG. 4 in a second resolution mode.

As shown in FIG. 6A, the transistor T1 is turned off so that the first cascade output terminal of the first shift register unit 120_1 is disconnected from the cascade input terminal of the second shift register unit 120_2, and the transistor T2 is turned on so that the cascade input terminal of the second shift register unit 120_2 is connected to the cascade input terminal of the first shift register unit 120_1. The transistor T3 is turned on so that the first cascade output terminal of the second shift register unit 120_2 is connected to the cascade input terminal of the third shift register unit 120_3, and the transistor T4 is turned off so that the cascade input terminal of the third shift register unit 120_3 is disconnected from the cascade input terminal of the second shift register unit 120_2. The transistor T5 is turned off so that the first cascade output terminal of the third shift register unit 120_3 is disconnected from the cascade input terminal of the fourth shift register unit 120_4, and the transistor T6 is turned on so that the cascade input terminal of the third shift register unit is connected to the cascade input terminal of the fourth shift register unit. In this way, the shift register units 120_1 to 120_4 are divided into two groups, the first group includes the shift register units 120_1 and 120_2 connected in parallel, the second group includes the shift register units 120_3 and 120_4 connected in parallel, and the first group and the second group are connected in cascade.

Figure 6B:
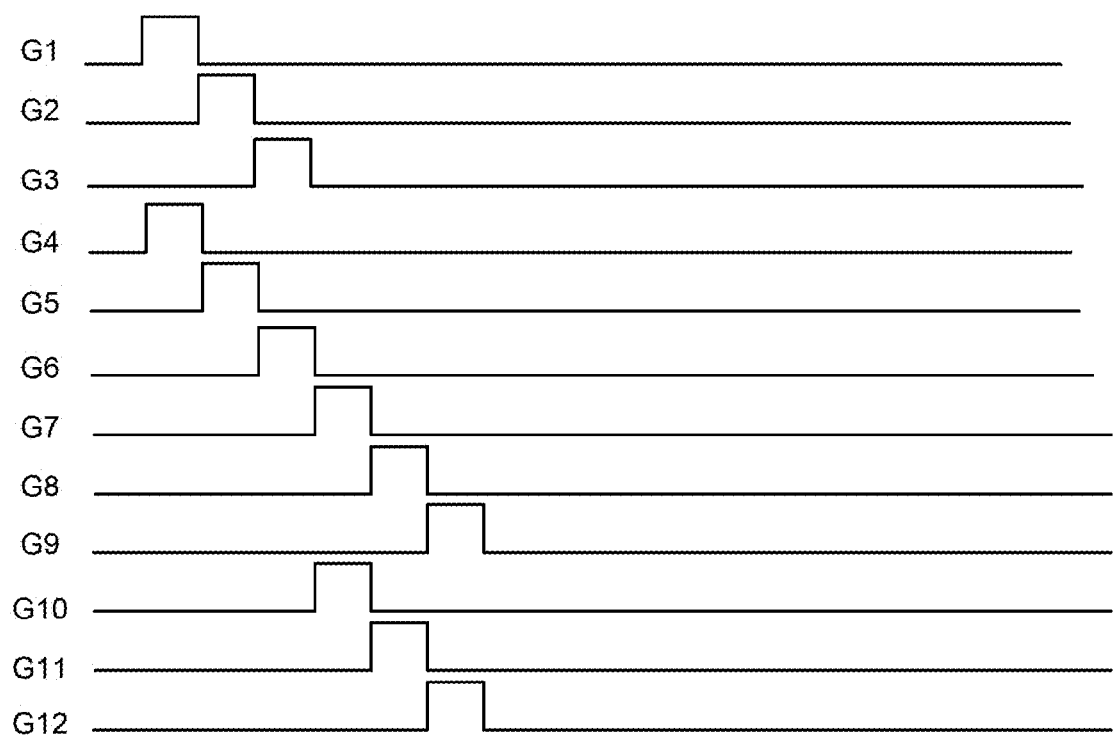
FIG. 6B shows a signal timing diagram of the gate driving circuit of FIG. 4 in the second resolution mode.

As shown in FIG. 6B, under the equivalent circuit structure shown in FIG. 6A, in the shift register units 120_1 and 120_2 in the first group, the shift registers GOA1 and GOA4 may generate output signals G1 and G4 in parallel in response to the input of the start signal STV. The output signals G1 and G4 are provided as input signals to the shift registers GOA2 and GOA5, respectively, so that the shift register GOA2 generates an output signal G2 that is shifted with respect to the output signal G1, and the shift register GOA5 generates an output signal G5 that is shifted with respect to the output signal G4. The output signals G2 and G5 are provided as input signals to the shift registers GOA3 and GOA6, respectively, so that the shift register GOA3 generates an output signal G3 that is shifted with respect to the output signal G2, and the shift register GOA6 generates an output signal G6 that is shifted with respect to the output signal G5. In this way, the shift register units 120_1 and 120_2 in the first group may generate output signals in parallel, that is, the output signals G1 to G3 generated by the shift register unit 120_1 are respectively synchronized with the output signals G4 to G6 generated by the shift register unit 120_2.

The output signal G6 is provided as an input signal to the shift register GOA7 in the shift register unit 120_3 and the shift register GOA10 in the shift register unit 120_4, so that the shift register units 120_3 and 120_4 generate two groups of output signals in parallel in a manner similar to that described above, and the output signals G7 to G12 are shifted with respect to the output signals G1 to G6, respectively. In this way, the group of output signals generated by the second group of shift register units 120_3 and 120_4 are shifted with respect to the group of output signals generated by the first group of shift register units 120_1 and 120_2.

With reference to FIG. 1, by generating the output signal shown in FIG. 6B, the gate driving circuit may perform a group scanning of the sub-pixels in the display area. For example, each two rows of pixel units may be taken as a group, red sub-pixels in the first and second rows of pixel units are simultaneously scanned firstly, then green sub-pixels in the two rows of pixel units are simultaneously scanned, and finally blue sub-pixels in the two rows of pixel units are simultaneously scanned. After the first and second rows of pixel units are scanned, third and fourth rows of pixel units may be scanned in the same way. In this way, it is possible to perform a display driving in the second resolution lower than the first resolution. For example, the second resolution may be one-half of the first resolution.

In the third resolution mode, as shown in Table 1, the first control signal SW1 and the third control signal SW3 are at a low level, and the second control signal SW2 and the fourth control signal SW4 are at a high level, so that in the mode control circuit 110_1 of FIG. 4, the transistors T1, T3 and T5 are turned off, and the transistors T2, T4 and T6 are turned on. Then, an equivalent circuit structure shown in FIG. 7A may be obtained.

Figure 7A:
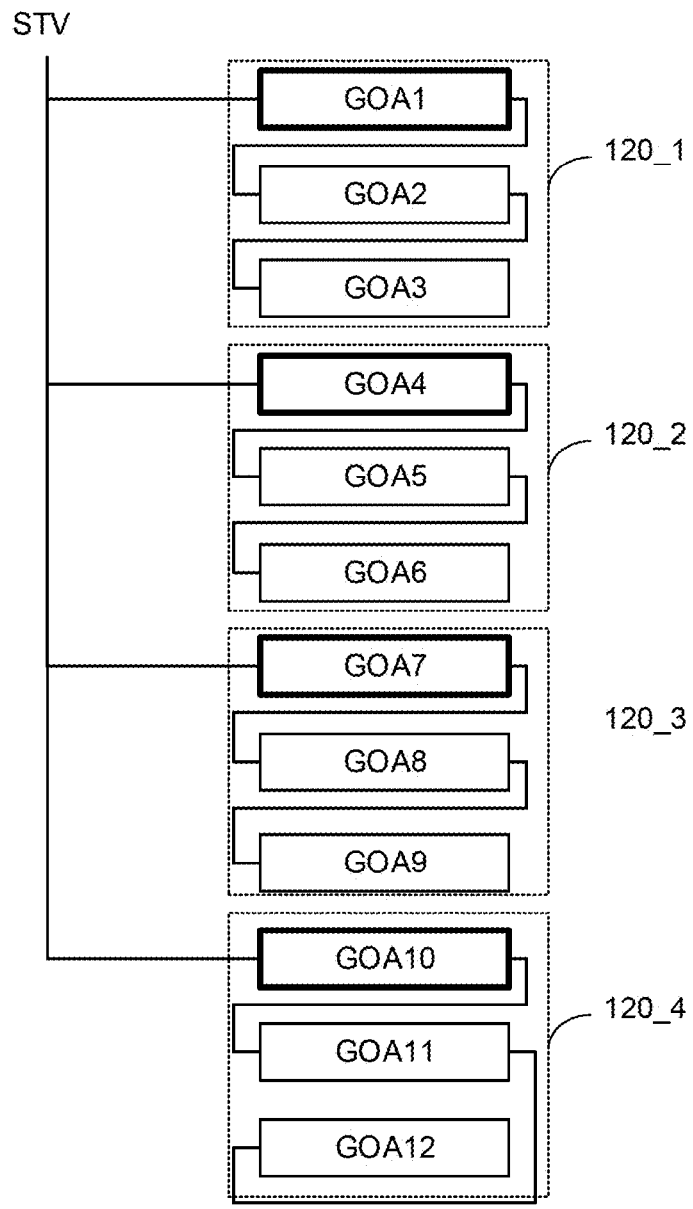
FIG. 7A shows a schematic equivalent diagram of the gate driving circuit of FIG. 4 in a third resolution mode.

As shown in FIG. 7A, the transistor T1 is turned off so that the first cascade output terminal of the first shift register unit 120_1 is disconnected from the cascade input terminal of the second shift register unit 120_2, and the transistor T2 is turned on so that the cascade input terminal of the first shift register unit 120_1 is connected to the cascade input terminal of the second shift register unit 1202. Similarly, the transistor T3 is turned off so that the first cascade output terminal of the second shift register unit 120_2 is disconnected from the cascade input terminal of the third shift register unit 1203, and the transistors T2 and T4 are turned on so that the cascade input terminal of the second shift register unit 120_2 is connected to the cascade input terminal of the third shift register unit 1203. The transistor T5 is turned off so that the first cascade output terminal of the third shift register unit 120_3 is disconnected from the cascade input terminal of the fourth shift register unit 120_4, and the transistor T6 is turned on so that the cascade input terminal of the third shift register unit 120_3 is connected to the cascade input terminal of the fourth shift register unit 120_4. In this way, a parallel connection of the shift register units 120_1 to 120_4 is achieved.

Figure 7B:
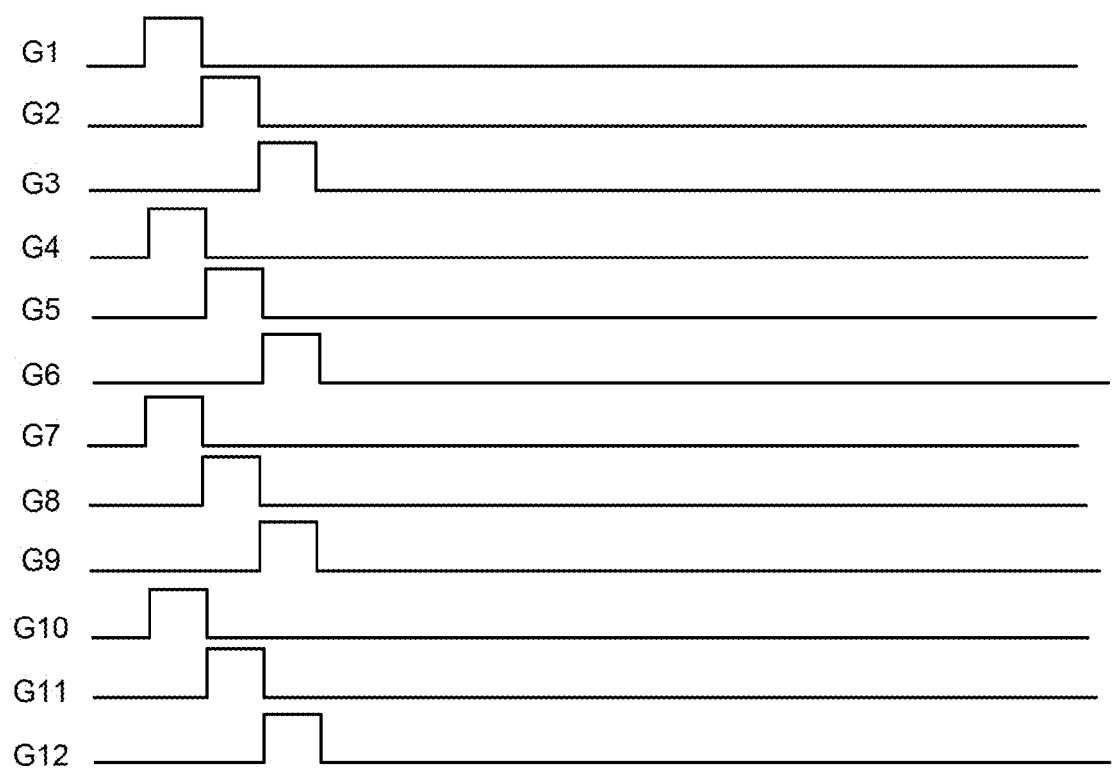
FIG. 7B shows a signal timing diagram of the gate driving circuit of FIG. 4 in the third resolution mode.

As shown in FIG. 7B, under the equivalent circuit structure shown in FIG. 7A, the shift registers GOA1, GOA4, GOA7 and GOA10 may generate output signals G1, G4, G7 and G10 in parallel in response to the input of the start signal STV. The output signals G1, G4, G7 and G10 are provided as input signals to the shift registers GOA2, GOA5, GOA8 and GOA11, respectively, so that the shift registers GOA2, GOA5, GOA8 and GOA11 generate shifted output signals G2, G5, G8 and G11 in parallel. The output signals G2, G5, G8 and G11 are provided as input signals to the shift registers GOA3, GOA6, GOA9 and GOA12, respectively, so that the shift registers GOA3, GOA6, GOA9 and GOA12 generate shifted output signals G3, G6, G9 and G12 in parallel. In this way, the shift register units 120_1 to 1204 may generate the output signals in parallel.

With reference to FIG. 1, by generating the output signal shown in FIG. 7B, the gate driving circuit may perform a group scanning of the sub-pixels in the display area. For example, each four rows of pixel units may be taken as a group, red sub-pixels in the first to fourth rows of pixel units are simultaneously scanned firstly, then green sub-pixels in the four rows of pixel units are simultaneously scanned, and finally blue sub-pixels in the four rows of pixel units are simultaneously scanned. After the first to fourth rows of pixel units are scanned, fifth to eighth rows of pixel units may be scanned in the same way. In this way, it is possible to perform a display driving in the third resolution lower than the second resolution. For example, the third resolution may be one-half of the second resolution.

Figure 8A:
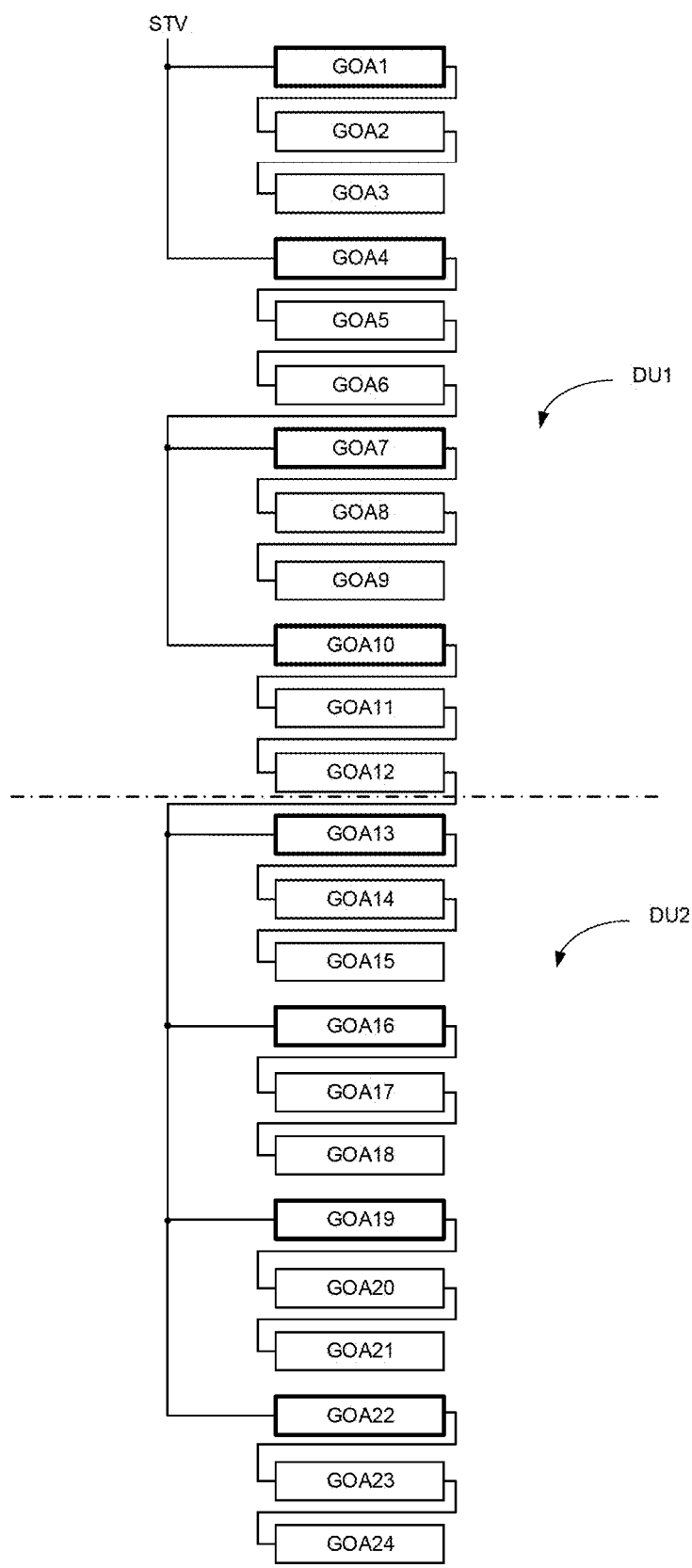
FIG. 8A shows a schematic equivalent diagram of the gate driving circuit of FIG. 4 in the second resolution mode and the third resolution mode.

FIG. 8A shows a schematic equivalent diagram of the gate driving circuit 100A of FIG. 4 in the second resolution mode and the third resolution mode. In some embodiments, the sub-pixels in the display area may be divided into a plurality of groups. For example, a plurality of rows of sub-pixels located in a central area of the display area may be divided into a first group, and a plurality of rows of sub-pixels located in both sides of the central area in a column direction may be divided into a second group and a third group, respectively. The plurality of driving units in the gate driving circuit of the embodiments of the present disclosure are divided into a plurality of groups accordingly, and each group of driving units are connected to a group of sub-pixels, so that each group of sub-pixels may be independently driven to display at different resolutions. For example, the sub-pixels in the central area may be driven to display at a high resolution, and the sub-pixels in the two side areas may be driven to display at a low resolution.

As shown in FIG. 8A, the driving unit DU1 and the driving unit DU2 are respectively divided into two groups that perform display driving in different resolution modes. In this case, for example, the mode control circuit 110_1 in the driving unit DU1 may connect the shift register units 120_1 to 120_4 in the second resolution mode under the control of the control signals SW1 to SW4, so that the equivalent circuit structure shown in FIG. 6A may be obtained. The mode control circuit 110_2 in the driving unit DU2 may connect the shift register units 120_5 to 120_8 in the third resolution mode under the control of the control signals SW1' to SW4', so that the equivalent circuit structure shown in FIG. 7A may be obtained. The driving unit DU1 and the driving unit DU2 are connected in cascade, so that an output signal G12 of the shift register GOA12 is provided as an input signal to the shift registers GOA13, GOA16, GOA19 and GOA22 of the driving unit DU2.

Figure 8B:
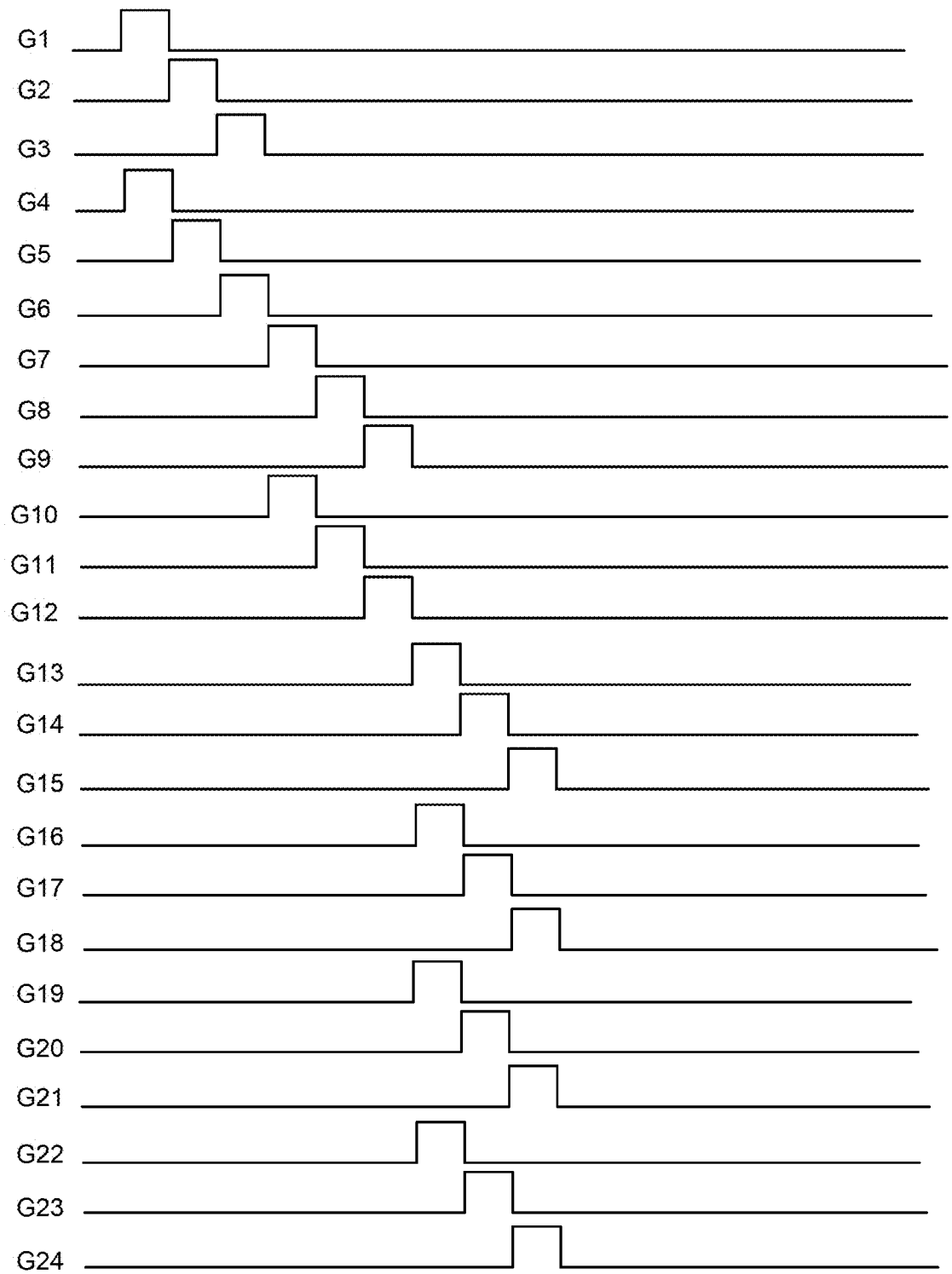
FIG. 8B shows a signal timing diagram of the gate driving circuit of FIG. 4 in the second resolution mode and the third resolution mode.

In an operating process, as shown in FIG. 8B, the shift register units 120_1 to 120_4 connected in the second resolution mode may generate output signals G1 to G12 as shown in FIG. 6B. The output signal G12 of the shift register GOA12 is provided as an input signal to the shift registers GOA13, GOA16, GOA19 and GOA22 of the driving unit DU2, so that the shift register units 120_5 to 120_8 connected in the third resolution mode may generate output signals G13 to G24 similar to those shown in FIG. 7B. In this way, the driving unit DU1 may drive a plurality of rows of sub-pixels connected to the driving unit DU1 to display at the second resolution, and the driving unit DU2 may drive a plurality of rows of sub-pixels connected to the driving unit DU2 to display at the third resolution, so as to achieve multi-resolution display in sub-regions. As shown in FIG. 8B, compared with the first resolution mode, the second resolution mode may shorten a scanning time (a time for scanning all sub-pixels by the gate driving circuit), and in this embodiment, the scanning time is reduced by half; Compared with the second resolution mode, the third resolution mode may further shorten the scanning time. In a case that a time length of one frame remains unchanged, if the scanning time is shortened, a blank period may be increased accordingly.

Figure 9:
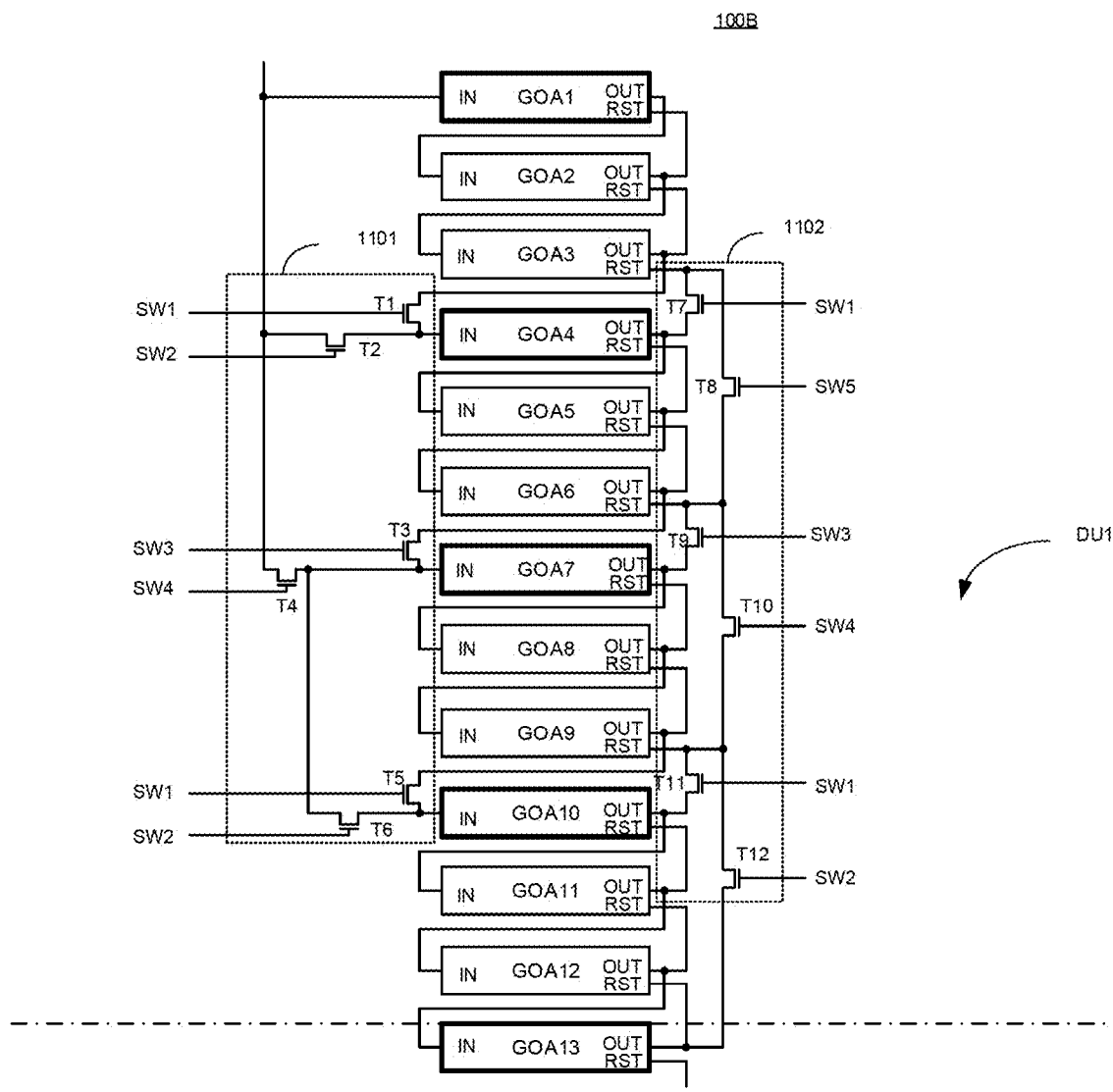
FIG. 9 shows another exemplary structural diagram of the gate driving circuit of FIG. 3.

FIG. 9 shows another exemplary structural diagram of the gate driving circuit of FIG. 3.

Agate driving circuit 100B of FIG. 9 is similar to the gate driving circuit 100A of FIG. 4, and the difference lies at least in that each shift register unit further has a reset terminal and the mode control circuit is further connected to the reset terminal of each shift register unit. For the sake of conciseness, the following will mainly describe different parts in detail.

As shown in FIG. 9, similar to FIG. 4, the driving unit DU1 includes four shift register units. The first shift register unit may include shift registers GOAT to GOA3, the second shift register unit may include shift registers GOA4 to GOA6, the third shift register unit may include shift registers GOA7 to GOA9, and the fourth shift register unit may include shift registers GOA10 to GOA12.

Different from FIG. 4, each shift register in the shift register unit of FIG. 9 further has a reset terminal RST, which may be implemented, for example, by the shift register described above with reference to FIG. 2B. In this case, in each shift register unit, the output terminal of the first shift register may serve as the second cascade output terminal of the shift register unit, and the output terminal and the reset terminal of the third shift register may serve as the first cascade output terminal and the reset terminal of the shift register unit, respectively. For example, in the shift register unit 120_1, the output terminal of the shift register GOAT may serve as the second cascade output terminal of the shift register unit 120_1, the output terminal of the shift register GOA3 may serve as the first cascade output terminal of the shift register unit 120_1, and the reset terminal RST of the shift register GOA3 may serve as the reset terminal of the shift register unit 120_1. In the shift register unit 120_2, the output terminal of the shift register GOA4 may serve as the second cascade output terminal of the shift register unit 120_2, the output terminal of the shift register GOA6 may serve as the first cascade output terminal of the shift register unit 120_2, the reset terminal RST of the shift register GOA4 may serve as the reset terminal of the shift register unit 120_2, and so on. The reset terminal of the fourth shift register unit in the driving unit DU1 (that is, the reset terminal RST of the shift register GOA12) is connected to the second cascade output terminal of the first shift register unit in the driving unit DU2 (that is, the output terminal OUT of the shift register GOA13), so as to achieve the cascade connection of the driving units DU1 and DU2.

The mode control circuit may include a first mode control sub-circuit 1101 and a second mode control sub-circuit 1102. The first mode control sub-circuit 1101 has the same structure as the mode control circuit 110_1 described above, and may include a first transistor T1 to a sixth transistor T6, which will not be repeated here. The second mode control sub-circuit 1102 may include a seventh transistor T7, an eighth transistor T8, a ninth transistor T9, a tenth transistor T10, an eleventh transistor T11, and a twelfth transistor T12. The seventh transistor T7 has a gate electrode connected to receive the first control signal SW1, a first electrode connected to the reset terminal of the first shift register unit (that is, the reset terminal RST of the shift register GOA3), and a second electrode connected to the second cascade output terminal of the second shift register unit (that is, the output terminal of the shift register GOA4). The eighth transistor T8 has a gate electrode connected to receive the fifth control signal SW5, a first electrode connected to the reset terminal of the first shift register unit (that is, the reset terminal RST of the shift register GOA3), and a second electrode connected to the reset terminal of the second shift register unit (that is, the reset terminal RST of the shift register GOA6). The ninth transistor T9 has a gate electrode connected to receive the third control signal SW3, a first electrode connected to the reset terminal of the second shift register unit (that is, the reset terminal RST of the shift register GOA6), and a second electrode connected to the second cascade output terminal of the third shift register unit (that is, the output terminal OUT of the shift register GOA7). The tenth transistor T10 has a gate electrode connected to receive the fourth control signal SW4, a first electrode connected to the reset terminal of the second shift register unit (that is, the reset terminal RST of the shift register GOA6), and a second electrode connected to the reset terminal of the third shift register unit (that is, the reset terminal of the shift register GOA9). The eleventh transistor T11 has a gate electrode connected to receive the first control signal SW1, a first electrode connected to the reset terminal of the third shift register unit (that is, the reset terminal RST of the shift register GOA9), and a second electrode connected to the second cascade output terminal of the fourth shift register unit (that is, the output terminal of the shift register GOA10). The twelfth transistor T12 has a gate electrode connected to receive the second control signal SW2, a first electrode connected to the reset terminal of the third shift register unit (that is, the reset terminal RST of the shift register GOA9), and a second electrode connected to the reset terminal of the fourth shift register unit (that is, the reset terminal RST of the shift register GOA12).

A method of driving the gate driving circuit of FIG. 9 will be described below with reference to Table 2.

TABLE 2

|     | First resolution mode | Second resolution mode | Third resolution mode |
|-----|-----------------------|------------------------|-----------------------|
| SW1 | 1                     | 0                      | 0                     |
| SW2 | 0                     | 1                      | 1                     |
| SW3 | 1                     | 1                      | 0                     |
| SW4 | 0                     | 0                      | 1                     |
| SW5 | 0                     | 1                      | 0                     |

In Table 2, 0 represents a low level, and 1 represents a high level. However, the embodiments of the present disclosure are not limited thereto. In some embodiments, 0 may represent a high level, and 1 may represent a low level.

In the first resolution mode, as shown in Table 2, the first control signal SW1 and the third control signal SW3 are at a high level, and the second control signal SW2, the fourth control signal SW4 and the fifth control signal SW5 are at a low level. The first mode control sub-circuit 1101 may connect the shift registers in cascade in the manner described above with reference to FIG. 5A. The second mode control sub-circuit 1102 may connect a reset terminal of an nth shift register unit to a second cascade output terminal of an (n+1)th shift register unit, and disconnect a reset terminal of the nth shift register unit from a reset terminal of the (n+1)th shift register unit, where 1≤n≤3. As shown in FIG. 9, the high level of the first control signal SW1 and the third control signal SW3 may turn on the transistors T7, T9 and T11, and the low level of the second control signal SW2, the fourth control signal SW4 and the fifth control signal SW5 may turn off the transistors T8, T10 and T12, so that the reset terminal RST of the shift register GOA3 is connected to the output terminal OUT of the shift register GOA4, and the reset terminal RST of the shift register GOA3 is disconnected from the reset terminal of the shift register GOA6; that the reset terminal RST of the shift register GOA6 is connected to the output terminal OUT of the shift register GOA7, and the reset terminal RST of the shift register GOA6 is disconnected from the reset terminal RST of the shift register GOA9; and that the reset terminal RST of the shift register GOA9 is connected to the output terminal OUT of the shift register GOA10, and the reset terminal RST of the shift register GOA9 is disconnected from the reset terminal RST of the shift register GOA12.

In the second resolution mode, as shown in Table 2, the second control signal SW2, the third control signal SW3 and the fifth control signal SW5 are at a high level, and the first control signal SW1 and the fourth control signal SW4 are at a low level. The first mode control sub-circuit 1101 may connect the shift registers in groups in the manner described above with reference to FIG. 6A. The second mode control sub-circuit 1102 may disconnect the reset terminal of the first shift register unit (that is, the reset terminal RST of the shift register GOA3) from the second cascade output terminal of the second shift register unit (that is, the output terminal OUT of the shift register GOA4), connect the reset terminal of the second shift register unit (that is, the reset terminal RST of the shift register GOA6) to the second cascade output terminal of the third shift register unit (that is, the output terminal OUT of the shift register GOA7), disconnect the reset terminal of the third shift register unit (that is, the reset terminal RST of the shift register GOA9) from the second cascade output terminal of the fourth shift register unit (that is, the output terminal OUT of the shift register GOA10), connect the reset terminal of the first shift register unit (that is, the reset terminal RST of the shift register GOA3) to the reset terminal of the second shift register unit (that is, the reset terminal RST of the shift register GOA6), disconnect the reset terminal of the second shift register unit (that is, the reset terminal RST of the shift register GOA6) from the reset terminal of the third shift register unit (that is, the reset terminal RST of the shift register GOA9), and connect the reset terminal of the third shift register unit (that is, the reset terminal RST of the shift register GOA9) to the reset terminal of the fourth shift register unit (that is, the reset terminal RST of the shift register GOA12).

In the third resolution mode, as shown in Table 2, the second control signal SW2 and the fourth control signal SW4 are at a high level, and the first control signal SW1, the third control signal SW3 and the fifth control signal SW5 are at a low level. The first mode control sub-circuit 1101 may connect the shift registers in parallel in the manner described above with reference to FIG. 7A. The second mode control sub-circuit 1102 may disconnect the reset terminal of the nth shift register unit from the second cascade output terminal of the (n+1)th shift register unit, and connect the reset terminal of the nth shift register unit to the reset terminal of the (n+1)th shift register unit, where 1≤n≤3. As shown in FIG. 9, the high level of the second control signal SW2 and the fourth control signal SW4 may turn on the transistors T10 and T12, and the low level of the first control signal SW1, the third control signal SW3 and the fifth control signal SW5 may turn off the transistors T7, T8, T9 and T11, so that the reset terminal RST of the shift register GOA3 is disconnected from the output terminal OUT of the shift register GOA4, the reset terminal RST of the shift register GOA3 is disconnected from the reset terminal of the shift register GOA6, the reset terminal RST of the shift register GOA6 is disconnected from the output terminal OUT of the shift register GOA7, the reset terminal RST of the shift register GOA9 is disconnected from the output terminal OUT of the shift register GOA10, the reset terminal RST of the shift register GOA3 is disconnected from the reset terminal RST of the shift register GOA6, the reset terminal RST of the shift register GOA6 is connected to the reset terminal RST of the shift register GOA9, and the reset terminal RST of the shift register GOA9 is connected to the reset terminal RST of the shift register GOA12.

Figure 10:
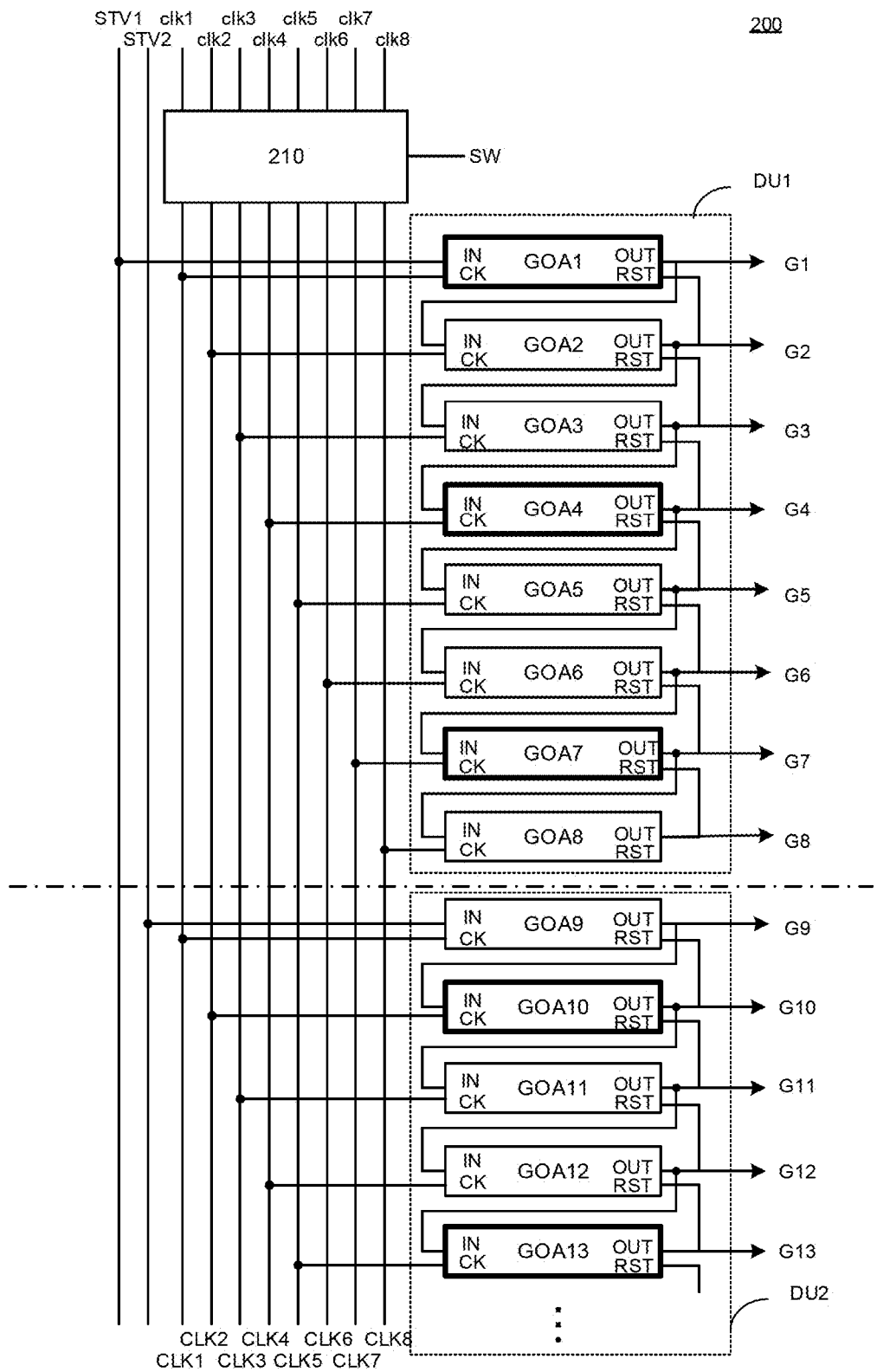
FIG. 10 shows a structural diagram of the gate driving circuit according to another embodiment of the present disclosure.

FIG. 10 shows a structural diagram of the gate driving circuit according to another embodiment of the present disclosure.

A gate driving circuit 200 may include a plurality of driving units, and each driving unit may include a plurality of shift registers connected in cascade. In FIG. 10, for the sake of conciseness, two driving units DU1 and DU2 are illustrated by way of example. As shown in FIG. 10, the driving unit DU1 includes a plurality of shift registers GOA1, GOA2, . . . GOA8 connected in cascade, and the driving unit DU2 includes a plurality of shift registers GOA9, GOA10, . . . connected in cascade. For the convenience of description, the driving unit DU1 including eight shift registers are illustrated by way of example. However, the embodiments of the present disclosure are not limited to this, and each driving unit may include other numbers of shift registers as required. Each of the shift registers GOA1, GOA2, . . . may have the shift register structure according to any of the embodiments of the present disclosure, for example, may be implemented by the shift register described above with reference to FIG. 2B.

The gate driving circuit 200 may further include a plurality of start signal lines connected to the plurality of driving units in a one-to-one correspondence, such as a start signal line STV1 connected to the driving unit DU1 and a start signal line STV2 connected to the driving unit DU2. The start signal line STV1 is connected to a first stage shift register GOAT in the driving unit DU1, and the start signal line STV2 is connected to a first stage shift register GOA9 in the driving unit DU2.

The gate driving circuit 200 may further include K clock signal lines, where K is an integer greater than one. For example, in FIG. 10, K=8, and eight clock signal lines CLK1 to CLK8 are connected to the shift registers in each of the driving units DU1 and DU2.

The gate driving circuit 200 may further include a mode control circuit 210. The mode control circuit 210 is connected to the K clock signal lines CLK1 to CLK8. The mode control circuit 210 may receive K initial clock signals clk1 to clk8 and a control signal SW, generate K clock signals based on the K initial clock signals clk1 to clk8 in one of the first resolution mode, the second resolution mode and the third resolution mode under the control of the control signal SW, and provide the K clock signals generated to the K clock signal lines CLK1 to CLK8, respectively. For example, in the first resolution mode, the mode control circuit 210 may generate sequentially shifted K first clock signals based on the K initial clock signals. In the second resolution mode, the mode control circuit 210 may generate K second clock signals based on the K initial clock signals. The K second clock signals are divided into 2M groups, a plurality of second clock signals in each group of the 2M groups are synchronized, and an (m+1)th group of second clock signals are shifted with respect to an mth group of second clock signal. In the third resolution mode, the mode control circuit 210 may generate K third clock signals based on the K initial clock signals. The K third clock signals are divided into M groups, a plurality of third clock signals in each group of the M groups are synchronized, and an (m'+1)th group of third clock signals are shifted with respect to an m'th group of third clock signals, where M is an integer greater than 1, m is an integer, m' is an integer, 1≤m≤2M−1, and 1≤m'≤M−1.

In some embodiments, in each driving unit, the output terminal of an nth stage shift register is connected to the input terminal of an (n+1)th stage shift register, and the output terminal of the (n+1)th stage shift register is connected to the reset terminal of the nth stage shift register, where n is an integer greater than or equal to 1. The plurality of shift registers in each driving unit are divided into at least one group, each group of the at least one group includes K shift registers connected in cascade, and the clock signal terminals of the K shift registers are connected to the K clock signal lines in a one-to-one correspondence.

For example, in the driving unit DU1 shown in FIG. 10, the output terminal OUT of the first stage shift register GOA1 is connected to the input terminal IN of the second stage shift register GOA2, and the output terminal OUT of the second stage shift register GOA2 is connected to the reset terminal RST of the first stage shift register GOA1; the output terminal OUT of the second stage shift register GOA2 is connected to the input terminal IN of the third shift register GOA3, and the output terminal OUT of the third stage shift register GOA3 is connected to the reset terminal RST of the second stage shift register GOA2, and so on. In the driving unit DU1 of FIG. 10, the first stage shift register GOA1 to the eighth stage shift register GOA8 are divided into a group, and respective clock signal terminals CK of the first stage shift register GOA1 to the eighth stage shift register GOA8 are connected to the clock signal lines CLK1 to CLK8 in a one-to-one correspondence. If the driving unit DU1 includes more shift registers, for example, sixteen shift registers, the first stage to eighth stage shift registers may be divided into a first group and connected to the clock signal lines CLK1 to CLK8 in a one-to-one correspondence in the above manner. The ninth to sixteenth stage shift registers may be divided into a second group and connected to the clock signal lines CLK1 to CLK8 in a one-to-one correspondence in the above manner. In the driving unit DU2 shown in FIG. 10, the first stage shift register GOA9, the second stage shift register GOA10 . . . may be connected in a manner similar to that for the shift registers GOA1 to GOA8 in the driving unit DU1, which will not be repeated here.

Figure 11:
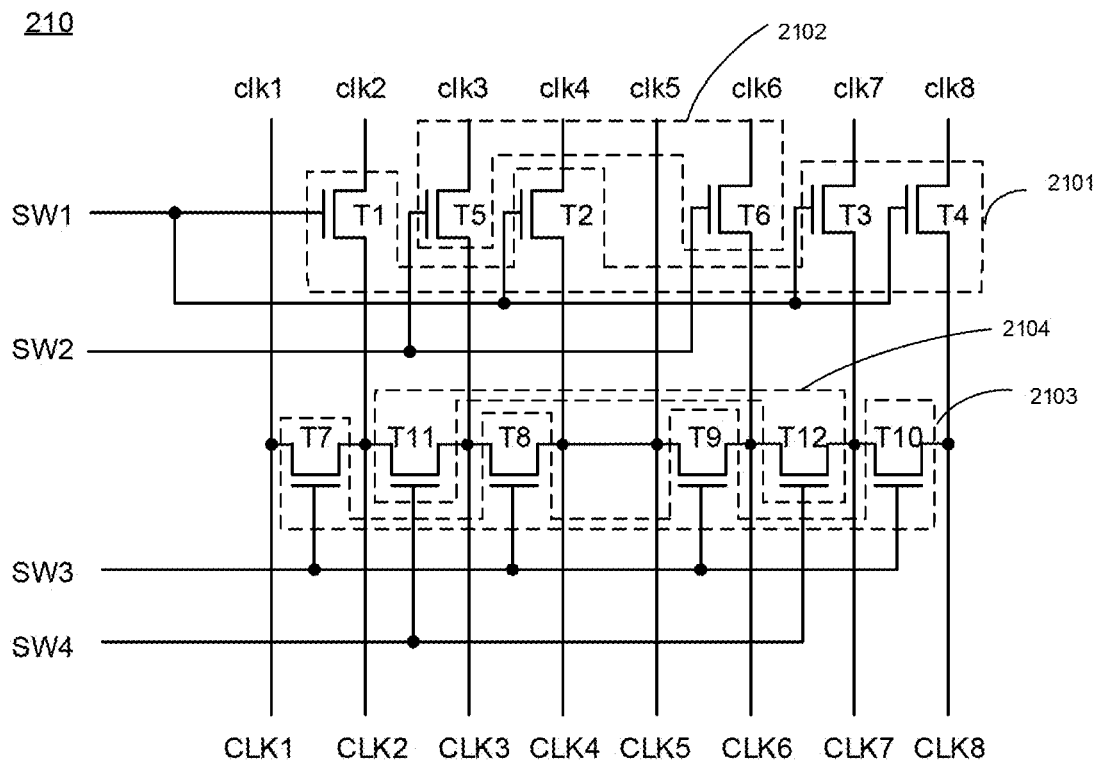
FIG. 11 shows an exemplary circuit diagram of a mode control circuit of the gate driving circuit of FIG. 10.

FIG. 11 shows an exemplary circuit diagram of a mode control circuit of the gate driving circuit of FIG. 10.

As shown in FIG. 11, a mode control circuit 210 may include a first clock input terminal to an eighth clock input terminal respectively connected to receive eight initial clock signals clk1 to clk8. The mode control circuit 210 may further include a first clock output terminal to an eighth clock output terminal connected to eight clock signal lines CLK1 to CLK8 in a one-to-one correspondence. In some embodiments, the first clock input terminal and the first clock output terminal of the mode control circuit 210 may be connected. For example, the first clock signal line CLK1 may be implemented to receive the first initial clock signal clk1. For ease of description, clk1 to clk8 are used below to respectively denote the first clock input terminal to the eighth clock input terminal, and CLK1 to CLK8 are used below to respectively denote the first clock output terminal to the eighth clock output terminal.

The mode control circuit 210 may further include a first mode control sub-circuit 2101, a second mode control sub-circuit 2102, a third mode control sub-circuit 2103, and a second mode control sub-circuit 2104.

The first mode control sub-circuit 2101 may, under the control of the first control signal SW1, connect the second clock input terminal clk2 to the second clock output terminal CLK8, connect the fourth clock input terminal clk4 to the fourth clock output terminal CLK4, connect the seventh clock input terminal clk7 to the seventh clock output terminal CLK7, and connect the eighth clock input terminal clk8 to the eighth clock output terminal CLK8. For example, as shown in FIG. 11, the first mode control sub-circuit 2101 may include a first transistor T1, a second transistor T2, a third transistor T3, and a fourth transistor T4. A gate electrode of the first transistor T1, a gate electrode of the second transistor T2, a gate electrode of the third transistor T3 and a gate electrode of the fourth transistor T4 are all connected to receive the first control signal SW1. The first transistor T1 has a first electrode connected to the second clock input terminal clk2, and a second electrode connected to the second clock output terminal CLK2. The second transistor T2 has a first electrode connected to the fourth clock input terminal clk4, and a second electrode connected to the fourth clock output terminal CLK4. The third transistor T3 has a first electrode connected to the seventh clock input terminal clk7, and a second electrode connected to the seventh clock output terminal CLK7. The fourth transistor T4 has a first electrode connected to the eighth clock input terminal clk8, and a second electrode connected to the fourth clock output terminal CLK8.

The second mode control sub-circuit 2102 may, under the control of the second control signal SW2, connect the third clock input terminal clk3 to the third clock output terminal CLK3, and connect the sixth clock input terminal clk6 to the sixth clock output terminal CLK6. For example, in FIG. 11, the second mode control sub-circuit 2102 includes a fifth transistor T5 and a sixth transistor T6. A gate electrode of the fifth transistor T5 and a gate electrode of the sixth transistor T6 are both connected to receive the second control signal SW2. The fifth transistor T5 has a first electrode connected to the third clock input terminal clk3, and a second electrode connected to the third clock output terminal CLK3. The sixth transistor T6 has a first electrode connected to the sixth clock input terminal clk6, and a second electrode connected to the sixth clock output terminal CLK6.

The third mode control sub-circuit 2103 may, under the control of the third control signal SW3, connect the first clock output terminal CLK1 to the second clock output terminal CLK2, connect the third clock output terminal CLK3 to the fourth clock output terminal CLK4, connect the fifth clock output terminal CLK5 to the sixth clock output terminal CLK6, and connect the seventh clock output terminal CLK7 to the eighth clock output terminal CLK8. For example, as shown in FIG. 11, the third mode control sub-circuit 2103 may include a seventh transistor T7, an eighth transistor T8, a ninth transistor T9, and a tenth transistor T10. A gate electrode of the seventh transistor T7, a gate electrode of the eighth transistor T8, a gate electrode of the ninth transistor T9 and a gate electrode of the tenth transistor T10 are all connected to receive the third control signal SW3. The seventh transistor T7 has a first electrode connected to the first clock output terminal CLK1, and a second electrode connected to the second clock output terminal CLK2. The eighth transistor T8 has a first electrode connected to the third clock output terminal CLK3, and a second electrode connected to the fourth clock output terminal CLK4. The ninth transistor T9 has a first electrode connected to the fifth clock output terminal CLK5, and a second electrode connected to the sixth clock output terminal CLK6. The tenth transistor T10 has a first electrode connected to the seventh clock output terminal CLK7, and a second electrode connected to the eighth clock output terminal CLK8.

The fourth mode control sub-circuit 2104 may, under the control of the fourth control signal SW4, connect the second clock output terminal CLK2 to the third clock output terminal CLK3, and connect the sixth clock output terminal CLK6 to the seventh clock output terminal CLK7. For example, as shown in FIG. 11, the fourth mode control sub-circuit 2104 includes an eleventh transistor T11 and a twelfth transistor T12. A gate electrode of the eleventh transistor T11 and a gate electrode of the twelfth transistor T12 are both connected to receive the fourth control signal SW4. The eleventh transistor T11 has a first electrode connected to the second clock output terminal CLK2, and a second electrode connected to the third clock output terminal CLK3. The twelfth transistor T12 has a first electrode connected to the sixth clock output terminal CLK6, and a second electrode connected to the seventh clock output terminal CLK7.

During operation, the mode control circuit 210 may generate K clock signals based on the K initial clock signals clk1 to clk 8 in one of a plurality of resolution modes under the control of the control signal, and provide the K clock signals generated to the K clock signal lines CLK1 to CLK8, respectively. The start signal is applied to at least one start signal line (for example, STV1) of the plurality of start signal lines STV1 and STV2, so as to start the driving unit connected to the at least one start signal line. For example, when the start signal on the start signal line STV1 starts the driving unit DU1, the plurality of shift registers GOA1 to GOA8 in the driving unit DU1 started may respectively generate output signals G1 to G8 according to the clock signals on the clock signal lines CLK1 to CLK8. When the start signal on the start signal line STV2 starts the driving unit DU2, the plurality of shift registers GOA9, GOA10, . . . in the driving unit DU1 started may respectively generate output signals G9, G10, . . . according to the clock signals on the clock signal lines CLK1 to CLK8.

A method of driving the gate driving circuit 200 will be described in detail below in conjunction with FIG. 10 and FIG. 11, with reference to Table 3 and FIG. 12 to FIG. 17. For the sake of conciseness, a driving unit DU1 in FIG. 10 is illustrated by way of example. An operating principle of the driving unit DU2 is similar to that of the driving unit DU1, and will not be repeated here.

TABLE 3

|  | First resolution mode | Second resolution mode | Third resolution mode |
| --- | --- | --- | --- |
| SW1 | 1 | 0 | 0 |
| SW2 | 1 | 1 | 0 |
| SW3 | 0 | 1 | 1 |
| SW4 | 0 | 0 | 1 |

In Table 3, 0 represents a low level, and 1 represents a high level. However, the embodiments of the present disclosure are not limited thereto. In some embodiments, 0 may represent a high level, and 1 may represent a low level.

Figure 12:
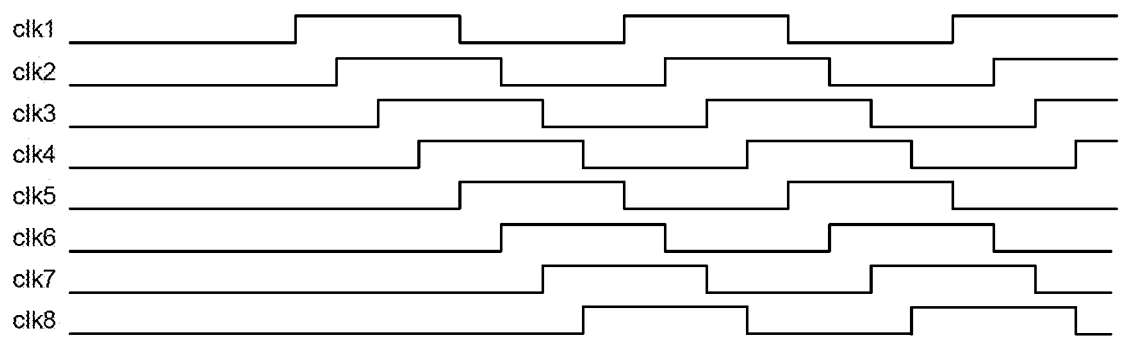
FIG. 12 shows a timing diagram of an initial clock signal received by the gate driving circuit of FIG. 10.

FIG. 12 shows a timing diagram of an initial clock signal received by the gate driving circuit of FIG. 10. As shown in FIG. 12, the initial clock signals clk1 to clk8 are sequentially shifted clock signals. A (k+1)th initial clock signal is shifted by a unit scanning time H with respect to a kth initial clock signal, and each of the initial clock signals clk1 to clk8 has an active level duration of 4H. Here, the unit scanning time may be a time for scanning a row of sub-pixels.

In the first resolution mode, as shown in Table 3, the first control signal SW1 and the second control signal SW2 are at a high level, and the third control signal SW3 and the fourth control signal SW4 are at a low level. The first transistor T1, the second transistor T2, the third transistor T3, the fourth transistor T4, the fifth transistor T5 and the sixth transistor T6 in FIG. 11 are turned on, and the seventh transistor T7, the eighth transistor T8, the ninth transistor T9, the tenth transistor T10, the eleventh transistor T11 and the twelfth transistor T12 are turned off. The first mode control sub-circuit 2101 may connect the second clock input terminal clk2 to the second clock output terminal CLK8, connect the fourth clock input terminal clk4 to the fourth clock output terminal CLK4, connect the seventh clock input terminal clk7 to the seventh clock output terminal CLK7, and connect the eighth clock input terminal clk8 to the eighth clock output terminal CLK8. The second mode control sub-circuit 2102 may connect the third clock input terminal clk3 to the third clock output terminal CLK3, and connect the sixth clock input terminal clk6 to the sixth clock output terminal CLK6.

Figure 13:
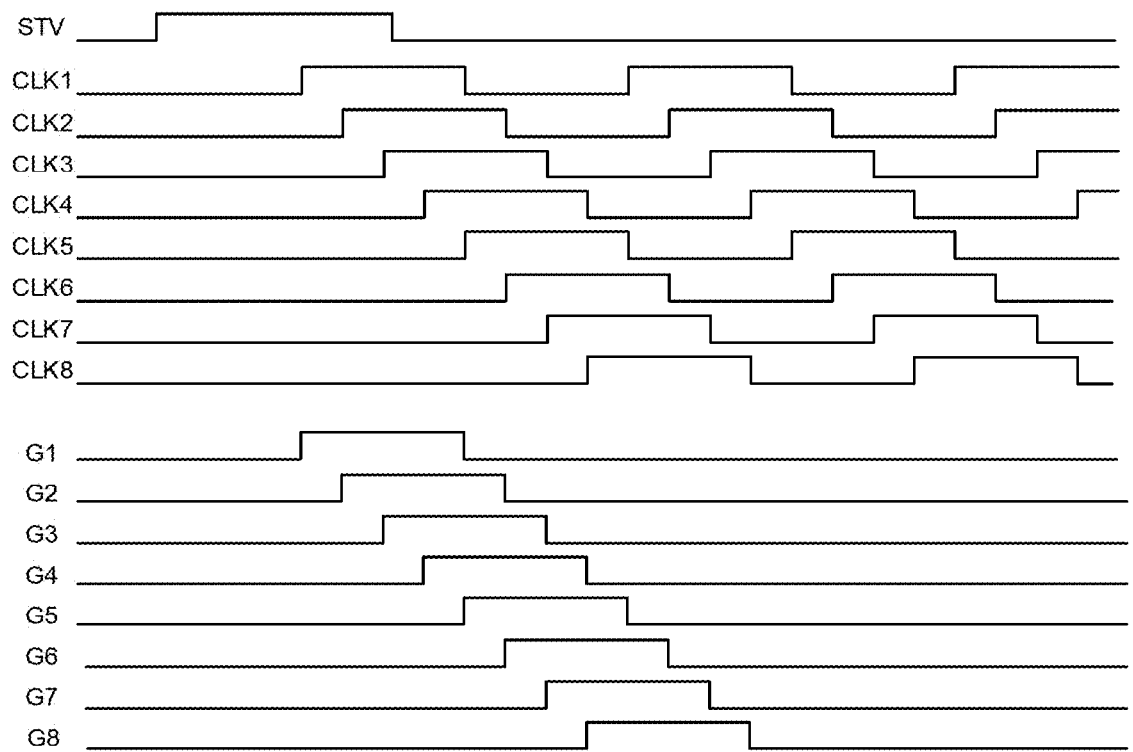
FIG. 13 shows a signal timing diagram of the gate driving circuit of FIG. 10 in the first resolution mode.

In this way, as shown in FIG. 13, the mode control circuit may generate eight sequentially shifted first clock signals based on the initial clock signals clk1 to clk8, and provide the eight sequentially shifted first clock signals to the clock signal lines CLK1 to CLK8, respectively. The shift registers GOAT to GOA8 in FIG. 10 may generate sequentially shifted output signals G1 to G8 based on the clock signals on the clock signal lines CLK1 to CLK8, as shown in FIG. 13.

In the second resolution mode, as shown in Table 3, the first control signal SW1 and the fourth control signal SW4 are at a low level, the second control signal SW2 and the third control signal SW3 are at a low level, so that the first transistor T1, the second transistor T2, the third transistor T3, the fourth transistor T4, the eleventh transistor T11 and the twelfth transistor T12 in FIG. 11 are turned off, and the fifth transistor T5, the sixth transistor T6, the seventh transistor T7, the eighth transistor T8, the ninth transistor T9 and the tenth transistor T10 are turned on. The second mode control sub-circuit 2102 may connect the third clock input terminal clk3 to the third clock output terminal CLK3, and connect the sixth clock input terminal clk6 to the sixth clock output terminal CLK6. The third mode control sub-circuit 2103 may connect the first clock output terminal CLK1 to the second clock output terminal CLK2, connect the third clock output terminal CLK3 to the fourth clock output terminal CLK4, connect the fifth clock output terminal CLK5 to the sixth clock output terminal CLK6, and connect the seventh clock output terminal CLK7 to the eighth clock output terminal CLK8.

Figure 14:
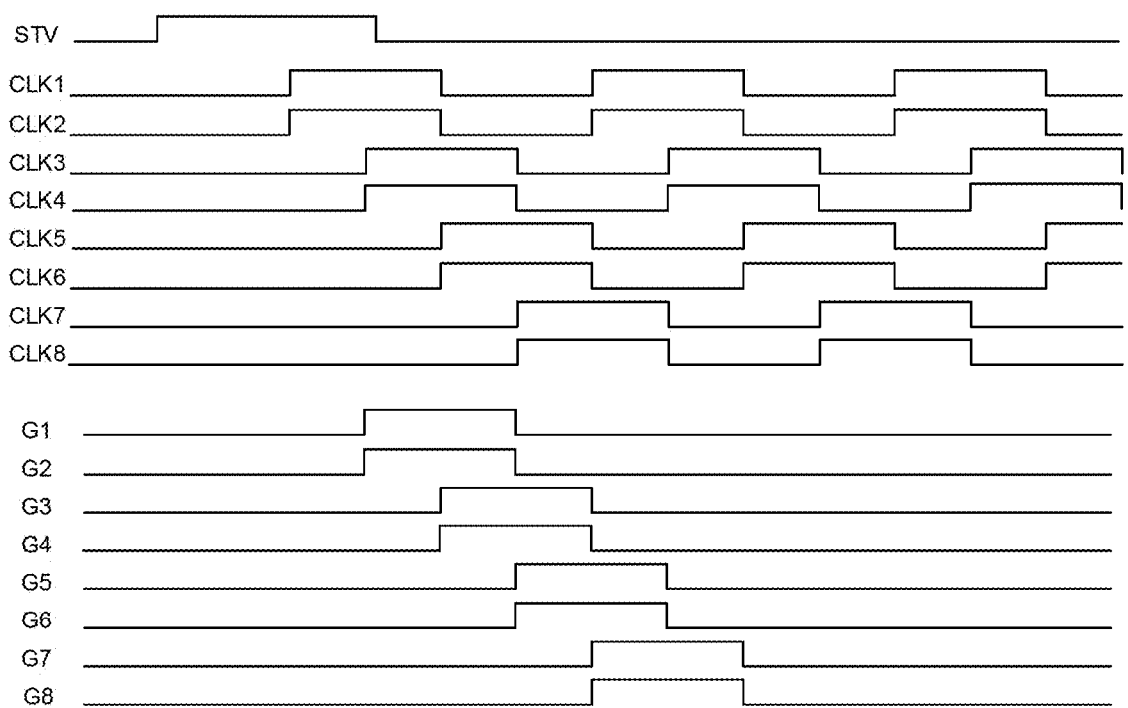
FIG. 14 shows a signal timing diagram of the gate driving circuit of FIG. 10 in the second resolution mode.

In this way, the mode control circuit may generate eight second clock signals based on the initial clock signals clk1 to clk8, and provide the eight second clock signals to the clock signal lines CLK1 to CLK8, respectively. As shown in FIG. 14, the second clock signals on the clock signal lines CLK1 to CLK8 are divided into 2M groups. For example, when M=2, the second clock signals are divided into 4 groups. A first group includes the clock signal lines CLK1 and CLK2, a second group includes the clock signal lines CLK3 and CLK4, a third group includes the clock signal lines CLK5 and CLK6, and the fourth group includes the clock signal lines CLK7 and CLK8. The second clock signal on the clock signal line CLK1 is synchronized with the second clock signal on CLK2, the second clock signal on the clock signal line CLK3 is synchronized with the second clock signal on CLK4, and so on. The second clock signals on the second group of clock signal lines CLK3 and CLK4 are shifted with respect to the second clock signals on the first group of clock signal lines CLK1 and CLK2, the second clock signals on the third group of clock signal lines CLK5 and CLK6 are shifted with respect to the second clock signals on the second group of clock signal lines CLK3 and CLK4, and the second clock signals on the fourth group of clock signal lines CLK7 and CLK8 are shifted with respect to the second clock signals on the third group of clock signal lines CLK5 and CLK6. The shift registers GOA1 to GOA8 in FIG. 10 may generate output signals G1 to G8 based on the clock signals on the clock signal lines CLK1 to CLK8. As shown in FIG. 14, the output signals G1 and G2 are synchronized, the output signals G3 and G4 are synchronized, any one of the output signals G3 and G4 is shifted with respect to any one of the output signals G1 and G2, and so on.

In the third resolution mode, as shown in Table 3, the first control signal SW1 and the second control signal SW2 are at a low level, the third control signal SW3 and the fourth control signal SW4 are at a high level, so that the first transistor T1, the second transistor T2, the third transistor T3, the fourth transistor T4, the fifth transistor T5 and the sixth transistor T6 in FIG. 11 are turned off, and the seventh transistor T7, the eighth transistor T8, the ninth transistor T9, the tenth transistor T10, the eleventh transistor T11 and the twelfth transistor T12 are turned on. The third mode control sub-circuit 2103 may connect the first clock output terminal CLK1 to the second clock output terminal CLK2, connect the third clock output terminal CLK3 to the fourth clock output terminal CLK4, connect the fifth clock output terminal CLK5 to the sixth clock output terminal CLK6, and connect the seventh clock output terminal CLK7 to the eighth clock output terminal CLK8. The fourth mode control sub-circuit 2104 may connect the second clock output terminal CLK2 to the third clock output terminal CLK3, and connect the sixth clock output terminal CLK6 to the seventh clock output terminal CLK7.

Figure 15:
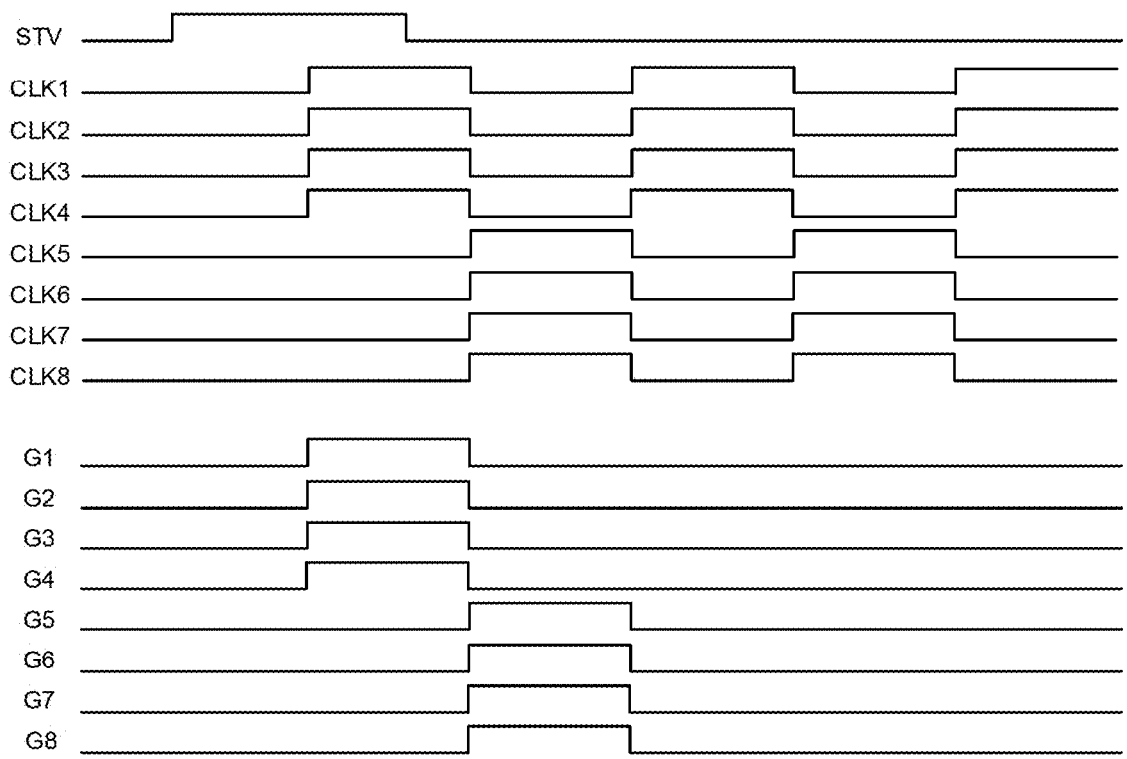
FIG. 15 shows a signal timing diagram of the gate driving circuit of FIG. 10 in the third resolution mode.

In this way, the mode control circuit may generate eight third clock signals based on the initial clock signals clk1 to clk8, and provide the eight third clock signals to the clock signal lines CLK1 to CLK8. The eight third clock signals are divided into M groups, and a plurality of third clock signals in each group of the M groups are synchronized. For example, as shown in FIG. 15, when M=2, the first group includes clock signal lines CLK1 to CLK4, and the second group includes clock signal lines CLK5 to CLK8. The third clock signals on the first group of clock signal lines CLK1 to CLK4 are synchronized with each other, and the third clock signals on the second group of clock signal lines CLK5 to CLK8 are synchronized with each other. The third clock signals on the second group of clock signal lines CLK5 to CLK8 are shifted with respect to the third clock signals on the first group of clock signal lines CLK1 to CLK4. The shift registers GOA1 to GOA8 in FIG. 10 may generate output signals G1 to G8 based on the clock signals on the clock signal lines CLK1 to CLK8. As shown in FIG. 15, the output signals G1 to G4 are synchronized with each other, the output signals G5 to G8 are synchronized with each other, any one of the output signals G1 to G4 is shifted with respect to any one of the output signals G5 to G8, and so on.

Figure 16:
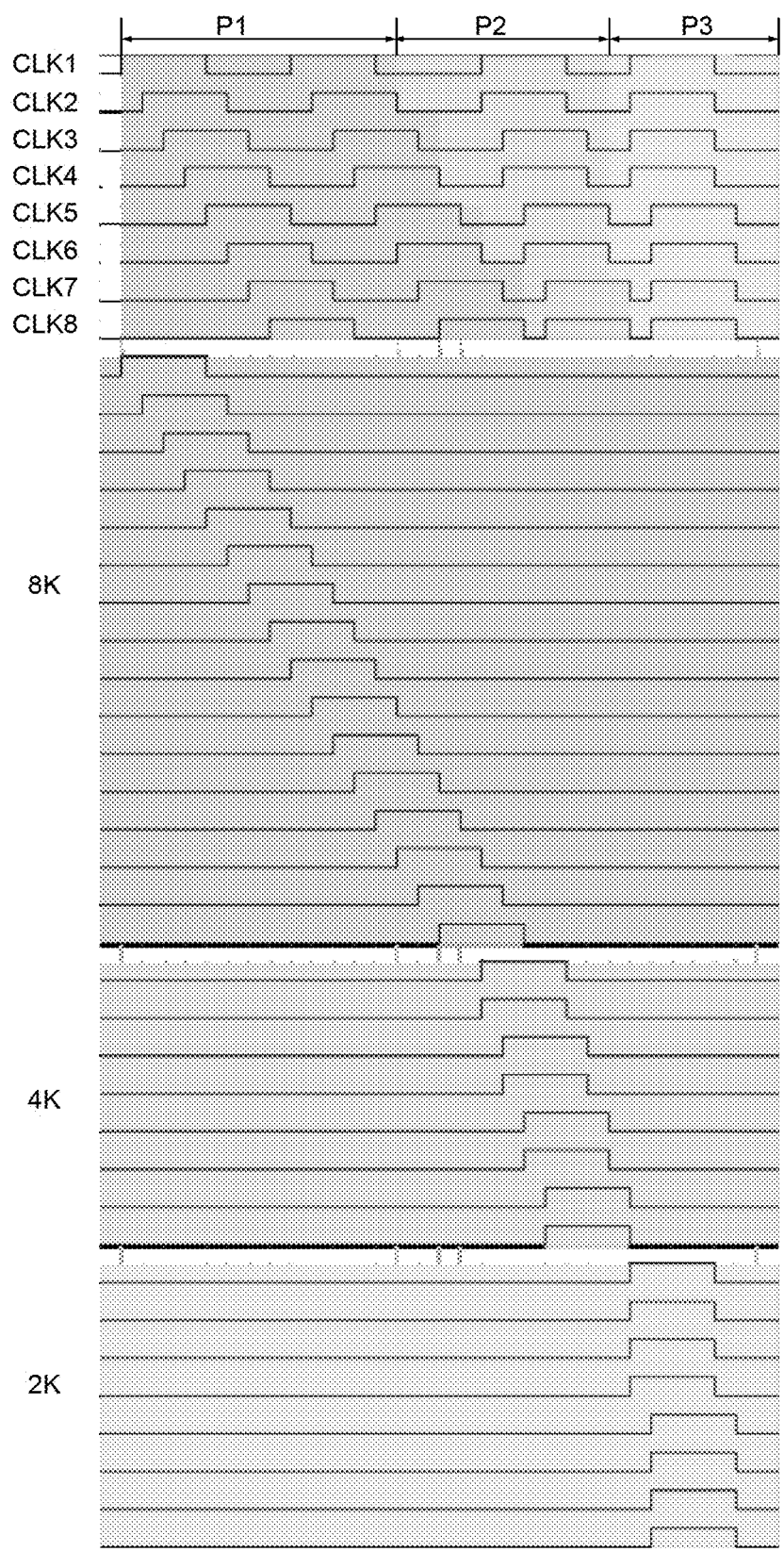
FIG. 16 shows an example of the signal timing diagram of the gate driving circuit of FIG. 10 in the first resolution mode, the second resolution mode and the third resolution mode.

FIG. 16 shows an example of the signal timing diagram of the gate driving circuit of FIG. 10 in the first resolution mode, the second resolution mode and the third resolution mode. In the embodiment, as an example, the first resolution mode is an 8K resolution display mode, the second resolution mode is a 4K resolution display mode, and the third resolution mode is a 2K resolution display mode. However, the embodiments of the present disclosure are not limited to this, and the first resolution mode, the second resolution mode and the third resolution mode may be set to display modes at other resolutions as required.

As shown in FIG. 16, in a first period P1, the mode control circuit may generate eight sequentially shifted clock signals as shown in FIG. 13 in the first resolution mode, and provide the eight sequentially shifted clock signals to the clock signal lines CLK1 to CLK8, respectively. The shift registers GOA1, GOA2, . . . may generate the same sequentially shifted output signals. In a second period P2, the mode control circuit may generate eight sequentially shifted clock signals divided into four groups as shown in FIG. 14 in the second resolution mode, and provide the eight sequentially shifted clock signals to the clock signal lines CLK1 to CLK8, respectively. The shift registers GOA1, GOA2, . . . may generate the same sequentially shifted output signals divided into four groups. In a third period P3, the mode control circuit may generate eight sequentially shifted clock signals divided into two groups as shown in FIG. 15 in the third resolution mode, and provide the eight sequentially shifted clock signals to the clock signal lines CLK1 to CLK8, respectively. The shift registers GOA1, GOA2, . . . may generate the same sequentially shifted output signals divided into two groups.

Figure 17:
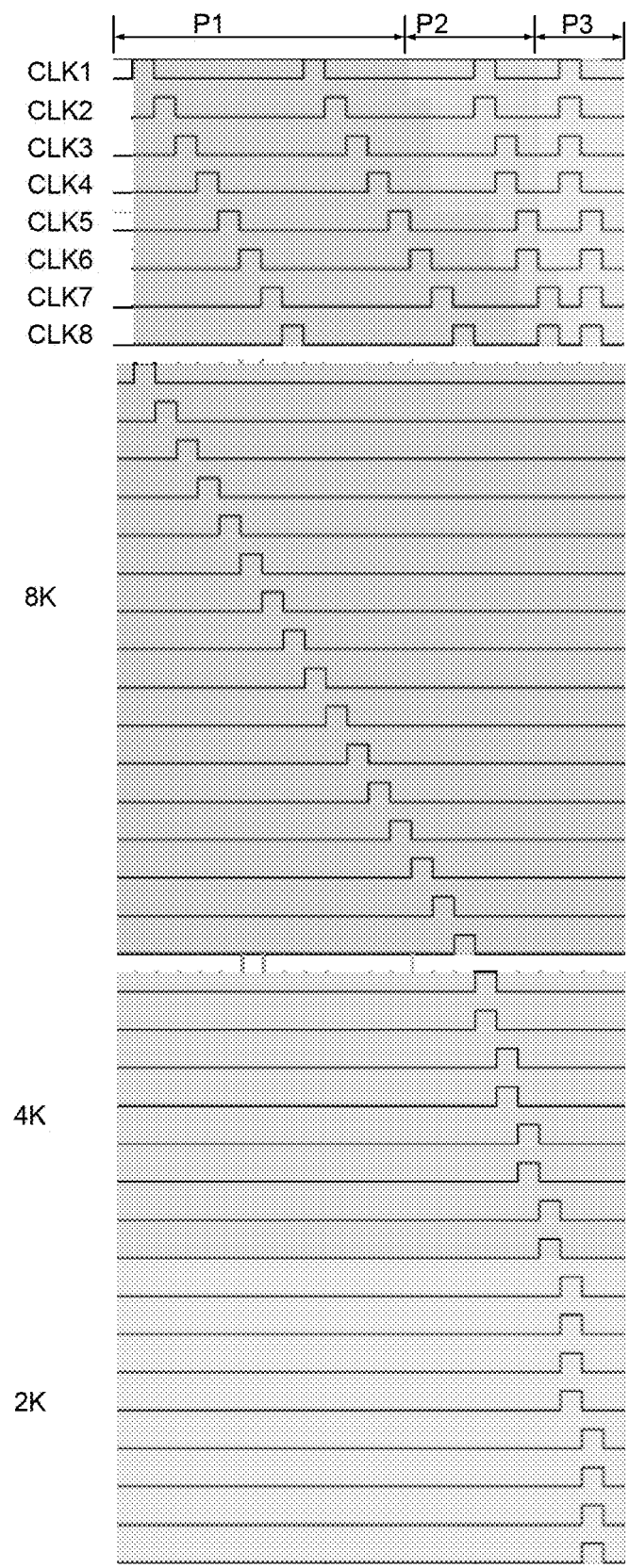
FIG. 17 shows another example of the signal timing diagram of the gate driving circuit of FIG. 10 in the first resolution mode, the second resolution mode and the third resolution mode.

FIG. 17 shows another example of the signal timing diagram of the gate driving circuit of FIG. 10 in the first resolution mode, the second resolution mode and the third resolution mode. The embodiment of FIG. 17 is similar to that of FIG. 16, except that the initial clock signals clk1 to clk8 are periodic signals with a duty ratio of 12.5%. The (k+1)th initial clock signal is shifted by the unit scanning time H with respect to the kth initial clock signal, and each initial signal has an active level duration equal to the unit scanning time H. Therefore, the clock signals CLK1 to CLK8 generated based on the initial clock signals clk1 to clk8 are also periodic signals with a duty ratio of 12.5%. The (k+1)th clock signal is shifted by the unit scanning time H with respect to the kth clock signal, and each clock signal has an active level duration equal to the unit scanning time H. Accordingly, an active level duration of the output signal generated is H.

In the method described above with reference to FIG. 12 to FIG. 16, the active level duration of the output signal generated by each stage of shift register is 4H, and the shift between the output signals is H, so that the sub-pixels connected to the shift register may be pre-charged for a period of time, and then data signals are written to the row of sub-pixels. In contrast, the active level duration of the output signal generated by the method of FIG. 17 and the shift between the output signals are both H, so that a pre-charging process is eliminated.

Figure 18:
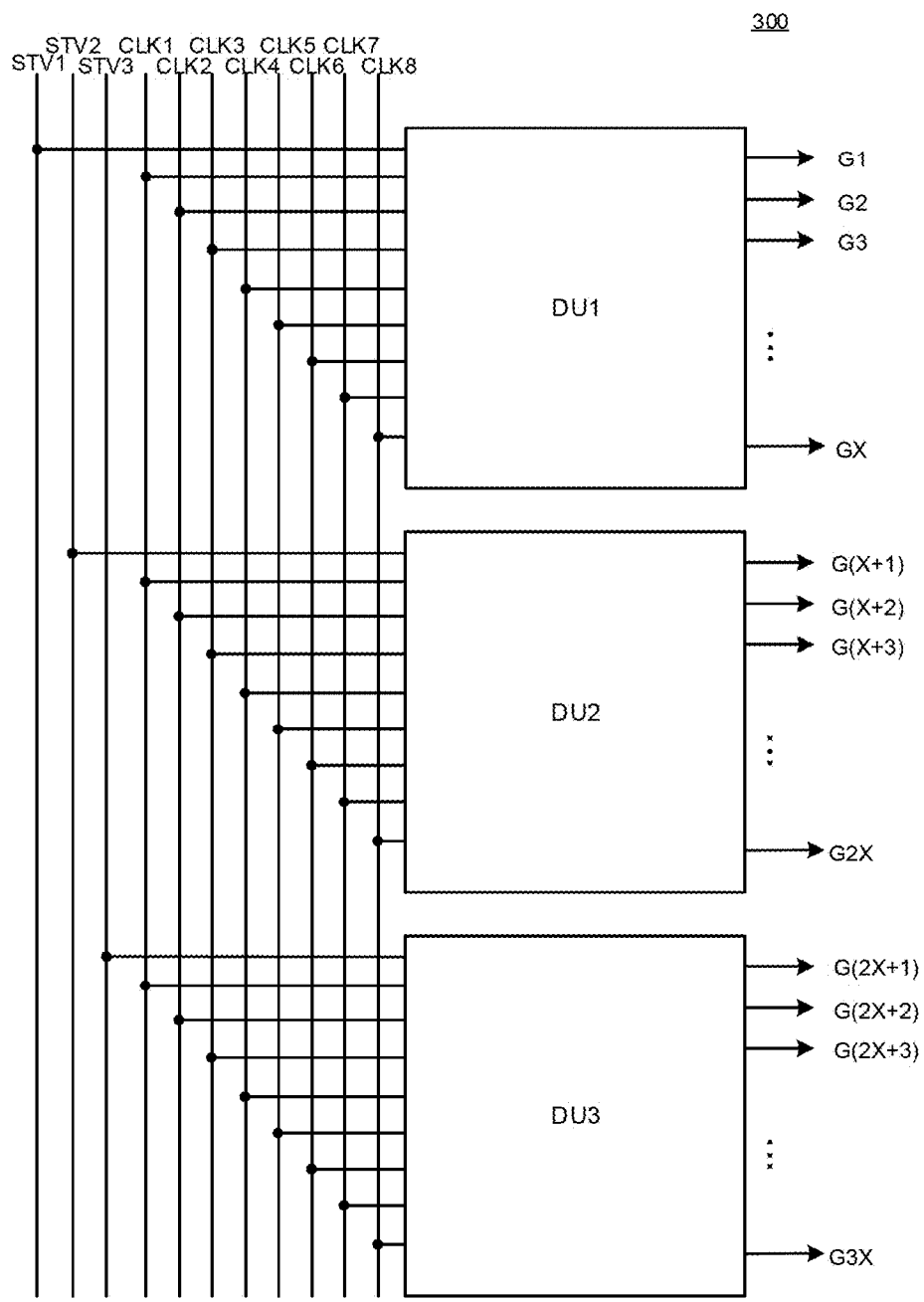
FIG. 18 shows a block diagram of the gate driving circuit according to yet another embodiment of the present disclosure.
Figure 19:
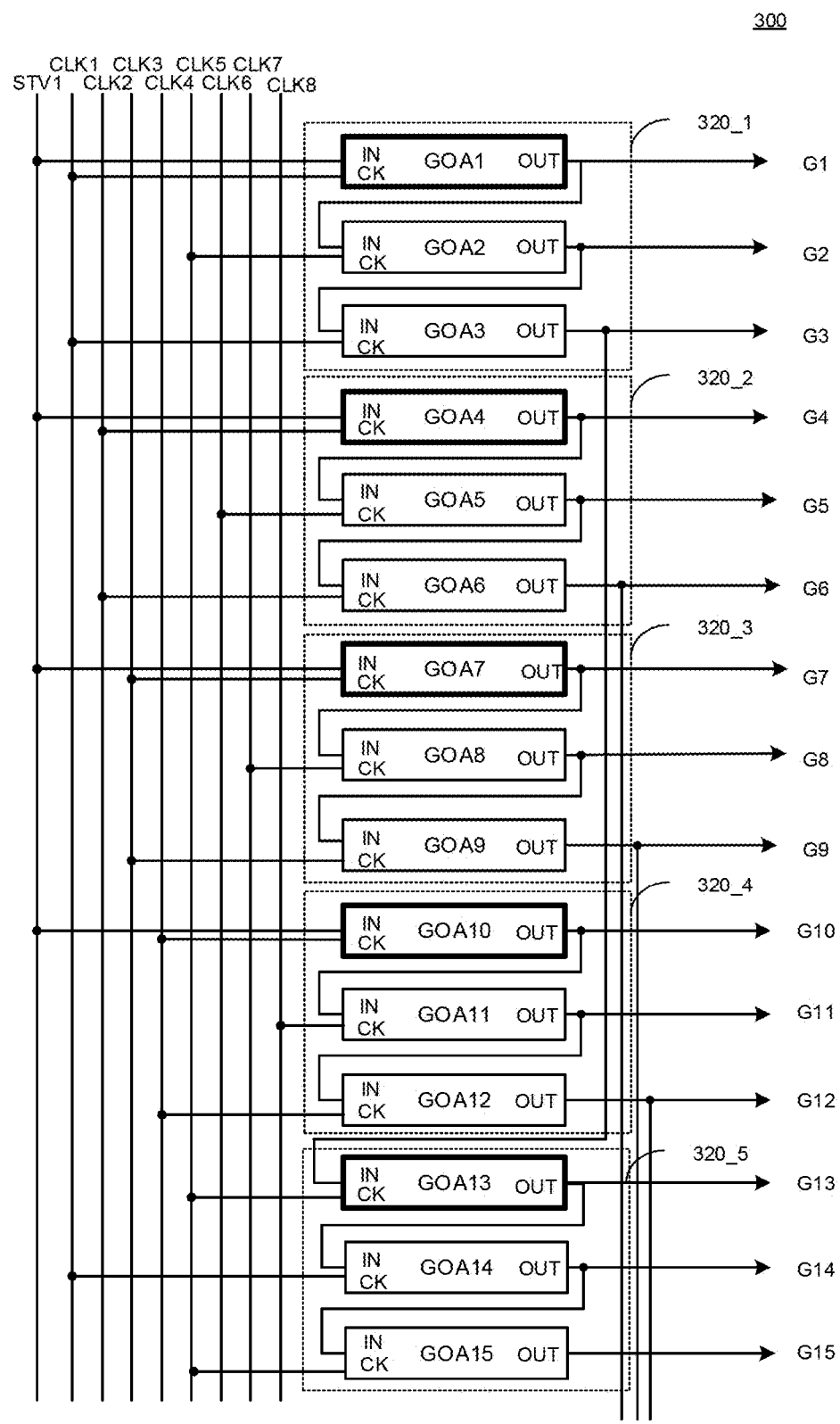
FIG. 19 shows an exemplary structural diagram of the gate driving circuit of FIG. 18.

FIG. 18 shows a block diagram of the gate driving circuit according to yet another embodiment of the present disclosure. FIG. 19 shows an exemplary structural diagram of the gate driving circuit of FIG. 18. In some embodiments, as described above, the sub-pixels in the display area may be divided into a plurality of groups. For example, the sub-pixels located in the central area may be divided into a first group, and the sub-pixels located in both side areas may be divided into a second group and a third group, respectively.

As shown in FIG. 18 and FIG. 19, a gate driving circuit 300 may include a plurality of driving units, such as driving units DU1, DU2 and DU3. The driving unit DU2 may be connected to the first group of sub-pixels, the driving unit DU1 may be connected to the second group of sub-pixels, and the driving unit DU3 may be connected to the third group of sub-pixels.

Each of the driving units DU1, DU2 and DU3 may include a plurality of shift register units connected in cascade. For example, the driving unit DU1 includes shift register units 320_1, 320_2, . . . 320_Y connected in cascade. Each shift register unit may include a first shift register, a second shift register, and a third shift register. For example, the shift register unit 320_1 may include shift registers GOA1, GOA2 and GOA3 respectively as the first shift register, the second shift register and the third shift register, the shift register unit 320_2 may include shift registers GOA4, GOA5 and GOA6 respectively as the first shift register, the second shift register and the third shift register, and so on. The shift register described above may have the shift register structure according to any of the embodiments of the present disclosure, for example, may be implemented by the shift register described above with reference to FIG. 2A or FIG. 2B. In the shift register unit 320_1, the input terminal IN of the first shift register GOA1 serves as the cascade input terminal of the shift register unit 320_1, the output terminal OUT of the first shift register GOA1 is connected to the input terminal IN of the second shift register GOA2, the output terminal OUT of the second shift register GOA2 is connected to the input terminal IN of the third shift register GOA3, and the output terminal OUT of the third shift register GOA3 serves as the cascade output terminal of the shift register unit 320_1. The clock signal terminal CK of the first shift register GOA1, the clock signal terminal CK of the second shift register GOA2 and the clock signal terminal CK of the third shift register GOA3 serve as the clock signal terminal of the shift register unit 320_1. The other shift register units 320_2, 320_3, . . . have similar structures, and will not be repeated here.

In the shift register units 320_1, 320_2, . . . 320_Y, a cascade output terminal of an nth stage shift register unit is connected to a cascade input terminal of an (n+d)th stage shift register unit, where K=2d. For example, in a case of K=8, d=4, and the cascade output terminal of the first stage shift register unit 320_1 (that is, the output terminal OUT of the shift register GOA3) is connected to the cascade input terminal of the fifth stage shift register unit 320_5 (that is, the input terminal IN of the shift register GOA13); the cascade output terminal of the second stage shift register unit 320_2 (that is, the output terminal OUT of the shift register GOA6) is connected to the cascade input terminal of the sixth stage shift register unit 320_6 (that is, the input terminal IN of the shift register GOA16), and so on.

The gate driving circuit 300 may further include a plurality of start signal lines STV1, STV2 and STV3 that are connected to the driving units DU1, DU2 and DU3 in a one-to-one correspondence. Each start signal line is connected to the cascade input terminal of a first d stage of shift register unit in a corresponding driving unit. For example, the start signal line STV1 is connected to the cascade input terminals of the first four stages of shift register units 3201, 320_2, 320_3 and 320_4 in the driving unit DUT (that is, the input terminals IN of GOA1, GOA4, GOA7 and GOA10).

The gate driving circuit 300 may further include K clock signal lines, such as clock signal lines CLK1 to CLK8. The clock signal lines CLK1 to CLK8 may be connected to clock signal terminals of the plurality of shift register units in each of the driving units DU1, DU2 and DU3. For example, the shift register units in each driving unit may be divided into at least one group. Each group may include K shift register units connected in cascade. The clock signal terminal of the first shift register and the clock signal terminal of the third shift register of the kth shift register unit are connected to the kth clock signal line, where k is an integer, and 1≤k≤K;

For example, as shown in in FIG. 19, every eight shift register units are divided into one group, and the first group includes shift register units 320_1 to 320_8 connected in cascade. The clock signal terminal CK of the first shift register GOA1 and the clock signal terminal CK of third shift register GOA3 in the first shift register unit 320_1 are connected to the first clock signal line CLK1, the clock signal terminal CK of the first shift register GOA4 and the clock signal terminal CK of third shift register GOA6 in the second shift register unit 320_2 are connected to the second clock signal line CLK2, the clock signal terminal CK of the first shift register GOA7 and the clock signal terminal CK of third shift register GOA9 in the third shift register unit 320_3 are connected to the third clock signal line CLK3, and so on.

The clock signal terminal of the second shift register of the kth shift register unit is connected to a (k+d)th clock signal line in response to k≤K/2, and connected to a (k−d)th clock signal line in response to K/2<k≤K. For example, the clock signal terminal CK of the second shift register GOA2 of the first shift register unit 320_1 is connected to the fifth clock signal line CLK5, the clock signal terminal CK of the second shift register GOA5 of the second shift register unit 320_2 is connected to the sixth clock signal line CLK6, the clock signal terminal CK of the second shift register GOA8 of the third shift register unit 320_3 is connected to the seventh clock signal line CLK7, the clock signal terminal CK of the second shift register GOA11 of the fourth shift register unit 320_4 is connected to the eighth clock signal line CLK8, the clock signal terminal CK of the second shift register GOA14 of the fifth shift register unit 320_5 is connected to the first clock signal line CLK1, and so on.

During operation, the K clock signals may be applied respectively to the K clock signal lines and the start signal may be applied to at least one start signal line of the plurality of start signal lines in one of the plurality of resolution modes. The start signal applied may start the driving unit connected to the at least one start signal line, and the plurality of shift registers in the driving unit started may generate output signals based on clock signals on the K clocks signal lines.

A method of driving the gate driving circuit 300 will be described below with reference to FIG. 20 to FIG. 23. For the sake of conciseness, the driving unit DU1 connected to the start signal line STV1 will be illustrated by way of example.

Figure 20:
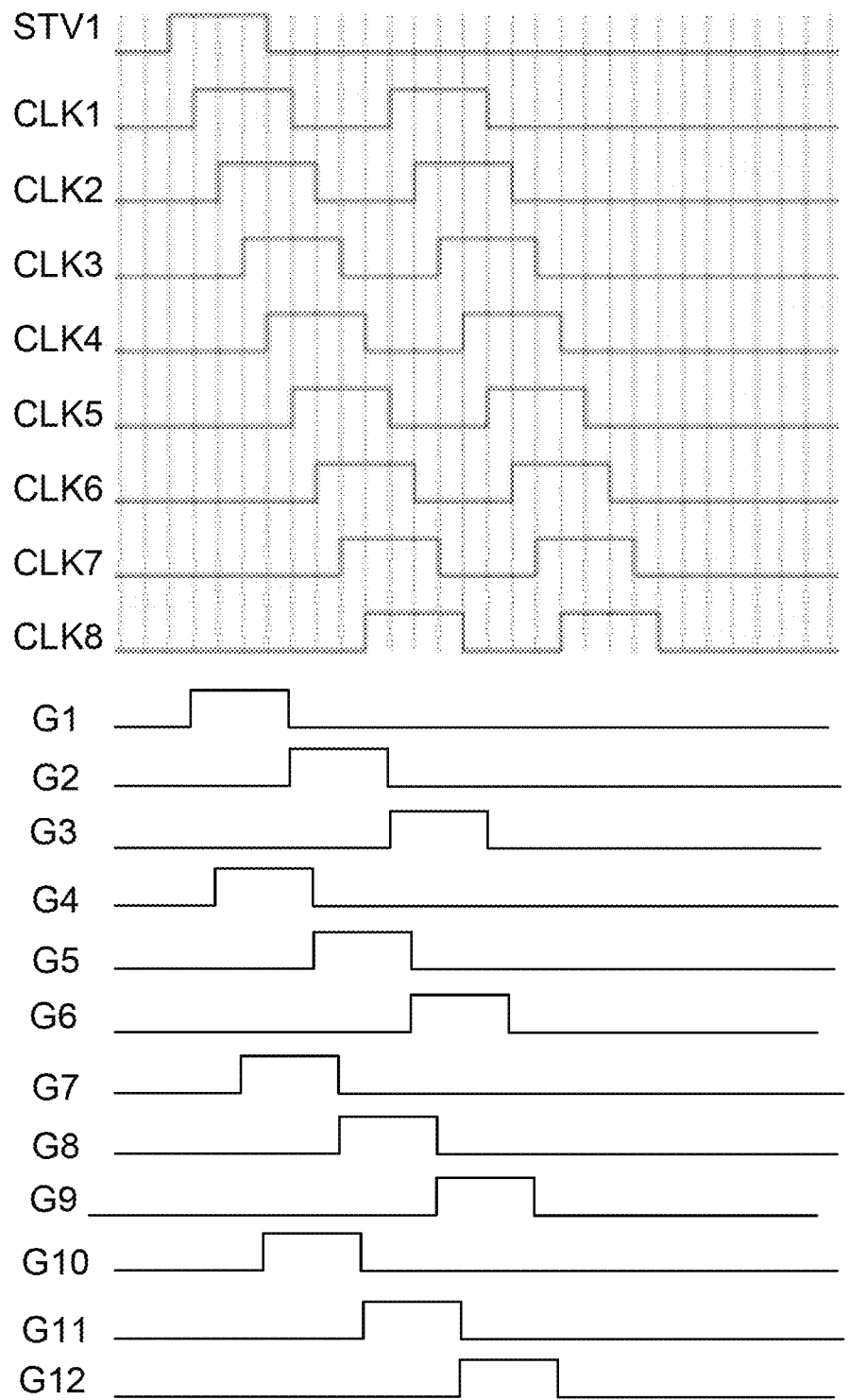
FIG. 20 shows a signal timing diagram of the gate driving circuit of FIG. 19 in the first resolution mode.

FIG. 20 shows a signal timing diagram of the gate driving circuit of FIG. 19 in the first resolution mode.

As shown in FIG. 20, in the first resolution mode, eight sequentially shifted first clock signals are applied respectively to the clock signal lines CLK1 to CLK8, and the first start signal is applied to the start signal line STV1. The first clock signals on the clock signal lines CLK1 to CLK8 may be periodic signals with a duty ratio of 50%. The active level duration in each signal period is 4H, and a (k+1)th first clock signal is shifted by H with respect to a kth first clock signal, where H represents the unit scanning time. For example, the first clock signal on the second clock signal line CLK2 is shifted by H with respect to the first clock signal on the first clock signal line CLKT, the first clock signal on the third clock signal line CLK3 is shifted by H with respect to the first clock signal on the second clock signal line CLK2, and so on. The active level duration of the first start signal may be 4H.

With reference to FIG. 19, the shift registers GOAT, GOA2 and GOA3 in the first shift register unit 320_1 may generate output signals G1, G2 and G3 based on the first clock signals on the first clock signal line CLKT, the fifth clock signal line CLK5 and the first clock signal line CLKT, respectively. The output signal G2 is shifted by 4H with respect to the output signal G1, and the output signal G3 is shifted by 4H with respect to the output signal G2. The shift registers GOA4, GOA5 and GOA6 in the second shift register unit 320_2 may generate output signals G4, G5 and G6 based on the first clock signals on the second clock signal line CLK2, the sixth clock signal line CLK6 and the second clock signal line CLK2, respectively. The output signal G4 is shifted by H with respect to the output signal G1, and the output signal G5 is shifted by 4H with respect to the output signal G4, and the output signal G6 is shifted by 4H with respect to the output signal G5. The shift registers GOA7, GOA8 and GOA9 in the third shift register unit 320_3 may generate output signals G7, G8 and G9 based on the first clock signals on the third clock signal line CLK3, the seventh clock signal line CLK7 and the third clock signal line CLK3, respectively. The output signal G7 is shifted by H with respect to the output signal G4, and the output signal G8 is shifted by 4H with respect to the output signal G7, the output signal G9 is shifted by 4H with respect to the output signal G8, and so on.

Figure 21:
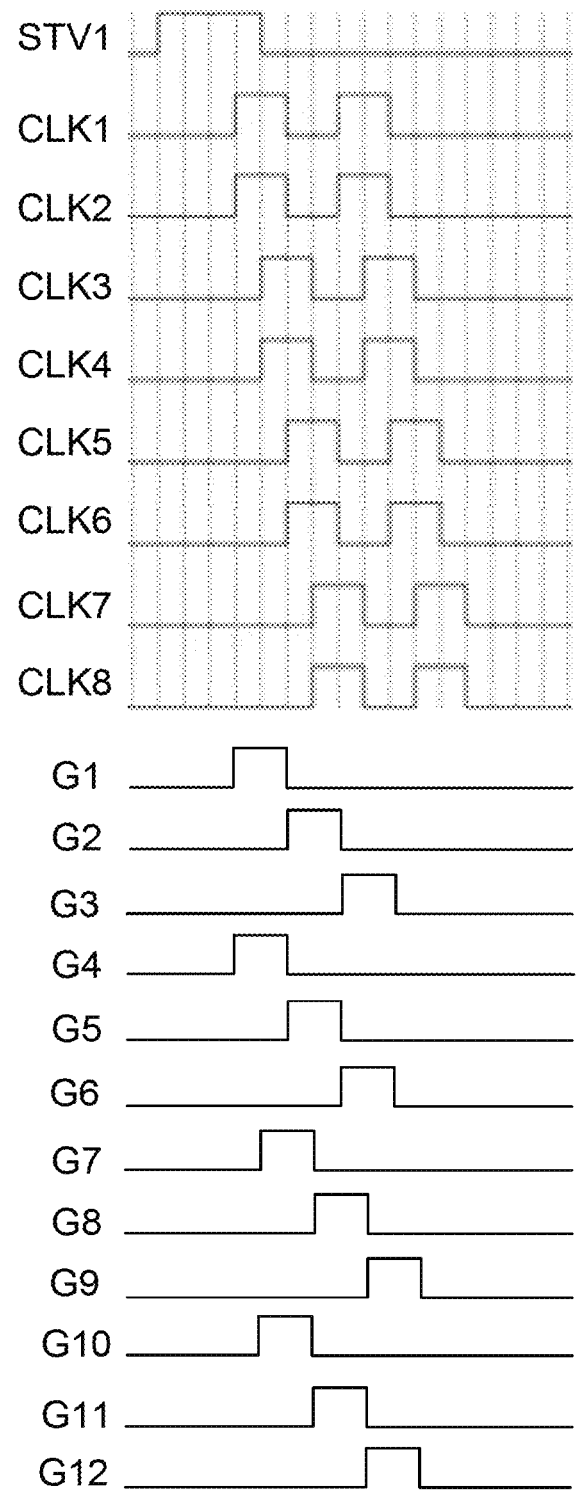
FIG. 21 shows a signal timing diagram of the gate driving circuit of FIG. 19 in the second resolution mode.

FIG. 21 shows a signal timing diagram of the gate driving circuit of FIG. 19 in the second resolution mode.

As shown in FIG. 21, in the second resolution mode, eight second clock signals are applied respectively to the clock signal lines CLK1 to CLK8, and the second start signal is applied to the start signal line STV1. The second clock signals on the clock signal lines CLK1 to CLK8 may also be periodic signals with a duty ratio of 50%. The difference from the first clock signal is that the active level duration in each signal period is 2H. The active level duration of the second start signal may be 2H.

The second clock signals on the clock signal lines CLK1 to CLK8 may be divided into 2M groups. For example, when M=2, the second clock signals are divided into four groups. A first group includes the second clock signals on the clock signal lines CLK1 and CLK2, a second group includes the second clock signals on the clock signal lines CLK3 and CLK4, a third group includes the second clock signals on the clock signal lines CLK5 and CLK6, and the fourth group includes the second clock signals on the clock signal lines CLK7 and CLK8. The second clock signals on the clock signal lines CLK1 and CLK2 are synchronized, the second clock signals on the clock signal lines CLK3 and CLK4 are synchronized, the second clock signals on the clock signal lines CLK5 and CLK6 are synchronized, and the second clock signals on the clock signal lines CLK7 and CLK8 are synchronized. The second clock signals on the clock signal lines CLK3 and CLK4 are shifted by H with respect to the second clock signals on the clock signal lines CLK1 and CLK2. The second clock signals on the clock signal lines CLK5 and CLK6 are shifted by H with respect to the second clock signals on the clock signal lines CLK3 and CLK4. The second clock signals on the clock signal lines CLK7 and CLK8 are shifted by H with respect to the second clock signals on the clock signal lines CLK5 and CLK6.

With reference to FIG. 19, the shift registers GOA1, GOA2 and GOA3 in the first shift register unit 320_1 may generate output signals G1, G2 and G3 based on the first clock signals on the first clock signal line CLK1, the fifth clock signal line CLK5 and the first clock signal line CLK1, respectively. The output signal G2 is shifted by 2H with respect to the output signal G1, and the output signal G3 is shifted by 2H with respect to the output signal G2. The shift registers GOA4, GOA5 and GOA6 in the second shift register unit 320_2 may generate output signals G4, G5 and G6 based on the first clock signals on the second clock signal line CLK2, the sixth clock signal line CLK6 and the second clock signal line CLK2, respectively. The output signal G4 is synchronized with the output signal G1, the output signal G5 is shifted by 2H with respect to the output signal G4, and the output signal G6 is shifted by 2H with respect to the output signal G5. The shift registers GOA7, GOA8 and GOA9 in the third shift register unit 320_3 may generate output signals G7, G8 and G9 based on the first clock signals on the third clock signal line CLK3, the seventh clock signal line CLK7 and the third clock signal line CLK3, respectively. The output signal G7 is shifted by H with respect to the output signal G4, the output signal G8 is shifted by 2H with respect to the output signal G7, the output signal G9 is shifted by 2H with respect to the output signal G8, and so on.

Figure 22:
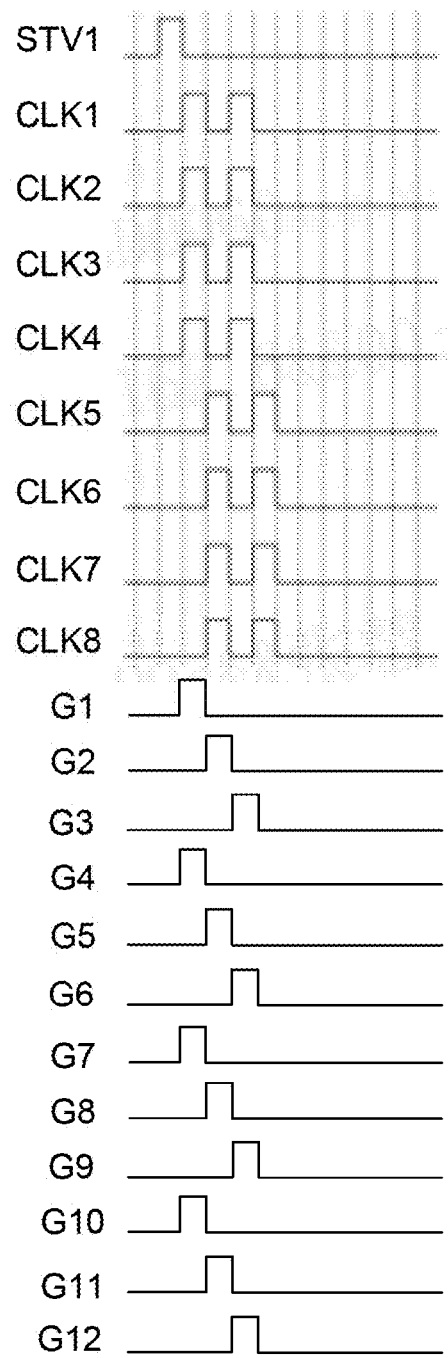
FIG. 22 shows a signal timing diagram of the gate driving circuit of FIG. 19 in the third resolution mode.

FIG. 22 shows a signal timing diagram of the gate driving circuit of FIG. 19 in the third resolution mode.

As shown in FIG. 22, in the third resolution mode, eight third clock signals are applied respectively to the clock signal lines CLK1 to CLK8, and the third start signal is applied to the start signal line STV1. The third clock signals are also periodic signals with a duty ratio of 50%. The difference from the first clock signal is that the active level duration in a signal period of the third clock signal is H. The third clock signals on the clock signal lines CLK1 to CLK8 may be divided into M groups, such as two groups. A first group may include the third clock signals on the clock signal lines CLK1 to CLK4, and a second group may include the third clock signals on the clock signal lines CLK5 to CLK8. The third clock signals on the clock signal lines CLK1 to CLK4 are synchronized with each other, the third clock signals on the clock signal lines CLK5 to CLK8 are synchronized with each other, and the third clock signals on the clock signal lines CLK5 to CLK8 are shifted by H with respect to the third clock signals on the clock signal lines CLK1 to CLK4. The active level duration of the third start signal may be H.

With reference to FIG. 19, the shift registers GOA1, GOA2 and GOA3 in the first shift register unit 320_1 may generate output signals G1, G2 and G3 based on the first clock signals on the first clock signal line CLK1, the fifth clock signal line CLK5 and the first clock signal line CLK1, respectively. The output signal G2 is shifted by H with respect to the output signal G1, and the output signal G3 is shifted by H with respect to the output signal G2. The shift registers GOA4, GOA5 and GOA6 in the second shift register unit 320_2 may generate output signals G4, G5 and G6 based on the first clock signals on the second clock signal line CLK2, the sixth clock signal line CLK6 and the second clock signal line CLK2, respectively. The output signal G4 is synchronized with the output signal G1, the output signal G5 is shifted by H with respect to the output signal G4, and the output signal G6 is shifted by H with respect to the output signal G5. The shift registers GOA7, GOA8 and GOA9 in the third shift register unit 320_3 may generate output signals G7, G8 and G9 based on the first clock signals on the third clock signal line CLK3, the seventh clock signal line CLK7 and the third clock signal line CLK3, respectively. The output signal G7 is synchronized with the output signal G4, the output signal G8 is shifted by H with respect to the output signal G7, and the output signal G9 is shifted by H with respect to the output signal G8. The shift registers GOA10, GOA11 and GOA12 in the fourth shift register unit 320_4 may generate output signals G10, G11 and G12 based on the first clock signals on the fourth clock signal line CLK4, the eighth clock signal line CLK8 and the fourth clock signal line CLK4, respectively. The output signal G10 is synchronized with the output signal G7, the output signal G11 is shifted by H with respect to the output signal G10, and the output signal G12 is shifted by H with respect to the output signal G11.

Figure 23:
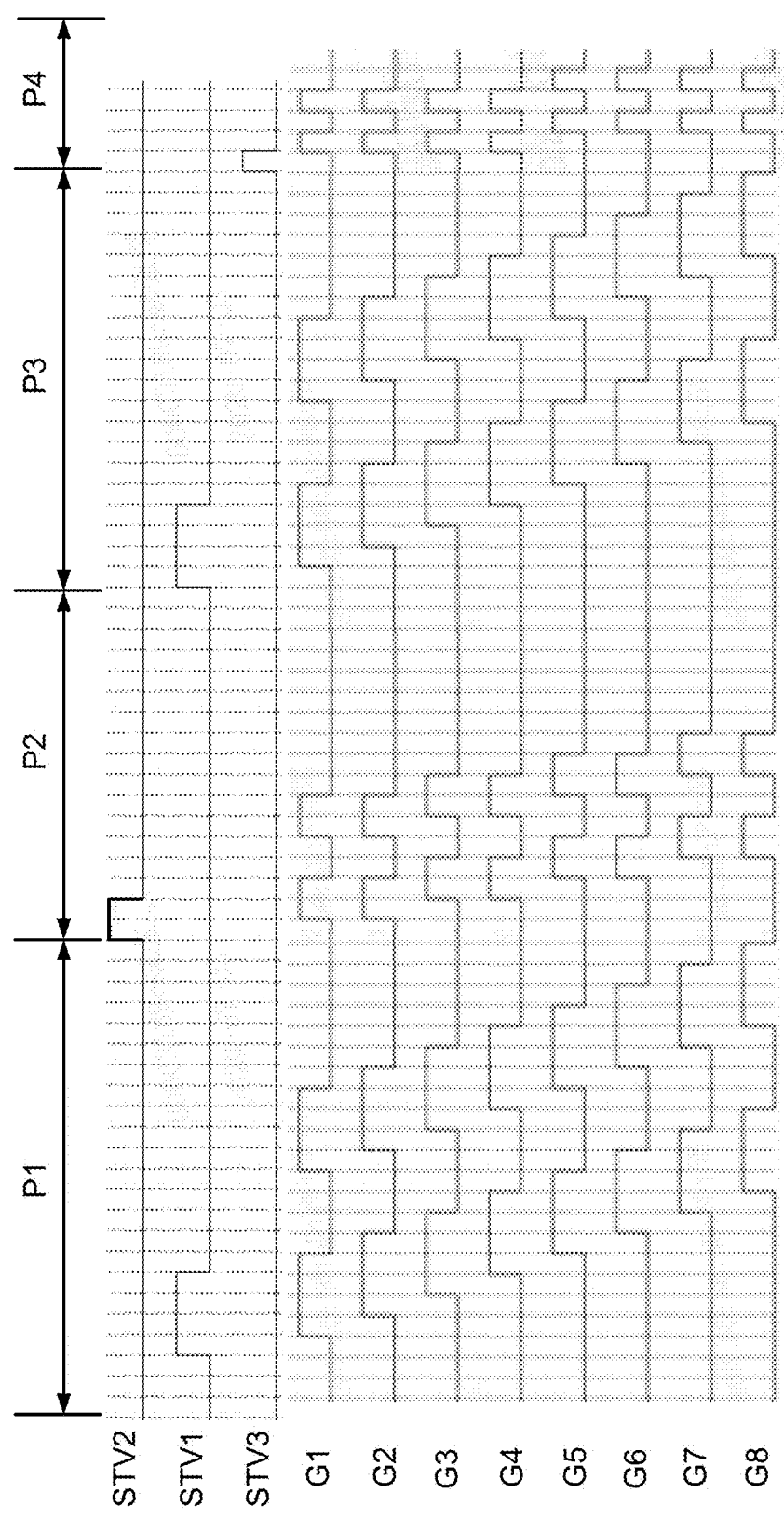
FIG. 23 shows a timing diagram of a start signal of the gate driving circuit of FIG. 19.

FIG. 23 shows a timing diagram of a start signal of the gate driving circuit of FIG. 19. Taking the gate driving circuit of FIG. 10 as an example, the first driving unit DU1 is connected to the first start signal line STV1, the second driving unit DU2 is connected to the second start signal line STV2, and the third driving unit DU3 is connected to the third start signal line STV3.

In the first period P1, the second driving unit DU2 is controlled to operate in the first resolution mode. For example, the clock signal may be applied to the clock signal lines CLK1 to CLK8 and the first start signal may be applied to the second start signal line STV2, as shown in FIG. 20. The second driving unit DU2 may generate output signals G(X+1), G(X+2), . . . G2X as shown in FIG. 20 according to the clock signals on the clock signal lines CLK1 to CLK8), in response to the start signal on the second start signal line STV2.

In the second period P2, the first driving unit DU1 is controlled to operate in the second resolution mode or the third resolution mode. For example, the clock signal may be applied to the clock signal lines CLK1 to CLK8 and the second start signal may be applied to the first start signal line STV1, as shown in FIG. 21. The first driving unit DU1 may generate output signals Gb, G2, G3, . . . as shown in FIG. 21 according to the clock signals on the clock signal lines CLK1 to CLK8, in response to the second start signal on the first start signal line STV1. In some embodiments, the clock signal may be applied to the clock signal lines CLK1 to CLK8 and the third start signal may be applied to the first start signal line STV1, as shown in FIG. 22. The first driving unit DU1 may generate output signals Gb, G2, G3, . . . GX as shown in FIG. 22 according to the clock signals on the clock signal lines CLKT to CLK8, in response to the third start signal on the first start signal line STV1.

In the third period P3, the second driving unit DU2 is controlled again to operate in the first resolution mode. For example, the clock signal may be applied to the clock signal lines CLK1 to CLK8 and the first start signal may be applied to the second start signal line STV2, as shown in FIG. 20. The second driving unit DU2 may generate output signals G(X+1), G(X+2), . . . G2X as shown in FIG. 20 according to the K clock signals on the clock signal lines CLK1 to CLK8, in response to the first start signal on the second start signal line STV2.

In the fourth period, the third driving unit DU3 is controlled to operate in the second resolution mode or the third resolution mode. For example, the clock signal may be applied to the clock signal lines CLK1 to CLK8 and the second start signal may be applied to the third start signal line STV3, as shown in FIG. 21. The third driving unit DU3 may generate output signals G(2X+1), G(2X+2), . . . G3X as shown in FIG. 21 according to the clock signals on the clock signal lines CLK1 to CLK8, in response to the second start signal on the third start signal line STV3. In some embodiments, the clock signal may be applied to the clock signal lines CLK1 to CLK8 and the third start signal may be applied to the third start signal line STV3, as shown in FIG. 22. The third driving unit DU3 may generate output signals G(2X+1), G(2X+2), . . . G3X as shown in FIG. 22 according to the clock signals on the clock signal lines CLK1 to CLK8, in response to the third start signal on the third start signal line STV3.

Therefore, in the above process, the sub-pixels in the central area may be driven twice by the driving unit DU2 at a high first resolution, while the sub-pixels in both side areas may be driven once respectively by the driving units DU1 and DU3 at a low second or third resolution. In this way, the central area of the display panel may be displayed at a high resolution, and the side areas of the display panel may be displayed at a low resolution.

Those skilled in the art may understand that the embodiments described above are exemplary, and those skilled in the art may make improvements. The structures described in the embodiments may be combined freely without conflicts in structure or principle.

After describing the preferred embodiments of the present disclosure in detail, those skilled in the art may clearly understand that various changes and modifications may be made without departing from the scope and spirit of the appended claims, and the present disclosure is not limited to implementations of the exemplary embodiments described in the present disclosure.

What is claimed is:

1. A gate driving circuit comprising a plurality of driving units connected in cascade, wherein each driving unit of the plurality of driving units comprises:
    N shift register units; and
    a mode control circuit connected to the N shift register units, wherein the mode control circuit is configured to receive a control signal for the driving unit, and connect the N shift register units in one of a plurality of resolution modes under the control of the control signal;
    wherein the plurality of resolution modes comprise a first resolution mode, a second resolution mode and a third resolution mode, and the mode control circuit is configured to:
    in the first resolution mode, connect the N shift register units in cascade;
    in the second resolution mode, divide the N shift register units into M groups, connect the M groups in cascade, and connect shift register units in each group of the M groups in parallel; and
    in the third resolution mode, connect the N shift register units in parallel.

2. The gate driving circuit of claim 1, wherein N=4, M=2, the N shift register units comprise a first shift register unit, a second shift register unit, a third shift register unit and a fourth shift register unit, each shift register unit has a cascade input terminal and a first cascade output terminal, and the mode control circuit is configured to:
    in the first resolution mode, connect the first cascade output terminal of an nth shift register unit to the cascade input terminal of an (n+1)th shift register unit, and disconnect the cascade input terminal of the nth shift register unit from the cascade input terminal of the (n+1)th shift register unit, where 1≤n≤N−1;
    in the second resolution mode, disconnect the first cascade output terminal of the first shift register unit from the cascade input terminal of the second shift register unit, connect the first cascade output terminal of the second shift register unit to the cascade input terminal of the third shift register unit, disconnect the first cascade output terminal of the third shift register unit from the cascade input terminal of the fourth shift register unit, connect the cascade input terminal of the first shift register unit to the cascade input terminal of the second shift register unit, and connect the cascade input terminal of the third shift register unit to the cascade input terminal of the fourth shift register unit; and
    in the third resolution mode, disconnect the first cascade output terminal of the nth shift register unit from the cascade input terminal of the (n+1)th shift register unit, and connect the cascade input terminal of the nth shift register unit to the cascade input terminal of the (n+1)th shift register unit.

3. The gate driving circuit of claim 2, wherein each of the first shift register unit, the second shift register unit, the third shift register unit and the fourth shift register unit further has a reset terminal and a second cascade output terminal, and the mode control circuit is further configured to:
    in the first resolution mode, connect the reset terminal of the nth shift register unit to the second cascade output terminal of the (n+1)th shift register unit, and disconnect the reset terminal of the nth shift register unit from the reset terminal of the (n+1)th shift register unit;
    in the second resolution mode, disconnect the reset terminal of the first shift register unit from the second cascade output terminal of the second shift register unit, connect the reset terminal of the second shift register unit to the second cascade output terminal of the third shift register unit, disconnect the reset terminal of the third shift register unit from the second cascade output terminal of the fourth shift register unit, connect the reset terminal of the first shift register unit to the reset terminal of the second shift register unit, disconnect the reset terminal of the second shift register unit from the reset terminal of the third shift register unit, and connect the reset terminal of the third shift register unit to the reset terminal of the fourth shift register unit; and
    in the third resolution mode, disconnect the reset terminal of the nth shift register unit from the second cascade output terminal of the (n+1)th shift register unit, and connect the reset terminal of the nth shift register unit to the reset terminal of the (n+1)th shift register unit.

4. The gate driving circuit of claim 2, wherein the control signal comprises a first control signal, a second control signal, a third control signal and a fourth control signal, and the mode control circuit comprises:
    a first transistor having a gate electrode connected to receive the first control signal, a first electrode connected to the first cascade output terminal of the first shift register unit, and a second electrode connected to the cascade input terminal of the second shift register unit;
    a second transistor having a gate electrode connected to receive the second control signal, a first electrode connected to the cascade input terminal of the first shift register unit, and a second electrode connected to the cascade input terminal of the second shift register unit;
    a third transistor having a gate electrode connected to receive the third control signal, a first electrode connected to the first cascade output terminal of the second shift register unit, and a second electrode connected to the cascade input terminal of the third shift register unit;
    a fourth transistor having a gate electrode connected to receive the fourth control signal, a first electrode connected to the cascade input terminal of the first shift register unit, and a second electrode connected to the cascade input terminal of the third shift register unit;
    a fifth transistor having a gate electrode connected to receive the first control signal, a first electrode connected to the first cascade output terminal of the third shift register unit, and a second electrode connected to the cascade input terminal of the fourth shift register unit; and
    a sixth transistor having a gate electrode connected to receive the second control signal, a first electrode connected to the cascade input terminal of the third shift register unit, and a second electrode connected to the cascade input terminal of the fourth shift register unit.

5. The gate driving circuit of claim 4, wherein the control signal further comprises a fifth control signal, and the mode control circuit further comprises:
    a seventh transistor having a gate electrode connected to receive the first control signal, a first electrode connected to the reset terminal of the first shift register unit, and a second electrode connected to the second cascade output terminal of the second shift register unit;

an eighth transistor having a gate electrode connected to receive the fifth control signal, a first electrode connected to the reset terminal of the first shift register unit, and a second electrode connected to the reset terminal of the second shift register unit;

a ninth transistor having a gate electrode connected to receive the third control signal, a first electrode connected to the reset terminal of the second shift register unit, and a second electrode connected to the second cascade output terminal of the third shift register unit;

a tenth transistor having a gate electrode connected to receive the fourth control signal, a first electrode connected to the reset terminal of the second shift register unit, and a second electrode connected to the reset terminal of the third shift register unit;

an eleventh transistor having a gate electrode connected to receive the first control signal, a first electrode connected to the reset terminal of the third shift register unit, and a second electrode connected to the second cascade output terminal of the fourth shift register unit; and a twelfth transistor having a gate electrode connected to receive the second control signal, a first electrode connected to the reset terminal of the third shift register unit, and a second electrode connected to the reset terminal of the fourth shift register unit.

6. The gate driving circuit of claim 2, wherein the first cascade output terminal of an Nth shift register unit in an ith stage driving unit is connected to the cascade input terminal of the first shift register unit in an (i+1)th stage driving unit; wherein the reset terminal of the Nth shift register unit in the ith stage driving unit is connected to the second cascade output terminal of the first shift register unit in the (i+1)th stage driving unit.

7. The gate driving circuit of claim 1, wherein the plurality of driving units are divided into a plurality of groups, and each group of driving units are connected to a group of control signal lines so as to receive the control signal for the group of driving units.

8. The gate driving circuit of claim 2, wherein each shift register unit comprises:

a first shift register having an input terminal serving as the cascade input terminal of the shift register unit, and an output terminal serving as the second cascade output terminal of the shift register unit;

a second shift register having an input terminal connected to the output terminal of the first shift register; and a third shift register having an input terminal connected to an output terminal of the second shift register, and an output terminal serving as the first cascade output terminal of the shift register unit.

9. A method of driving the gate driving circuit claim 1, comprising:

receiving, by a mode control circuit of each driving unit in a plurality of driving units, a control signal for the driving unit, and connecting the N shift register units in one of a plurality of resolution modes under the control of the control signal; and generating output signals by the N shift register units connected in each driving unit.

10. The method of claim 9, wherein the plurality of resolution modes comprise a first resolution mode, a second resolution mode and a third resolution mode, and wherein, in the first resolution mode, the mode control circuit is configured to connect the N shift register units in cascade, so that the N shift register units generate sequentially shifted output signals;

in the second resolution mode, the mode control circuit is configured to divide the N shift register units into M groups, connect the M groups in cascade, and connect shift register units in each group of the M groups in parallel, so that the shift register units in each group generate output signals in parallel, and a group of output signals generated by an (m+1)th group of shift register units are shifted with respect to a group of output signals generated by an mth group of shift register units, where m is an integer, and $1 \le m \le M-1$; and in the third resolution mode, the mode control circuit is configured to connect the N shift register units in parallel, so that the N shift register units generate output signals in parallel.

11. The method of claim 10, wherein N=4, M=2, and the N shift register units comprise a first shift register unit, a second shift register unit, a third shift register unit and a fourth shift register unit, and wherein, in the first resolution mode, the mode control circuit is configured to connect a first cascade output terminal of an nth shift register unit to a cascade input terminal of an (n+1)th shift register unit, and disconnect a cascade input terminal of the nth shift register unit from the cascade input terminal of the (n+1)th shift register unit, where $1 \le n \le N-1$;

in the second resolution mode, the mode control circuit is configured to disconnect a first cascade output terminal of the first shift register unit from a cascade input terminal of the second shift register unit, connect the cascade input terminal of the second shift register unit to a cascade input terminal of the first shift register unit, connect a first cascade output terminal of the second shift register unit to a cascade input terminal of the third shift register unit, disconnect the cascade input terminal of the third shift register unit from the cascade input terminal of the second shift register unit, disconnect a first cascade output terminal of the third shift register unit from a cascade input terminal of the fourth shift register unit, and connect the cascade input terminal of the third shift register unit to the cascade input terminal of the fourth shift register unit; and in the third resolution mode, the mode control circuit is configured to disconnect the first cascade output terminal of the nth shift register unit from the cascade input terminal of the (n+1)th shift register unit, and connect the cascade input terminal of the nth shift register unit to the cascade input terminal of the (n+1)th shift register unit.

12. The method of claim 11, further comprising:

in the first resolution mode, connecting, by the mode control circuit, a reset terminal of the nth shift register unit to a second cascade output terminal of the (n+1)th shift register unit, and disconnecting the reset terminal of the nth shift register unit from a reset terminal of the (n+1)th shift register unit;

in the second resolution mode, disconnecting, by the mode control circuit, the reset terminal of the first shift register unit from the second cascade output terminal of the second shift register unit, connecting the reset terminal of the second shift register unit to the second cascade output terminal of the third shift register unit, disconnecting the reset terminal of the third shift register unit from the second cascade output terminal of the fourth shift register unit, connecting the reset terminal of the first shift register unit to the reset terminal of the second shift register unit, and connecting the reset terminal of the third shift register unit to the reset terminal of the fourth shift register unit; and in the third resolution mode, disconnecting, by the mode control circuit, the reset terminal of the nth shift register unit from the second cascade output terminal of the (n+1)th shift register unit, and connecting the reset terminal of the nth shift register unit to the reset terminal of the (n+1)th shift register unit.

13. The method of claim 11, wherein the mode control circuit comprises a first transistor, a second transistor, a third transistor, a fourth transistor, a fifth transistor and a sixth transistor, and wherein, in the first resolution mode, a first control signal and a third control signal are at a first level, and a second control signal and a fourth control signal are at a second level, so that the first transistor, the third transistor and the fifth transistor are turned on, and the second transistor, the fourth transistor and the sixth transistor are turned off;

in the second resolution mode, the second control signal and the third control signal are at the first level, and the first control signal and the fourth control signal are at the second level, so that the second transistor, the third transistor and the sixth transistor are turned on, and the first transistor, the fourth transistor and the fifth transistor are turned off; and in the third resolution mode, the second control signal and the fourth control signal are at the first level, and the first control signal and the third control signal are at the second level, so that the second transistor, the fourth transistor and the sixth transistor are turned on, and the first transistor, the third transistor and the fifth transistor are turned off.

14. The method of claim 13, wherein the mode control circuit further comprises a seventh transistor, an eighth transistor, a ninth transistor, a tenth transistor, an eleventh transistor and a twelfth transistor, and wherein, in the first resolution mode, a fifth control signal is at the second level, so that the seventh transistor, the ninth transistor and the eleventh transistor are turned on, and the eighth transistor, the tenth transistor and the twelfth transistor are turned off;

in the second resolution mode, the fifth control signal is at the first level, so that the eighth transistor, the ninth transistor and the twelfth transistor are turned on, and the seventh transistor, the tenth transistor and the eleventh transistor are turned off; and in the third resolution mode, the fifth control signal is at the second level, so that the tenth transistor and the twelfth transistor are turned on, and the seventh transistor, the eighth transistor, the ninth transistor and the eleventh transistor are turned off.

* * * * *